United States Patent
Baek et al.

(10) Patent No.: US 11,191,195 B2
(45) Date of Patent: Nov. 30, 2021

(54) ELECTRONIC DEVICE INCLUDING MAGNET AND MAGNETIC SHIELD

(71) Applicant: SAMSUNG ELECTRONICS CO., LTD., Suwon-si (KR)

(72) Inventors: Moohyun Baek, Suwon-si (KR); Gidae Kim, Suwon-si (KR); Jongchul Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 130 days.

(21) Appl. No.: 16/747,944

(22) Filed: Jan. 21, 2020

(65) Prior Publication Data
US 2020/0236826 A1 Jul. 23, 2020

(30) Foreign Application Priority Data

Jan. 21, 2019 (KR) .................. 10-2019-0007551

(51) Int. Cl.
*H05K 5/00* (2006.01)
*H05K 9/00* (2006.01)
(Continued)

(52) U.S. Cl.
CPC ............ *H05K 9/0007* (2013.01); *H01F 7/02* (2013.01); *H05K 5/0017* (2013.01); *H05K 5/0217* (2013.01); *H05K 5/0226* (2013.01)

(58) Field of Classification Search
None
See application file for complete search history.

(56) References Cited

U.S. PATENT DOCUMENTS 9,348,450 B1* 5/2016 Kim ..................... G06F 1/1681
9,535,452 B2* 1/2017 Ahn ..................... H05K 5/0017
(Continued)

FOREIGN PATENT DOCUMENTS

CN 204069046 12/2014

OTHER PUBLICATIONS

International Search Report and Written Opinion dated May 8, 2020 in counterpart International Patent Application No. PCT/KR2020/001040.

*Primary Examiner* — Anthony Q Edwards
*Assistant Examiner* — Rashen E Morrison
(74) *Attorney, Agent, or Firm* — Nixon Vanderhye, P.C.

(57) ABSTRACT

According to an embodiment, an electronic device may include: a foldable housing including: a hinge; a first housing connected to the hinge and including a first face facing a first direction and a second face facing a second direction opposite the first direction; and a second housing connected to the hinge and including a third face facing a third direction and a fourth face facing a fourth direction opposite the third direction, the second housing configured to be folded relative to the first housing about the hinge, wherein, in a folded state, the first face faces the third face, and, in an unfolded state, the third direction is the same as the first direction; a display including a first portion and a second portion extending from the first face to the third face to form the first face and the third face, respectively; a digitizer including a third portion disposed between the first portion of the display and the second face and a fourth portion disposed between the second portion of the display and the fourth face; a first magnet disposed in the first housing to overlap the third portion of the digitizer when viewed from above the second face; a second magnet disposed in the second housing to overlap the fourth portion of the digitizer (Continued)

when viewed from above the fourth face and to face the first magnet in the folded state; a first magnetic shield fixed to the hinge and at least partially disposed in the first housing, the first magnetic shield configured to be movable relative to the first magnet wherein, when viewed from above the second face, the first magnetic shield member does not overlap the first magnet in the folded state and overlaps the first magnet in the unfolded state; and a second magnetic shield fixed to the hinge and at least partially disposed in the second housing, the second magnetic shield configured to be movable relative to the second magnet wherein, when viewed from above the second face, the second magnetic shield member does not overlap the second magnet in the folded state and overlaps the second magnet in the unfolded state.

20 Claims, 40 Drawing Sheets

(51) Int. Cl.
*H01F 7/02* (2006.01)
*H05K 5/02* (2006.01)

(56) References Cited

U.S. PATENT DOCUMENTS

| | | | | |
|---|---|---|---|---|
| 9,600,035 B2* | 3/2017 | Park | ............ | G06F 1/1681 |
| 10,123,467 B2* | 11/2018 | Lee | ............ | H02J 7/00 |
| 10,254,803 B1* | 4/2019 | Quinn | ............ | G06F 1/1643 |
| 10,296,052 B1* | 5/2019 | Quinn | ............ | G06F 1/1656 |
| 10,296,053 B1* | 5/2019 | Quinn | ............ | G06F 1/1649 |
| 10,712,832 B2* | 7/2020 | Torres | ............ | G06F 3/1423 |
| 11,044,825 B1* | 6/2021 | Han | ............ | H05K 5/0226 |
| 11,054,857 B2* | 7/2021 | Noh | ............ | G06F 1/1688 |
| 2012/0002360 A1* | 1/2012 | Seo | ............ | G06F 1/1652 |
| | | | | 361/679.01 |
| 2012/0044620 A1* | 2/2012 | Song | ............ | G06F 1/1681 |
| | | | | 361/679.01 |
| 2012/0120618 A1* | 5/2012 | Bohn | ............ | G06F 1/1681 |
| | | | | 361/749 |
| 2013/0002964 A1* | 1/2013 | Kodaira | ............ | H04N 5/64 |
| | | | | 348/731 |
| 2013/0010405 A1* | 1/2013 | Rothkopf | ............ | H05K 5/0226 |
| | | | | 361/679.01 |
| 2013/0021762 A1* | 1/2013 | van Dijk | ............ | H04M 1/022 |
| | | | | 361/749 |
| 2014/0111954 A1* | 4/2014 | Lee | ............ | G06F 1/1652 |
| | | | | 361/749 |
| 2014/0362505 A1* | 12/2014 | Jang | ............ | H01F 10/08 |
| | | | | 361/679.4 |
| 2015/0227166 A1* | 8/2015 | Lee | ............ | G06F 1/169 |
| | | | | 345/173 |
| 2015/0241925 A1* | 8/2015 | Seo | ............ | G06F 1/1681 |
| | | | | 361/679.27 |
| 2015/0366089 A1* | 12/2015 | Park | ............ | G06F 1/1641 |
| | | | | 361/679.01 |
| 2016/0106012 A1* | 4/2016 | Jang | ............ | G06F 3/041 |
| | | | | 361/679.26 |
| 2016/0277835 A1 | 9/2016 | Kim et al. | | |
| 2017/0140504 A1 | 5/2017 | Jeong et al. | | |
| 2018/0364761 A1* | 12/2018 | Lin | ............ | H05K 9/0075 |
| 2018/0366813 A1* | 12/2018 | Kim | ............ | H04M 1/0266 |
| 2019/0258295 A1* | 8/2019 | Fujimoto | ............ | G09F 9/00 |
| 2019/0320048 A1* | 10/2019 | Yang | ............ | H04M 1/0247 |
| 2020/0051468 A1* | 2/2020 | Jung | ............ | H01Q 21/30 |
| 2020/0060020 A1* | 2/2020 | Park | ............ | G06F 1/1616 |
| 2020/0103935 A1* | 4/2020 | Hsu | ............ | G06F 1/1681 |

\* cited by examiner

ELECTRONIC DEVICE INCLUDING MAGNET AND MAGNETIC SHIELD

CROSS-REFERENCE TO RELATED APPLICATION

This application is based on and claims priority under 35 U.S.C. § 119 to Korean Patent Application No. 10-2019-0007551, filed on Jan. 21, 2019, in the Korean Intellectual Property Office, the disclosure of which is incorporated by reference herein in its entirety.

BACKGROUND

1) Field

The disclosure relates to an electronic device including a magnet and a magnetic shield member.

2) Description of Related Art

With the development of electronic communication technology, electronic devices having various functions have emerged. Such electronic devices are generally convergent, meaning that they perform one or more functions in combination.

Recently, as the functional gap between electronic devices among manufacturers has been considerably reduced, electronic devices are becoming gradually slimmer while being enhanced from a design aspect in order to attract consumers' interest in purchasing the same.

An electronic device may be implemented as a foldable type including a flexible display. The elastic force of the flexible display may make it difficult for the electronic device to be in a folded state.

The above information is presented as background information only to assist with an understanding of the disclosure. No determination has been made, and no assertion is made, as to whether any of the above might be applicable as prior art with regard to the disclosure.

SUMMARY

Embodiments of the disclosure provide an electronic device including a magnet for maintaining the folded state of the electronic device including a flexible display and a magnetic shield member configured to reduce the influence of the magnet on the electronic device.

According to an embodiment, an electronic device may include: a foldable housing including: a hinge; a first housing connected to the hinge and including a first face facing a first direction, and a second face facing a second direction opposite the first direction; and a second housing connected to the hinge and including a third face facing a third direction, and a fourth face facing a fourth direction opposite the third direction, the second housing configured to be folded relative to the first housing about the hinge, wherein, in a folded state, the first face faces the third face, and, in an unfolded state, the third direction is the same as the first direction; a display including a first portion and a second portion extending from the first face to the third face to form the first face and the third face, respectively; a digitizer including a third portion disposed between the first portion of the display and the second face and a fourth portion disposed between the second portion of the display and the fourth face; a first magnet disposed in the first housing to overlap the third portion of the digitizer when viewed from above the second face; a second magnet disposed in the second housing to overlap the fourth portion of the digitizer when viewed from above the fourth face and facing the first magnet in the folded state; a first magnetic shield fixed to the hinge and at least partially disposed in the first housing, the first magnetic shield configured to be movable relative to the first magnet wherein, when viewed from above the second face, the first magnetic shield member does not overlap the first magnet in the folded state and overlaps the first magnet in the unfolded state; and a second magnetic shield fixed to the hinge and at least partially disposed in the second housing, the second magnetic shield configured to be movable relative to the second magnet wherein, when viewed from above the fourth face, the second magnetic shield does not overlap the second magnet in the folded state and overlaps the second magnet in the unfolded state.

According to various example embodiments, an electronic device may include: a foldable housing including: a hinge; a first housing connected to the hinge and including a first face facing a first direction, and a second face facing a second direction opposite the first direction; and a second housing connected to the hinge and including a third face facing a third direction, and a fourth face facing a fourth direction opposite the third direction, the second housing configured to be folded relative to the first housing about the hinge, wherein, in a folded state of the foldable housing, the first face faces the third face, and in an unfolded state of the foldable housing, the third direction is the same as the first direction; a display including a first portion and a second portion extending from the first face to the third face to form the first face and the third face, respectively; a digitizer including a third portion disposed between the first portion of the display and the second face and a fourth portion disposed between the second portion of the display and the fourth face; a magnet disposed in the second housing to overlap the fourth portion of the digitizer when viewed from above the fourth face; a magnetic shield fixed to the hinge and at least partially disposed in the second housing, the magnetic shield configured to be movable relative to the magnet wherein, when viewed from above the fourth face, the magnetic shield does not overlap the magnet in the folded state and overlaps the magnet in an unfolded state.

According to various example embodiments, at least one magnet may exert an attractive force between the first housing and the second housing to maintain the folded state of the electronic device against the elastic force of the flexible display. According to various example embodiments, at least one magnetic shield may reduce the influence of the at least one magnet on the electronic device. For example, when an input (e.g., a touch input or a hovering input) through a screen is made using an electronic pen that utilizes an electromagnetic field (e.g., a stylus pen), a magnetic field from the at least one magnet may cause an error in the input. According to an example embodiment, the at least one magnetic shield is able to reduce the effect of the magnetic field from the at least one magnet on the interaction between the screen and the electronic pen. In another example, a foreign material that reacts to a magnet may be attached to the screen by the at least one magnet in the state in which the electronic device is unfolded, and the foreign matter may contaminate the screen or may cause damage (e.g., a scratch) on the screen when the electronic device is folded. According to an example embodiment, when the electronic device is in the unfolded state, the at least one magnetic shield is able to reduce magnetism (or magnetic force) emitted from the at least one magnet toward the screen, thereby preventing and/or reducing foreign matter from adhering to the screen.

In addition, effects that are capable of being obtained or predicted by various embodiments may be directly disclosed or implied in the detailed description of the embodiments of the disclosure. For example, various effects that are predicted according to various embodiments may be disclosed within the following detailed description.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Hereinafter, various example embodiments of the disclosure will be described in greater detail with reference to the accompanying drawings.

Figure 1:
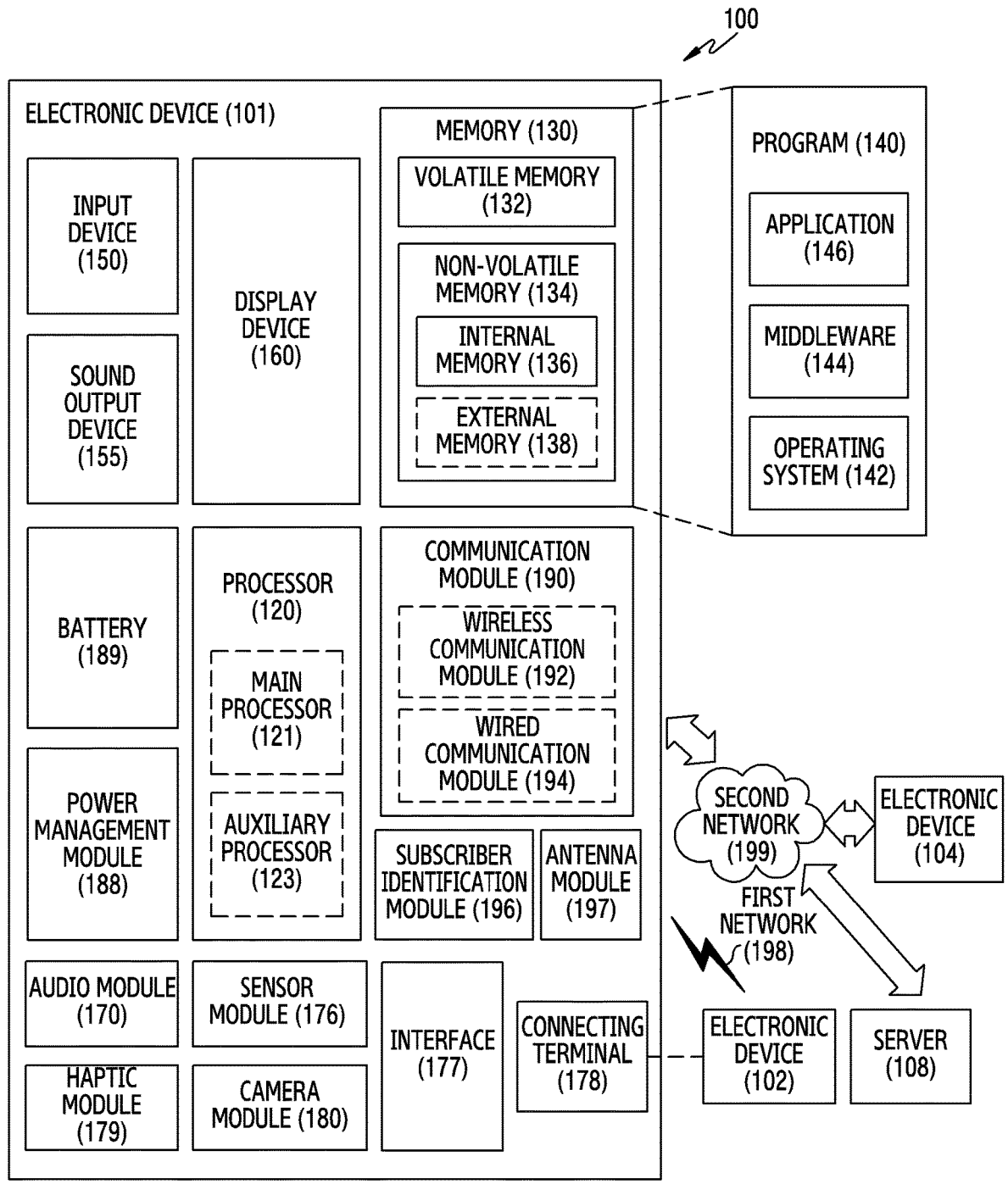
FIG. 1 is a block diagram illustrating an example electronic device in a network environment according to an embodiment.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various example embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
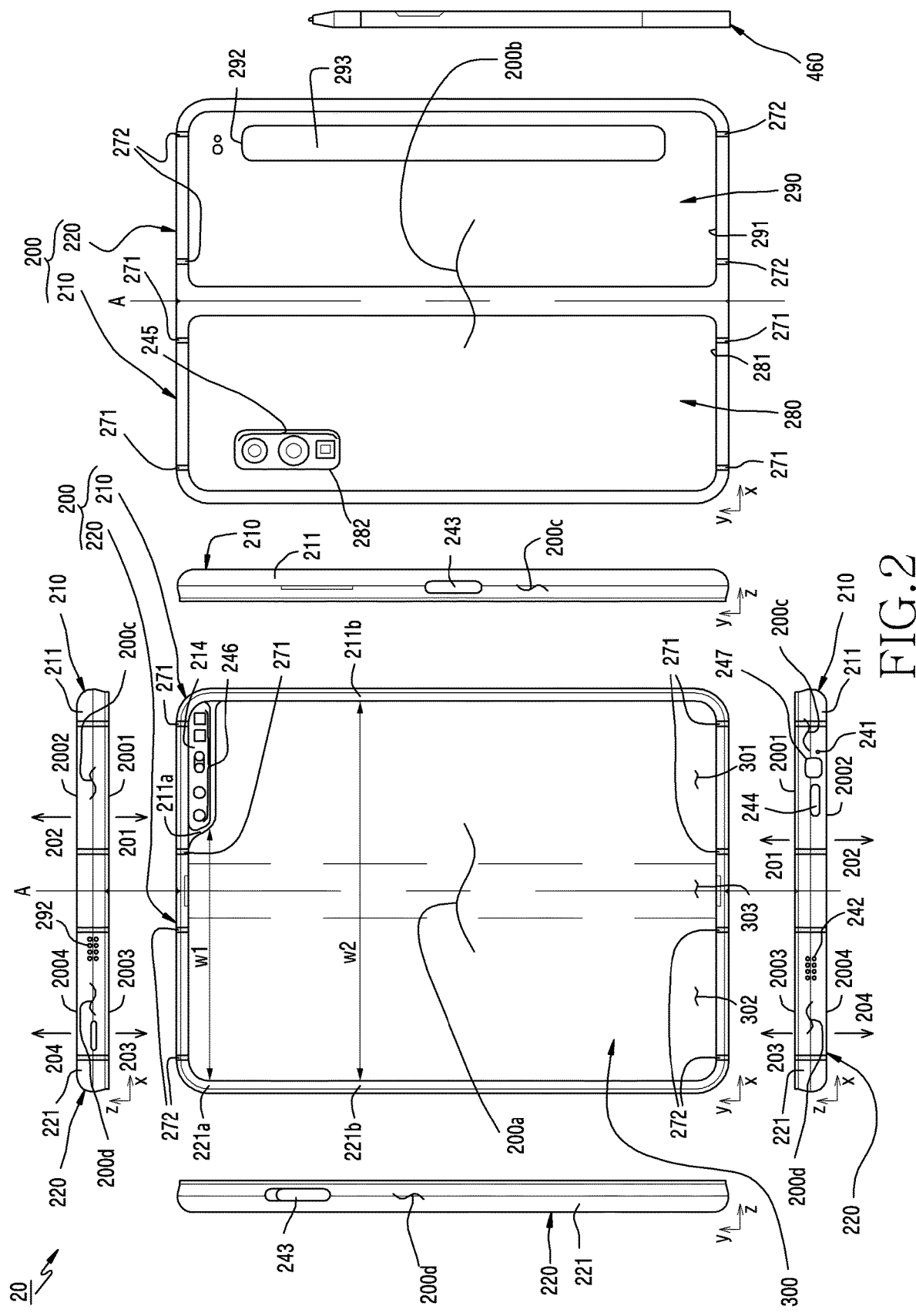
FIG. 2 is a diagram illustrating an example electronic device in an unfolded state according to an embodiment.
Figure 3:
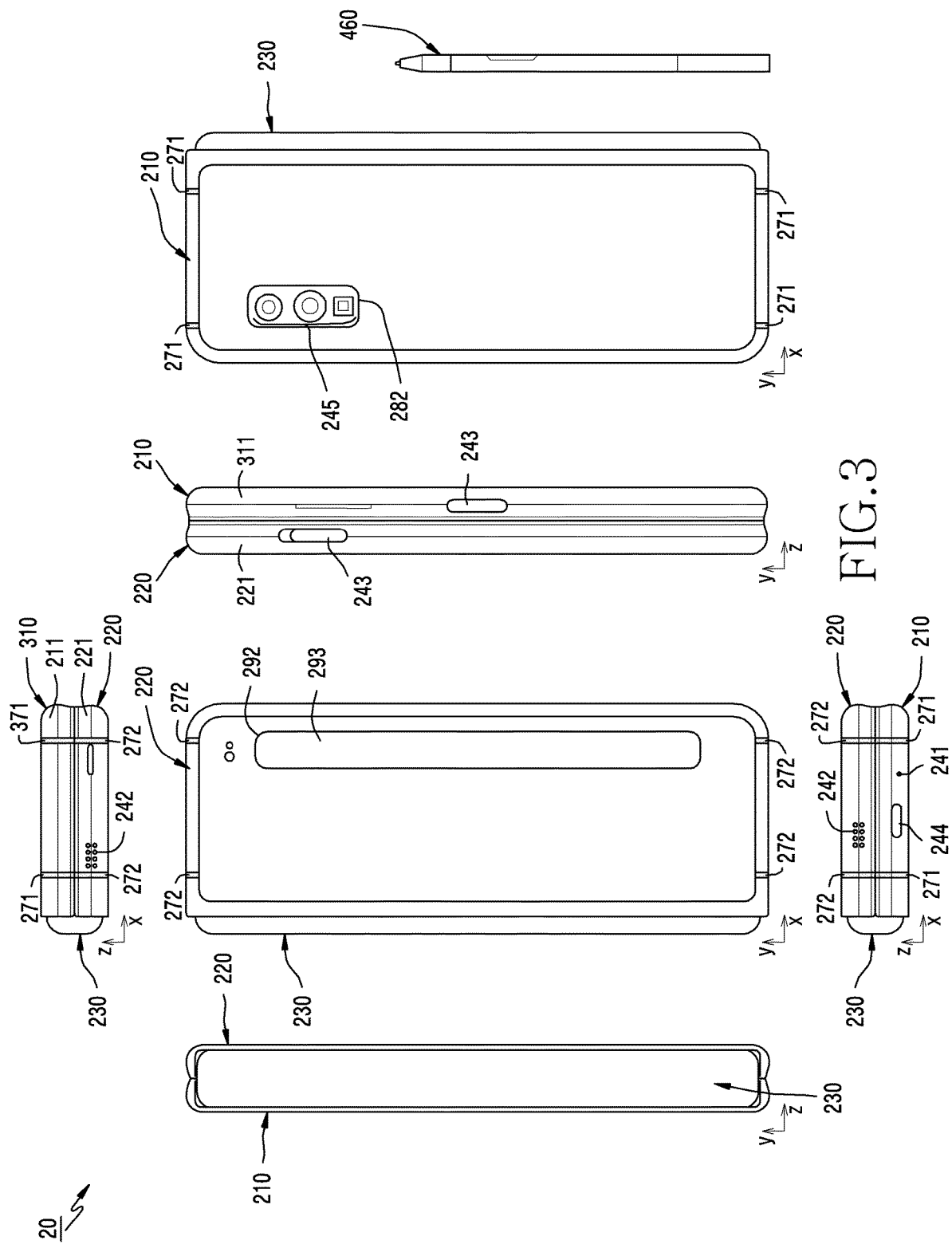
FIG. 3 is a diagram illustrating an example electronic device in a folded state according to an embodiment.

FIG. 2 is a diagram illustrating an example electronic device in a flat or unfolded state according to an embodiment. FIG. 3 is a diagram illustrating the example electronic device in a folded state according to an embodiment.

Referring to FIGS. 2 and 3, in an embodiment, an electronic device 20 (e.g., the electronic device 101 in FIG. 1) may include a foldable housing 200, a hinge cover 230 configured to cover the foldable portion of the foldable housing 200, and a flexible or foldable display (hereinafter, simply referred to as a "display") 300 (e.g., the display device 160 in FIG. 1) disposed in a space formed by the foldable housing 200. According to an embodiment, the foldable housing 200 may include a front face 200a to which the display 300 is exposed, a rear face 200b facing away from the front face 200a, and side faces 200c and 200d surrounding the space between the front face 200a and the rear face 200b.

According to an embodiment, the foldable housing 200 may include a first housing structure 210 and a second housing structure 220, which are connected to each other by a hinge structure (not illustrated). For example, the first housing structure 210 may be rotatably connected to the second housing structure 220 by the hinge structure.

According to an embodiment, the first housing structure 210 may include a first face 2001 that faces a first direction 201, a second face 2002 that faces a second direction 202 that is opposite the first direction 201, and a first side face 200c at least partially surrounding the space between the first face 2001 and the second face 2002. The second housing structure 220 may include a third face 2003 that faces a third direction 203, a fourth face 2004 that faces a fourth direction 204 that is opposite the third direction 203, and a second side face 200d at least partially surrounding the space between the third face 2003 and the fourth face 2004. The front face 200a of the electronic device 20 may include the first face 2001 and the third face 2003, and the rear face 200b of the electronic device 30 may include the second face 2002 and the fourth face 2004. In various embodiments (not illustrated), the first housing structure 210 may refer to a structure forming some of the first face 2001, the second face 2002, and the first side face 200c. In various embodiments (not illustrated), the second housing structure 220 may refer to a structure forming some of the third face 2003, the fourth face 2004, and the second side face 200d.

According to an embodiment, the foldable housing 200 may include a transparent plate (not illustrated) (e.g., a polymer plate including various coating layers) forming the first face 2001 and the third face 2003. The display 300 may be disposed along the transparent plate, and may be exposed through the first face 2001 and the third face 2003. The transparent plate may be flexible, thereby enabling the electronic device 20 to be folded. According to an embodiment, the display 300 may be implemented to include a transparent plate, and the transparent plate may be omitted from the foldable housing 200.

According to an embodiment, the first housing structure 210 may include a first rear cover 280 that is disposed on one side of a folding axis A and forms at least a part of the second face 2002. For example, the first rear cover 280 may have a substantially rectangular periphery 281, which may be enclosed by a first side member 211. According to various embodiments, the first side member 211 and the first rear cover 280 may be integrally formed, and may include the same material.

According to an embodiment, the second housing structure 320 may include a second rear cover 290 that is disposed on the other side of the folding axis A and forms at least a part of the fourth face 2004. For example, the second rear cover 290 may have a substantially rectangular periphery 291, which may be enclosed by a second side member 221. According to various embodiments, the second side member 221 and the second rear cover 290 may be integrally formed, and may include the same material.

According to various embodiments, the first rear cover 280 and/or the second rear plate 290 may be formed of, for example, coated or colored glass, ceramic, polymer, or metal (e.g., aluminum, stainless steel (STS), or magnesium), or a combination of two or more of these materials.

According to an embodiment, the first rear cover 280 and the second rear cover 290 may have substantially symmetrical shapes about the folding axis A. However, the first rear cover 280 and the second rear cover 290 do not necessarily have mutually symmetrical shapes, and in another embodiment, the first rear cover 280 and/or the second rear cover 290 having various shapes may be provided.

According to an embodiment, the first housing structure 210 may include a first side member (or a first side bezel structure) 211 forming the first side face 200c, and the second housing structure 220 may include a second side member (or a second side bezel structure) 221 forming the second side face 200d. The first side member 211 and/or the second side member 221 may include a metal or a polymer.

According to various embodiments, the first side member 211 and the second side member 221 may extend so as to form the peripheral area of the front face 200a. For example, the front face 200a of the electronic device 20 may include the display 300 and an area of the first side member 211 and an area of the second housing structure 221, which are adjacent to the display 300.

According to various embodiments, an area (not illustrated) adjacent to the periphery 281 of the first rear cover 280 in the first side member 211 and/or an area (not illustrated) adjacent to the periphery 291 of the second rear cover 290 in the second side member 221 may form a part of the rear face 200b. For example, the rear face 200b of the electronic device 20 may include the first rear cover 280, an area of the first side member 211 adjacent to the first rear cover 280, the second rear cover 290, and an area of the second side member 221 adjacent to the second rear cover 290.

According to an embodiment, the first side member 211 and the second side member 221 may be disposed on opposite sides about the folding axis A, and may have generally symmetrical shapes about the folding axis A.

According to an embodiment, the first housing structure 210 may further include a component-mounting area 214 extending from the first side member 211 or coupled to the first side member 211 to form the first face 2001 together with the display 300. In the first side member 221, an area other than the component-mounting area 214 may have a shape symmetrical with the second side member 221. In the component-mounting area 214, at least one component utilizing the first face 2001 may be mounted. According to an embodiment, the component-mounting area 214 may be formed to have a predetermined area adjacent to one corner of the first side member 211. According to various embodiments, the arrangement, shape, and size of the component-mounting area 214 are not limited to those in the illustrated example. For example, in another embodiment, the component-mounting area 214 may be provided at another corner of the first side member 211 or in any area between the upper and lower end corners. In an embodiment, components embedded in the electronic device 20 to perform various functions may be exposed to the first face 2001 through the component-mounting area 214 or one or more openings provided in the component-mounting area 214. According to an embodiment of the disclosure, components 246 disposed in the component-mounting area 214 may include at least one of various sensors such as a proximity sensor, a front camera, a light-emitting element, or a receiver. For example, the light-emitting element may provide, for example, information about the status of the electronic device 20 in an optical form. In another embodiment, the light-emitting element may provide a light source that is interlocked with, for example, the operation of the front camera. The light-emitting element may include, for example, an LED, an IR LED, and a xenon lamp.

According to an embodiment, the electronic device 20 may include at least one of audio modules 241 and 242, a key input device 243, a connector hole 244, or a pen hole 247.

According to an embodiment, the audio modules 241 and 242 may include a microphone hole 241 or a speaker hole 242. The microphone hole 241 may include a microphone disposed therein so as to acquire external sound, and in some embodiments, the microphone hole 241 may include multiple microphones disposed therein so as to sense the direction of sound. The speaker hole 242 may include an external speaker and a call receiver hole. In some embodiments, the speaker hole 242 and the microphone hole 241 may be implemented as a single hole, or a speaker may be included without the speaker hole 242 (e.g., a piezo speaker).

According to an embodiment, the key input devices 243 may be disposed on the side faces 200c and 200d of the folder housing 200. In another embodiment, the electronic device 20 may not include some or all of the above-mentioned key input devices 243, and a key input device 243 that is not included may be implemented in another form such as that of a soft key (or a software button) on the display 300. In some embodiments, the key input devices may include a sensor module (e.g., one or more components 245 disposed on a first rear area 282) disposed on the second face 2002 of the first housing structure 210.

According to an embodiment, the connector hole 244 may include a first connector hole capable of accommodating a connector (e.g., a USB connector) for transmitting/receiving power and/or data to/from an external electronic device, and/or a second connector hole capable of accommodating a connector (e.g., an earphone jack) for transmitting/receiving an audio signal to/from an electronic device. The positions and number of connector holes may vary, and are not limited to the example illustrated in FIG. 3.

According to an embodiment, the pen hole 247 is an entrance for inserting/removing an electronic pen (e.g., a stylus pen) 460 into/from the electronic device 30, and may be provided in the second side member 211 of the first housing structure 210. When the electronic pen 460 is inserted through the pen hole 247, the electronic pen 460 may be disposed in a pen space (not illustrated) provided inside the first housing structure 210. According to various embodiments, the pen hole 247 and the pen space corresponding thereto may be provided in the second housing structure 220.

In various embodiments (not illustrated), at least one of an audio module (e.g., a call receiver), a sensor module (e.g., a proximity sensor or a fingerprint sensor), a camera module (e.g., a front camera), or a light-emitting element may be included in the rear face of the screen display area of the display. In another embodiment (not illustrated), the display 300 may be coupled to or disposed adjacent to a touch-sensing circuit, a pressure sensor capable of measuring the intensity (pressure) of a touch, and/or a digitizer that detects an electromagnetic-field-type stylus pen 460.

In an embodiment, the first housing structure 210 and the second housing structure 220 may form a recess, which is a space in which the display 300 is disposed. In the illustrated embodiment, due to the component-mounting area 214, the recess may have two or more different widths in a direction perpendicular to the folding axis A.

For example, the recess may include a first width w1 between a first portion 221a parallel to the folding axis A in the second side member 221 and a first portion 211a formed at an edge of the component-mounting area 214 in the first side member 211. The recess may include a second width w2 between a second portion 221b in the second side member 221 and a second portion 211a, which does not correspond to the component-mounting area 214 and is parallel to the folding axis A in the first side member 211. The second width w2 may be longer than the first width w1. According to an embodiment, the first portion 211a of the first housing structure 210 and the first portion 221a of the second housing structure 220, which are not symmetrical with each other, may form the first width w1 of the recess, and the second portion 211b of the first housing structure 210 and the second portion 221b of the second housing structure 220, which are symmetrical with each other, may form the second width w2 of the recess. According to an embodiment, the first portion 221a and the second portion 221b of the second housing structure 220 may have different respective distances from the folding axis A. The widths of the recess are not limited to the illustrated example. According to various embodiments, the recess may have multiple widths due to the shape of the component-mounting area 214 or due to the asymmetric portions of the first housing structure 210 and the second housing structure 220.

According to various embodiments, one or more components may be disposed or visually exposed on the rear face 200b of the electronic device 20. For example, at least a part of a sub-display 293 may be visually exposed through a second rear area 292 of the second rear cover 290. For example, one or more components 245 may be visually exposed through the first rear area 282 of the first rear cover 280. In various embodiments, the one or more components 245 may include sensors (e.g., a proximity sensor and a heart rate sensor) and/or a rear camera.

Referring to FIG. 3, the hinge cover 230 may be disposed between the first housing structure 210 and the second housing structure 220 so as to cover internal components (e.g., the hinge structure). According to some embodiments, the hinge structure may be referred to as an element including the hinge cover 230. In an embodiment, the hinge cover 230 may be covered by a part of the first and second housing structures 210 and 220, or may be exposed to the outside depending on the state of the electronic device 20 (the unfolded state or the folded state).

For example, as illustrated in FIG. 2, when the electronic device 20 is in the unfolded state, the hinge cover 230 may be covered by the first housing structure 210 and the second housing structure 220 and may thus not be exposed. As another example, as illustrated in FIG. 3, when the electronic device 20 is in the folded state (e.g., the completely folded state), the hinge cover 230 may be exposed to the outside between the first housing structure 210 and the second housing structure 220. For example, when the electronic device 20 is located in the state in which the first housing structure 210 and the second housing structure 220 are in the intermediate state, in which the first housing structure 210 and the second housing structure 220 form a predetermined angle therebetween (e.g., a state between the unfolded state and the folded state), the hinge cover 230 may be partially exposed to the outside between the first housing structure 210 and the second housing structure 220. The exposed area of the hinge cover 230 in the intermediate state may be smaller than the exposed area of the hinge cover 230 in the completely folded state. In an embodiment, the hinge cover 230 may include a curved face, and the curved face may form one side face of the electronic device 20 in the folded state.

According to various embodiments, the display 300 may refer, for example, to a display in which at least one area is deformable into a planar face or a curved face. In an embodiment, referring to FIG. 2, the display 300 may include a folding portion 303, a first portion 301 disposed on one side of the folding portion 303 (e.g., the right side of the folding portion 303), and a second portion 302 disposed on the other side of the folding portion 303 (e.g., the left side of the folding portion 203). According to some embodiments, the folding portion 303 may be a portion that is bent when the electronic device 20 is changed from the unfolded state to the folded state.

According to various embodiments, the area division of the display 300 illustrated in FIG. 3 is illustrative, and the display 300 may be divided into multiple areas (e.g., four or more or two areas) depending on the structure or function thereof. For example, in the embodiment illustrated in FIG. 2, the areas of the display 300 may be divided by the folding portion 303 or the folding axis A, which extends parallel to the y axis. However, in another embodiment, the areas of the display 300 may be divided on the basis of another folding portion (e.g., a folding portion parallel to the x axis) or another folding axis (e.g., a folding axis parallel to the x axis).

According to an embodiment, the first portion 301 and the second portion 302 of the display 300 may have generally symmetrical shapes about the folding portion 303. According to an embodiment, unlike the first portion 301, the second portion 302 may include a notch cut due to the presence of the component-mounting area 214, but may have a symmetrical shape with the first portion 301 about the folding portion 303 in the area other than the component-mounting area. For example, the first portion 301 and the second portion 302 may include mutually symmetrical portions and mutually asymmetrical portions about the folding portion 303.

According to an embodiment, the angle or the distance formed by the first housing structure 210 and the second housing structure 220 may vary depending on whether the foldable housing 200 is in the unfolded state, the folded state, or the intermediate state. Hereinafter, the operations of the first housing structure 210 and the second housing structure 220 and respective areas of the display 300 depending on the state of the electronic device 20 (e.g., the unfolded state or the folded state) will be described.

According to an embodiment, when the electronic device 20 is in the unfolded state (see FIG. 2), a first direction 201 that the first face 2001 of the first housing structure 210 faces and a third direction 203 that the third face 2003 of the second housing 220 faces may be the same. For example, in the unfolded state, the first face 2001 of the first housing structure 210 and the third face 2003 of the second housing structure 220 may be disposed to form an angle of about 180 degrees therebetween and to face the same direction (e.g., the direction that the front face 200a faces). In the state in which the electronic device 20 is unfolded, the surface of the first area 201 and the surface of the second area 202 of the display 200 may form an angle of 180 degrees therebetween, and may face the same direction (e.g., the direction that the front face 200a of the electronic device 20 faces). In the unfolded state, the folding portion 303 of the display 300 may form the same plane as the first portion 301 and the second portion 302.

In an embodiment, when the electronic device 20 is in the folded state (see FIG. 3), the first housing structure 210 and the second housing structure 220 may be disposed to face each other. For example, in the folded state, the first face 2001 of the first housing structure 210 and the third face 2003 of the second housing structure 220 may face each other. In the folded state, the surface of the first portion 301 and the surface of the second portion 302 of the display 300 may face each other while forming a narrow angle (e.g., an angle between 0 and 10 degrees) therebetween. In the folded state, at least a part of the folding area 303 may form a curved face having a predetermined curvature.

In an embodiment, when the electronic device 20 is in the intermediate state (e.g., the state between the unfolded state and the folded state), the first housing structure 210 and the second housing structure 220 may be disposed to form a predetermined angle relative to each other. In the intermediate state, the first face 2001 of the first housing structure 210 and the third face 3003 of the second housing structure 320, or the surface of the first portion 301 and the surface of the second portion 301 of the display 300, may form an angle therebetween that is larger than that in the folded state and smaller than that in the unfolded state. In the intermediate state, at least a part of the folding portion 303 may form a curved face having a predetermined curvature, and the curvature at this time may be smaller than that in the folded state.

According to an embodiment, the first side member 211 may include a plurality of conductive portions (not illustrated), which are physically or electrically separated from each other. Nonconductive members 271 may be disposed between the plurality of conductive portions. According to an embodiment, the nonconductive members 271 may extend from a nonconductive first internal structure (not illustrated) disposed inside the first housing structure 210. The first internal structure may be coupled with the first side member 211, whereby the plurality of conductive portions may be maintained in the state of being physically separated by the first internal structure. For example, the first internal structure may be provided in a form coupled to the first side member 211 through insert injection molding.

According to an embodiment, the second side member 221 may include a plurality of conductive portions (not illustrated), which are physically or electrically separated from each other. Nonconductive members 272 may be disposed between the plurality of conductive portions. According to an embodiment, the nonconductive members 272 may extend from a nonconductive second internal structure (not illustrated) disposed inside the second housing structure 220. The second internal structure may be coupled with the second side member 221, whereby the plurality of conductive portions may be maintained in the state of being physically separated by the second internal structure. For example, the second internal support structure may be provided in a form coupled to the second side member 221 through insert injection molding.

Figure 4:
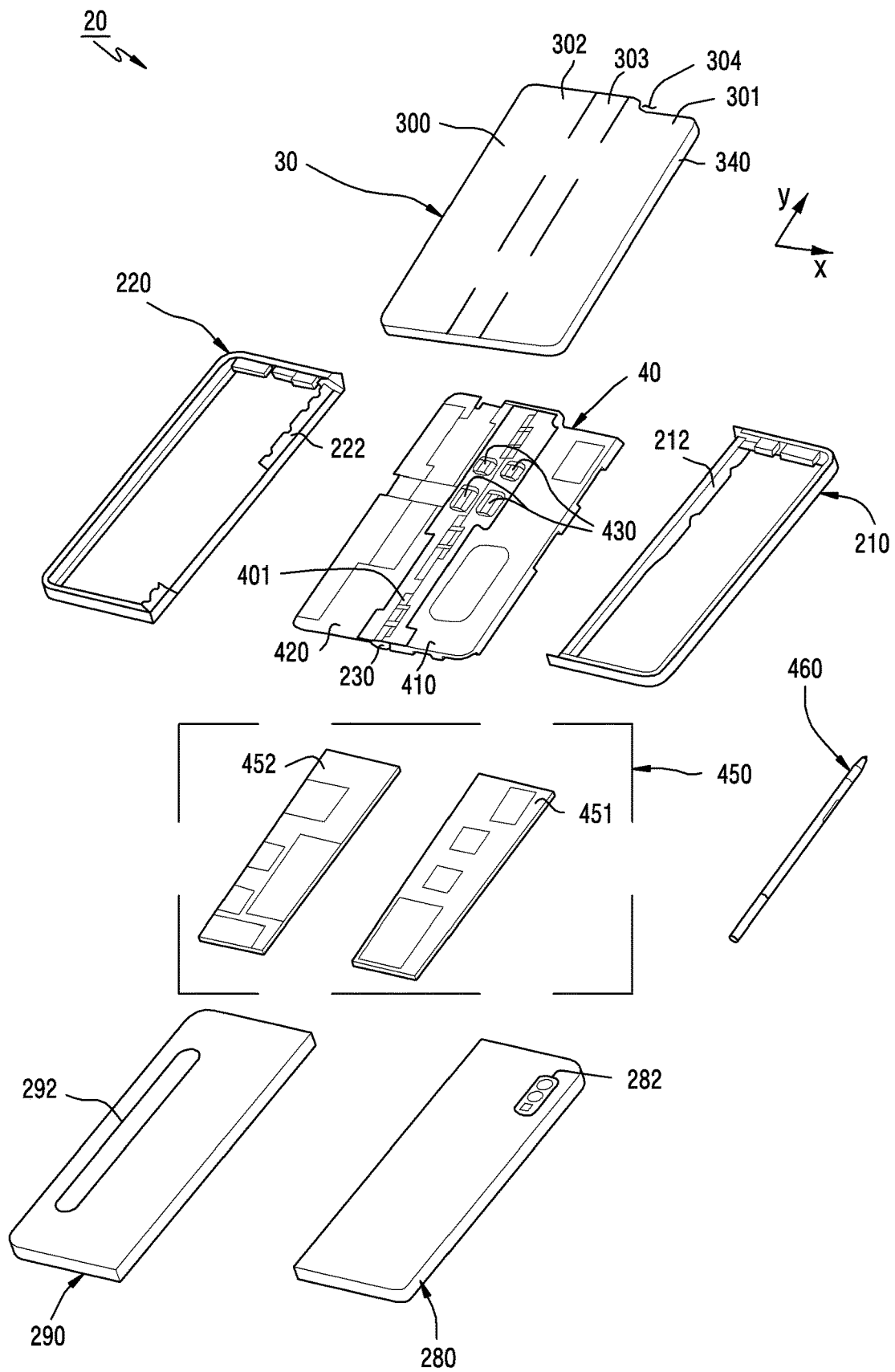
FIG. 4 is an exploded perspective view of the electronic device of FIG. 2 or FIG. 3 according to an embodiment.

FIG. 4 is an exploded perspective view of the electronic device illustrated in FIG. 2 or 3 according to an embodiment.

Referring to FIG. 4, in an embodiment, the electronic device 20 may include at least one of a display unit 30, a support member assembly 40, a board unit 450, a first housing structure 210, a second housing structure 220, a first rear cover 280, or a second rear cover 290. Herein, the display unit 30 may be referred to as a display module or a display assembly.

The display unit 30 may include a display 300 and at least one plate or layer 340 on which the display 300 is seated. In an embodiment, the plate 340 may be disposed between the display 400 and the support member assembly 40. The display panel 300 may be disposed on at least a part of one face (e.g., the top face with reference to FIG. 4) of the plate 340. The plate 340 may be formed in a shape corresponding to that of the display panel 300. For example, an area of the plate 340 may be formed in a shape corresponding to that of the notch 304 in the display 300.

According to an embodiment, the display unit 30 may include a digitizer for detecting the electronic pen 460. The digitizer may include a third portion (not illustrated) disposed along at least a part of the first portion 301 of the display 300 and a fourth portion (not illustrated) disposed along at least a part of the second portion 302 of the display 300. The digitizer may include a folding portion disposed along at least a part of the folding portion 303 of the display 300. The folding portion may connect the third portion and the fourth portion between the third portion and the fourth portion. The digitizer is a device that is capable of inputting an x position and a y position, and is capable of detecting a magnetic-field-type electronic pen 460. For example, a digitizer controller (not illustrated) may provide current to the digitizer, and the digitizer may generate an electromagnetic field. When the electronic pen 460 approaches the electromagnetic field of the digitizer, an electromagnetic induction phenomenon may occur, and a resonance circuit (not illustrate) of the electronic pen 460 may generate current. The resonance circuit of the electronic pen 460 may form a magnetic field using the generated current. The digitizer controller may detect the position by scanning the intensity of the magnetic field applied from the electronic pen 460 to the digitizer over the entire area. The digitizer controller may provide the detected position information to a host device (e.g., the processor 120 in FIG. 1), and the host device may perform an operation related to the detected position information (e.g., outputting image information) to the display 300).

According to an embodiment, the digitizer may be coupled to the rear face of the display 300 or may be disposed adjacent to the rear face of the display 300. According to an embodiment, the plate 340 may include the digitizer.

According to an embodiment, the support member assembly 40 may include a first support member 410, a second support member 420, a hinge structure 401 disposed between the first support member 410 and the second support member 420, a hinge cover 230 that covers the hinge structure 401 when the hinge structure 401 is viewed from the outside, and a wiring member 430 (e.g., a flexible printed circuit board (FPCB)) extending across the first and second support members 410 and 420.

In an embodiment, the support member assembly 40 may be disposed between the plate 340 and the board unit 450. For example, the first support member 410 may be disposed between the first portion 301 of the display 300 and a first board (e.g., the first printed circuit board PCB) 451. The second support member 420 may be disposed between the second portion 302 of the display 300 and a second board (e.g., the second PCB) 452.

According to an embodiment, at least a part of the wiring member 430 and the hinge structure 401 may be disposed inside the support member assembly 40. The wiring member 430 may be disposed in a direction across the first support member 410 and the second support member 420 (e.g., the X-axis direction). The wiring member 430 may be disposed in a direction (e.g., the x-axis direction) perpendicular to the folding axis (e.g., the y axis or the folding axis A in FIG. 2) of the folding portion 303 of the display 300.

According to an embodiment, the board unit 450 may include a first board 451 disposed on the first support member 410 side and a second board 452 disposed on the second support member 420 side. The first board 451 and the second board 452 may be disposed in a space formed by the support member assembly 40, the first housing structure 210, the second housing structure 220, the first rear cover 280, and the second rear cover 290. Components for implementing various functions of the electronic device 20 may be mounted on the first board 451 and the second board 452.

According to an embodiment, the first housing structure 210 and the second housing structure 220 may be assembled to each other so as to be coupled to opposite sides of the support member assembly 40 in the state in which the display unit 30 is coupled to the support member assembly 40. According to various embodiments, the first housing structure 210 and the second housing structure 220 may be coupled to the support member assembly 40 by sliding on the opposite sides of the support member assembly 40.

In an embodiment, the first housing structure 210 may include a first rotational support face 212, and the second housing structure 220 may include a second rotational support face 222, which corresponds to the first rotational support structure 212. The first rotational support face 212 and the second rotational support face 222 may include curved faces corresponding to curved faces included in the hinge cover 230.

In an embodiment, when the electronic device 20 is in the unfolded state (see FIG. 2), the first rotational support face 212 and the second rotational support face 222 may cover the hinge cover 230, and the hinge cover 230 may not be exposed to the rear face of the electronic device 20, or may be minimally exposed thereto. When the electronic device 20 is in the folded state (see FIG. 3), the hinge cover 230 may be exposed as much as possible between the first rotational support face 212 and the second rotational support face 222.

Figure 5A:
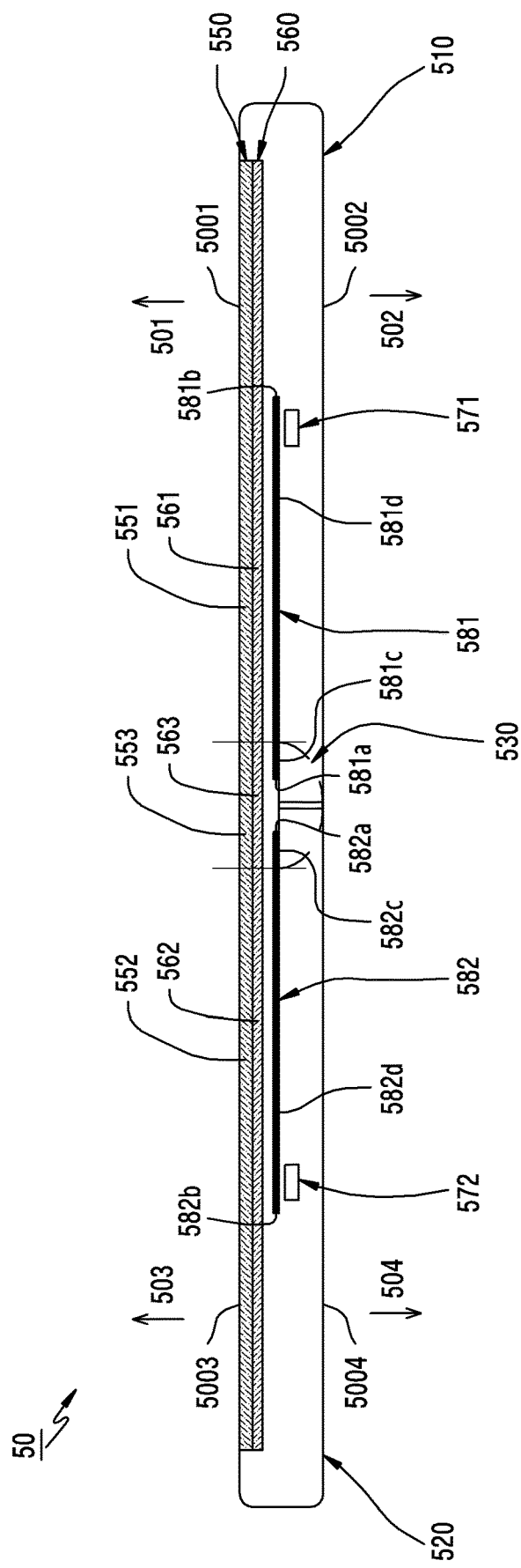
FIG. 5A is a cross-sectional view illustrating an example electronic device in the unfolded state according to an embodiment.
Figure 5B:
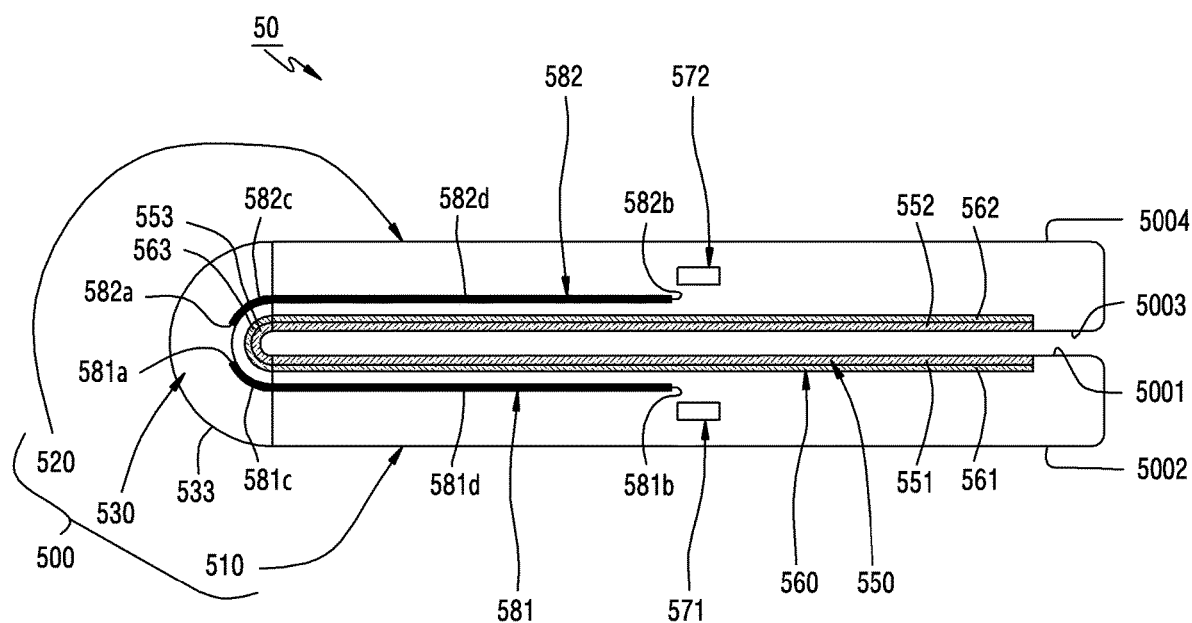
FIG. 5B is a cross-sectional view illustrating the example electronic device in the folded state according to an embodiment.

FIG. 5A is a cross-sectional view illustrating an example electronic device in the unfolded state according to an embodiment. FIG. 5B is a cross-sectional view illustrating the example electronic device in the folded state according to an embodiment.

Referring to FIGS. 5A and 5B, in an embodiment, an electronic device 50 (e.g., the electronic device 20 in FIG. 2) may include at least one of a foldable housing 500 (e.g., the foldable housing 200 in FIG. 2 or FIG. 3), a display 550 (e.g., the display 300 in FIG. 2), a digitizer 560, a first magnet 571, a second magnet 572, a first magnetic shield member 581, and/or a second magnetic shield member 582.

According to an embodiment, the foldable housing 500 may include at least one of a first housing structure 510 (e.g., the first housing structure 210 in FIG. 2), a second housing structure 520 (e.g., the second housing structure 220 in FIG. 2), or a hinge structure 530 (e.g., the hinge structure 401 in FIG. 4).

According to an embodiment, the first housing structure 510 may include a first face 5001 (e.g., the first face 2001 in FIG. 2) that faces a first direction 501 (e.g., the first direction 201 in FIG. 2) and a second face 5002 (e.g., the second face 2002 in FIG. 2) that faces a second direction 502 (e.g., the second direction 202 in FIG. 2) that is opposite the first direction 501.

According to an embodiment, the second housing structure 520 may include a third face 5003 (e.g., the third face 2003) that faces a third direction 503 (e.g., the third direction 203 in FIG. 2) and a fourth face 5004 (e.g., the fourth face 2004 in FIG. 2) that faces a fourth direction 504 (e.g., the fourth direction 204 in FIG. 2) that is opposite the third direction 503.

According to an embodiment, the hinge structure 530 may connect the first housing structure 510 and the second housing structure 520, and the first housing structure 510 and the second housing structure 520 are rotatable relative to each other about the hinge structure 530. According to an embodiment, in the unfolded state (see FIG. 5A), the first direction 501 may be substantially the same as the third direction 503. According to an embodiment, in the folded state (see FIG. 5B), the first face 5001 may face the third face 5003.

According to an embodiment, the display 550 may extend from the first face 5001 to the third face 5003. The display 550 may include a first portion 551 forming at least a part of the first face 5001 and a second portion 552 forming at least a part of the third face 5003. The display 550 may include a folding portion 553 (e.g., the folding portion 302 of FIG. 2) connecting the first portion 551 and the second portion 552.

According to an embodiment, the digitizer 560 may include a third portion 561, disposed between the first portion 551 of the display 550 and the second face 5002 of the first housing structure 510. As another example, the digitizer 560 may include a fourth portion 562, disposed between the second portion 552 of the display 550 and the fourth face 5004 of the second housing structure 520. As another example, the digitizer 560 may include a folding portion 563 disposed along the folding portion 553 of the display 550 and connecting the third portion 561 and the fourth portion 562.

According to an embodiment, the digitizer 560 may detect an input (e.g., a touch input or a hovering input) made through an electronic pen (or a stylus pen) (e.g., the electronic pen 460 in FIG. 2 or FIG. 3) using an electromagnetic field. For example, a digitizer controller (not illustrated) may provide current to the digitizer 560, and the digitizer 560 may generate an electromagnetic field. When the electronic pen approaches the electromagnetic field of the digitizer 560, an electromagnetic induction phenomenon may occur, and current may occur in the resonance circuit of the electronic pen. The resonance circuit of the electronic pen may form a magnetic field using the generated current. The digitizer controller may detect the position by scanning the intensity of the magnetic field applied from the electronic pen to the digitizer 560 over the entire area.

According to an embodiment, the first magnet 571 may be disposed inside the first housing structure 510, and may overlap the third portion 561 of the digitizer 560 when viewed from above the second face 5002.

According to an embodiment, the second magnet 572 may be disposed inside the second housing structure 520, and may overlap the fourth portion 562 of the digitizer 560 when viewed from above the fourth face 5004.

According to an embodiment, the first magnetic shield member 581 may be disposed inside the foldable housing 500. In the unfolded state (see FIG. 5A), the first magnetic shield member 581 may overlap the first magnet 571 when viewed from above the second face 5002. In the folded state (see FIG. 5B), the first magnetic shield member 581 may not overlap the first magnet 571 when viewed from above the second face 5002.

According to an embodiment, the second magnetic shield member 582 may be disposed inside the foldable housing 500. In the unfolded state (see FIG. 5A), the second magnetic shield member 582 may overlap the second magnet 572 when viewed from above the fourth face 5004. In the folded state (see FIG. 5B), the second magnetic shield member 582 may not overlap the second magnet 572 when viewed from above the fourth face 5004.

According to an embodiment, in the folded state (see FIG. 5B), the first magnet 571 and the second magnet 572 may be disposed so as to be aligned with or to face each other. In the folded state, between the first magnet 571 and the second magnet 572, the first portion 551 and the second portion 552 of the display 550 and the third portion 561 and the fourth portion 562 of the digitizer 560 may be disposed. According to an embodiment, the folded state of the electronic device 50 may be maintained by the attraction force between the first magnet 571 and the second magnet 572. The attraction force between the first magnet 571 and the second magnet 572 may maintain the folded state against the elastic force of the display 550 (e.g., the restoring force for unfolding the folding portion 553 in the state in which the folding portion 553 is bent). According to an embodiment, in the folded state, the distance between the first magnet 571 and the second magnet 572 may be about 10 mm or less.

According to an embodiment, in the unfolded state (see FIG. 5A), the first magnetic shield member 581 may reduce the influence of the first magnet 571 on the electronic device 50. According to an embodiment, in the unfolded state, the second magnetic shield member 582 may reduce the influence of the second magnet 572 on the electronic device 50.

According to an embodiment, in the unfolded state (see FIG. 5A), when input (e.g., a touch input or a hovering input) is made through the first face 5001 using an electronic pen (e.g., the electronic pen 460 in FIG. 2) that uses an electromagnetic field, the first magnetic shield member 581 may be disposed between the first magnet 571 and the third portion 561 of the digitizer 560, and may reduce the influence of the magnetic field from the first magnet 571 on the interaction between the third portion 561 and the electronic pen. In the unfolded state, the first magnetic shield member 581 may reduce the influence of the magnetic field from the first magnet 571 on an electromagnetic field related to the third portion 561 or an electromagnetic field related to the resonance circuit of the electronic pen, which interacts with the third portion 561.

According to an embodiment, in the unfolded state (see FIG. 5A), when an input (e.g., a touch input or a hovering input) is made through the third face 5003 using an electronic pen (e.g., the electronic pen 460 in FIG. 2) that uses an electromagnetic field, the second magnetic shield member 582 may be disposed between the second magnet 572 and the fourth portion 562 of the digitizer 560, and may reduce the influence of the magnetic field from the second magnet 572 on the interaction between the fourth portion 562 and the electronic pen. In the unfolded state, the second magnetic shield member 582 may reduce the influence of the magnetic field from the second magnet 572 on an electromagnetic field related to the fourth portion 562 or an electromagnetic field related to the resonance circuit of the electronic pen, which interacts with the fourth portion 562.

For example, when the magnetic shield members (e.g., the first magnetic shield member 581 and the second magnetic shield member 582) are not provided, in the unfolded state, when an input (e.g., a touch input or a hovering input) is made through a screen (e.g., the first face 5001 or the third face 5003) using an electronic pen that utilizes an electromagnetic field, a magnetic field from a magnet (e.g., the first magnet 571 or the second magnet 572) may cause an error regarding the input made through the electronic pen.

According to various embodiment, in the unfolded state (see FIG. 5A), when an input (e.g., a touch input or a hovering input) is made through the first face 5001 using an object such as a finger, the first magnetic shield member 581 may be disposed between the first magnet 571 and the first portion 551 of the display 550, and may reduce the influence of the magnetic field from the first magnet 571 on a touch circuit included in the first portion 551. For example, in the unfolded state, the first magnetic shield member 581 may reduce the influence of the magnetic field from the first magnet 571 on an electromagnetic field formed through the first portion 551 of the display 550.

According to various embodiment, in the unfolded state (see FIG. 5A), when an input (e.g., a touch input or a hovering input) is made through the third face 5003 using an object such as a finger, the second magnetic shield member 582 may be disposed between the second magnet 571 and the second portion 552 of the display 550, and may reduce the influence of the magnetic field from the second magnet 571 on a touch circuit in the second portion 552 of the display 550. For example, in the unfolded state, the second magnetic shield member 582 may reduce the influence of the magnetic field from the second magnet 572 on an electromagnetic field formed through the second portion 552 of the display 550.

According to an embodiment, in the unfolded state (see FIG. 5A), the first magnetic shield member 581 may prevent and/or reduce foreign matter from adhering to the first face 5001 by magnetic force from the first magnet 571. According to an embodiment, in the unfolded state, the second magnetic shield member 582 may prevent and/or reduce foreign matter from adhering to the third face 5003 by magnetic force from the second magnet 572. For example, when the magnetic shield members (e.g., the first magnetic shield member 581 and the second magnetic shield member 582) are not provided, in the unfolded state, foreign matter, which reacts to the magnets (e.g., the first magnet 571 and the second magnet 572), may adhere to the front face (e.g., the first face 5001 or the third face 5003) by magnetic force, and the foreign matter may contaminate the front face or may cause damage (e.g., scratching) on the front face when the electronic device 50 is folded.

According to an embodiment, the first magnetic shield member 581 may be fixed to the hinge structure 530, and may be at least partially disposed in the first housing structure 510. In an embodiment, the first magnetic shield member 581 may be a plate extending from a first end portion 581a fixed to the hinge structure 530 to a second end portion 581b located in the first housing structure 510. In an embodiment, the second magnetic shield member 582 may be fixed to the hinge structure 530, and may be at least partially disposed in the second housing structure 520. In an embodiment, the second magnetic shield member 582 may be a plate extending from a first end portion 582a fixed to the hinge structure 530 to a second end portion 582b located in the second housing structure 520.

In an example embodiment, the magnetic shield members may include a material such as iron that is able to block magnetic force. According to an embodiment, the first magnetic shield member 581 and/or the second magnetic shield member 582 may, for example, and without limitation, include iron of about 100% purity.

According to an embodiment, when the unfolded state (see FIG. 5A) is switched into the folded state (see FIG. 5B), the first magnetic shield member 581 may be moved so as not to overlap the first magnet 571 when viewed from above the second face 5002. According to an embodiment, when the folded state is switched into the unfolded state, the first magnetic shield member 581 may be moved so as to overlap the first magnet 571 when viewed from above the second face 5002.

According to an embodiment, when the unfolded state (see FIG. 5A) is switched into the folded state (see FIG. 5B), the second magnetic shield member 582 may be moved so as not to overlap the second magnet 572 when viewed from above the fourth face 5004. According to an embodiment, when the folded state is switched into the unfolded state, the second magnetic shield member 582 may be moved so as to overlap the second magnet 572 when viewed from above the fourth face 5004.

According to an embodiment, when the electronic device 50 is switched from the unfolded state (see FIG. 5A) into the folded state (see FIG. 5B), the positional relationship (or spatial relationship) between the housing structures and the hinge structure 530 may be changed due to the rotation of the housing structures (e.g., the first housing structure 510 and the second housing structure 520) about the hinge structure 530. For example, a portion (e.g., the hinge cover 533 (e.g., the hinge cover 230 in FIG. 3)) or at least one point of the hinge structure 530 may be moved from the inside to the outside of the housing structures when the unfolded state is switched into the folded state, and the part or the at least one point may be moved from the outside to the inside when the folded state is switched into the unfolded state. For example, a portion (e.g., the hinge cover 533) or at least one point of the hinge structure 530 may move away from the housing structures when the electronic device 50 is switched from the unfolded state into the folded state, and the part or the at least one point may become close to the housing structures when the electronic device 50 is switched from the folded state into the unfolded state. According to an embodiment, the first end portion 581a of the first magnetic shield member 581 or a portion 581c extending from the first end portion 581a or the first end portion 582a of the second magnetic shield member 582 or a portion 582c extending from the first end portion 582a may be fixed to the hinge structure 530 through any of various methods, such as bolting, bonding, or welding. When the state of the electronic device 50 is switched, due to the positional relationship between the first housing structure 510 and the hinge structure 530, the first magnetic shield member 581 may be moved relative to the first housing structure 510. When the state of the electronic device 50 is switched, due to the positional relationship between the second housing structure 520 and the hinge structure 530, the second magnetic shield member 582 may be moved relative to the second housing structure 520.

According to an embodiment, at least a part of a magnetic shield member (e.g., the first magnetic shield member 581 or the second magnetic shield member 582) may be flexible. For example, the first end portion 581a of the first magnetic shield member 581 or the portion 581c extending from the first end portion 581a or the first end portion 582a of the second magnetic shield member 582 or the portion 582c extending from the first end portion 582a may be disposed in a curved shape (e.g., a shape having a curvature) in the folded state (see FIG. 5B). According to an embodiment, the first magnetic shield member 581 or the second magnetic shield member 582 may be formed of a plate having a predetermined thickness (e.g., 5 mm or less) so as to be flexible. According to an embodiment, in the folded state, the curvature of the portion 581c of the first magnetic shield member 581 and the curvature of the portion 582c of the second magnetic shield member 582 may be substantially the same. According to some embodiments, the curvature of the portion 581c of the first magnetic shield member 581 and the curvature of the portion 582c of the second magnetic shield member 582 may be different from each other.

According to an embodiment, a portion 581d extending from the second end portion 581b of the first magnetic shield member 581 may be disposed parallel to the display 550. When the electronic device 50 is switched from the unfolded state into the folded state, the portion 581d of the first magnetic shield member 581 may be moved so as not to overlap the first magnet 571 when viewed from above the second face 5002. When the electronic device 50 is switched from the folded state into the unfolded state, the portion 581d of the first magnetic shield member 581 may be moved so as to overlap the first magnet 571 when viewed from above the second face 5002.

According to an embodiment, a portion 582d extending from the second end portion 582b of the second magnetic shield member 582 may be disposed parallel to the display 550. When the electronic device 50 is switched from the unfolded state into the folded state, the portion 582d of the second magnetic shield member 582 may be moved so as not to overlap the second magnet 572 when viewed from above the fourth face 5004. When the electronic device 50 is switched from the folded state into the unfolded state, the portion 582d of the second magnetic shield member 582 may be moved so as to overlap the second magnet 572 when viewed from above the fourth face 5004.

According to an embodiment, the portion 581c extending from the first end portion 581a of the first magnetic shield member 581 and the portion 581d extending from the second end portion 581b may be integrally formed. The portion 581c extending from the first end portion 581a of the first magnetic shield member 581 and the portion 581d extending from the second end portion 581b may include the same material capable of blocking magnetic force. According to some embodiments, the portion 581c extending from the first end portion 581a of the first magnetic shield member 581 and the portion 581d extending from the second end portion 581b may be formed of different materials and connected to each other. According to various embodiments, the portion 581c extending from the first end portion 581a of the first magnetic shield member 581 may include a material that is not capable of blocking magnetic force.

According to an embodiment, the portion 582c extending from the first end portion 582a of the second magnetic shield member 582 and the portion 582d extending from the second end portion 582b may be integrally formed. The portion 582c extending from the first end portion 582a of the second magnetic shield member 582 and the portion 582d extending from the second end portion 582b may include the same material capable of blocking magnetic force. According to some embodiments, the portion 582c extending from the first end portion 582a of the second magnetic shield member 582 and the portion 582d extending from the second end portion 582b may be formed of different materials and may be connected to each other. According to various embodiments, the portion 582c extending from the first end portion 582a of the second magnetic shield member 582 may include a material that is not capable of substantially blocking magnetic force.

According to an embodiment, the magnetic shield members (e.g., the first magnetic shield member 581 and the second magnetic shield member 582) may be implemented to be durable so as not to be stretched or contracted by the force applied thereto for movement when the electronic device 50 is switched between the folded state and the unfolded state.

According to various embodiments, the first magnetic shield member 581 and the second magnetic shield member 582 may be connected to each other. According to an embodiment, the electronic device 50 may include an intermediate portion (not illustrated) connecting the first end portion 581a of the first magnetic shield member 581 and the first end portion 528a of the second magnetic shield member 582, and the intermediate portion may be fixed to the hinge structure 530 instead of the first end portions 581a and 582a.

According to various embodiments (not illustrated), in the electronic device 50, the first magnetic shield member 581 and the second magnetic shield member 582 may be integrally formed to extend from one end portion disposed on the first housing structure 510 to the other end portion disposed on the second housing structure 520. A portion between one end portion and the other end portion of the integrally formed magnetic shield member may be fixed to the hinge structure 530.

According to various embodiments (not illustrated), the first magnet 571 and the first magnetic shield member 581 may be omitted. The electronic device 50 may include a first magnetic member (not illustrated), which is aligned with or faces the second magnet 572 in the folded state (see FIG. 5B). The first magnetic member may be disposed between the third portion 561 of the digitizer 560 and the second face 5002. The folded state of the electronic device 50 may be maintained by the attraction force between the second magnet 572 and the first magnetic member. The attraction force between the second magnet 572 and the first magnetic member may maintain the folded state against the elastic force of the display 550 (e.g., the restoring force for unfolding the folding portion 553 in the state in which the folding portion 553 is bent). According to some embodiments, the second magnetic shield member 582 may extend from the first housing structure 510 so as to be utilized as the first magnetic member.

According to various embodiments (not illustrated), the second magnet 572 and the second magnetic shield member 582 may be omitted. The electronic device 50 may include a second magnetic member (not illustrated), which is aligned with or faces the first magnet 571 in the folded state (see FIG. 5B). The second magnetic member may be disposed between the fourth portion 562 of the digitizer 560 and the fourth face 5004. The folded state of the electronic device 50 may be maintained by the attraction force between the first magnet 571 and the second magnetic member. The attraction force between the first magnet 571 and the second magnetic member may maintain the folded state against the elastic force of the display 550 (e.g., the restoring force for unfolding the folding portion 553 in the state in which the folding portion 553 is bent). According to some embodiments, the first magnetic shield member 581 may extend from the second housing structure 520 so as to be utilized as the second magnetic member.

Figure 6A:
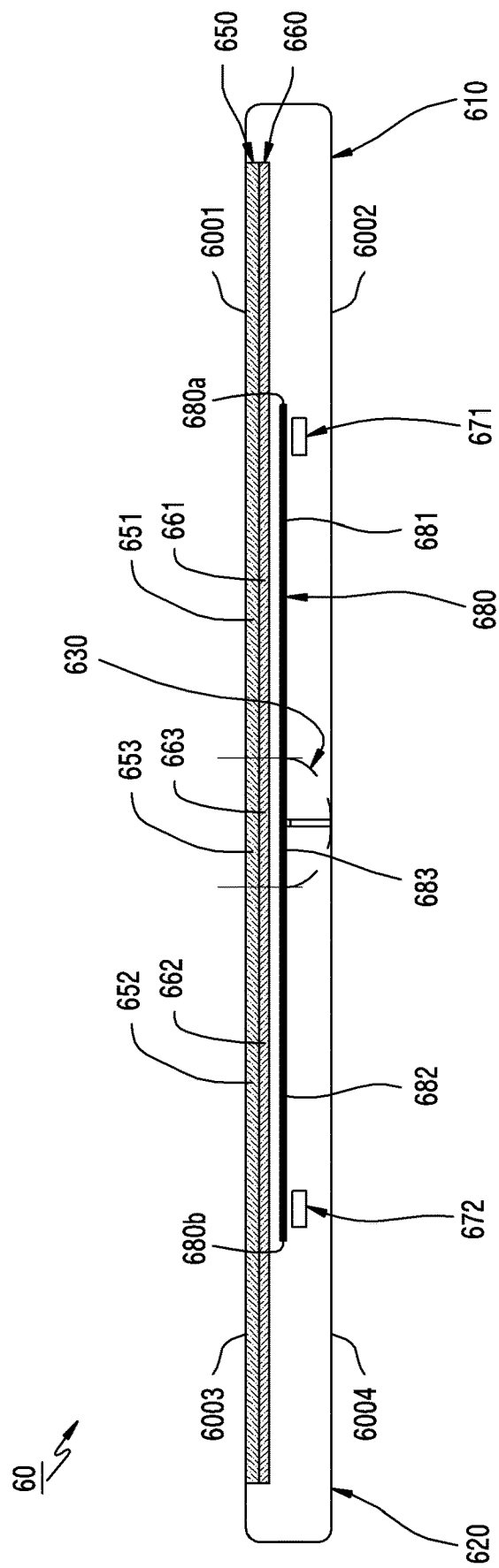
FIG. 6A is a cross-sectional view illustrating an example electronic device in the unfolded state according to an embodiment.
Figure 6B:
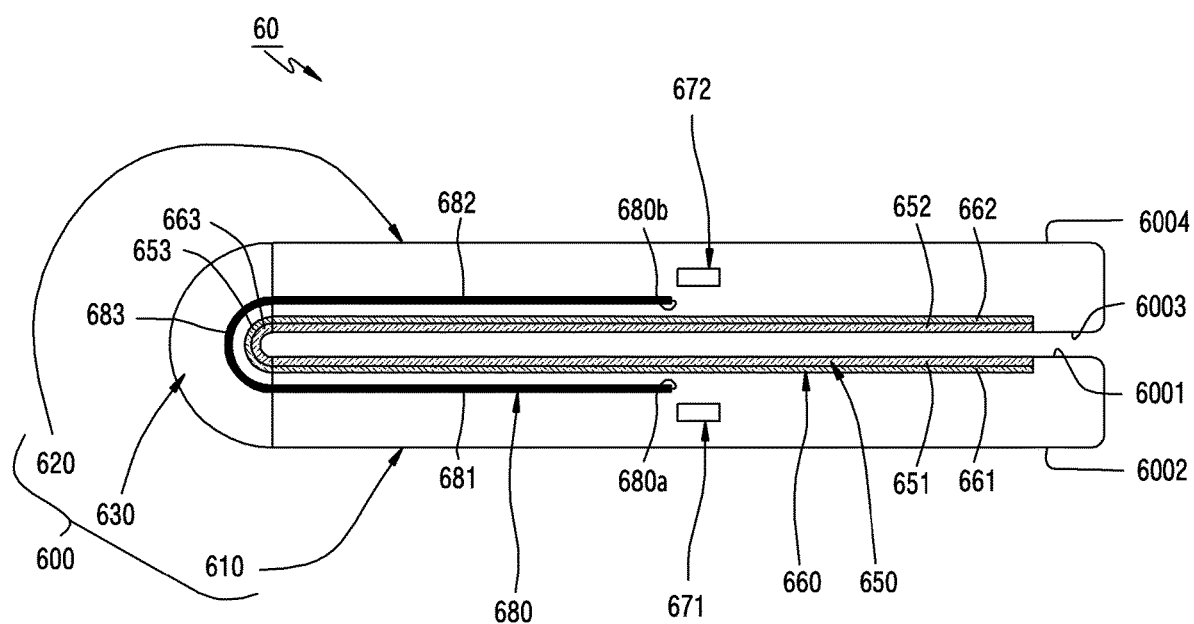
FIG. 6B is a cross-sectional view illustrating the example electronic device in the folded state according to an embodiment.

FIG. 6A is a cross-sectional view illustrating an example electronic device in the unfolded state according to an embodiment. FIG. 6B is a cross-sectional view illustrating the example electronic device in the folded state according to an embodiment.

Referring to FIGS. 6A and 6B, in an embodiment, an electronic device 60 (e.g., the electronic device 20 in FIG. 2) may include at least one of a foldable housing 600 (e.g., the foldable housing 200 in FIG. 2 or FIG. 3), a display 650 (e.g., the display 300 in FIG. 2), a digitizer 660, a first magnet 671, a second magnet 672, and/or a magnetic shield member 680.

According to an embodiment, the foldable housing 600 may be substantially the same as the foldable housing 500 of FIG. 5A or 5B. For example, the foldable housing 600 may include a first housing structure 610 including a first face 6001 and a second face 6002, a second housing structure 620 including a third face 6003 and a fourth face 6004, or a hinge structure 630 connecting the first housing structure 610 and the second housing structure 620.

According to an embodiment, the display 650 may be substantially the same as the display 550 of FIG. 5A, and may include, for example, a first portion 651 forming at least a part of the first face 6001, a second portion 652 forming at least a part of the third face 6003, and a folding portion 653 between the first portion 651 and the second portion 652.

According to an embodiment, the digitizer 660 may be substantially the same as the digitizer 560 of FIG. 5A. For example, the digitizer 660 may include a third portion 661 corresponding to the first portion 651 of the display 650, a fourth portion 662 corresponding to the second portion 652 of the display 650, or a folding portion 663 corresponding to the folding portion 653 of the display 650.

According to an embodiment, a first magnet 671 (e.g., the first magnet 571 in FIG. 5A) may be disposed inside the first housing structure 610, and may overlap the third portion 661 of the digitizer 660 when viewed from above the second face 6002.

According to an embodiment, a second magnet 672 (e.g., the second magnet 572 in FIG. 5A) may be disposed inside the second housing structure 620, and may overlap the fourth portion 662 of the digitizer 660 when viewed from above the fourth face 6004.

According to an embodiment, the magnetic shield member 680 may include a material capable of blocking magnetic force, and may be disposed inside the foldable housing 600. For example, the magnetic shield member 680 may include a single plate extending from one end portion 680a, located in the first housing structure 610, to the other end portion 680b, located in the second housing structure 620.

According to an embodiment, the magnetic shield member 680 may include a folding portion 683 fixed to the hinge structure 630, a fifth portion 681 extending from the folding portion 683 to the first housing structure 610, or a sixth portion 682 extending from the folding portion 683 to the second housing structure 620. In the state in which the electronic device 60 is unfolded (see FIG. 6A), the fifth portion 681 of the magnetic shield member 680 may overlap the first magnet 671 when viewed from above the second face 6002. In the state in which the electronic device 60 is folded (see FIG. 6B), the fifth portion 681 of the magnetic shield member 680 may not overlap the first magnet 671 when viewed from above the second face 6002. In the state in which the electronic device 60 is unfolded, the sixth portion 682 of the magnetic shield member 680 may overlap the second magnet 672 when viewed from above the fourth face 6004. In the state in which the electronic device 60 is folded, the sixth portion 682 of the magnetic shield member 680 may not overlap the second magnet 672 when viewed from above the fourth face 6004.

According to an embodiment, when the electronic device 60 is unfolded or folded, due to the positional relationship between the first and second housing structures 610 and 620 and the hinge structure 630, the magnetic shield member 680 may be moved relative to the first and second housing structures 610 and 620. For example, when the electronic device 60 is switched from the unfolded state into the folded state, the magnetic shield member 680 may be moved so as not to overlap the first magnet 671 when viewed from above the second face 6002, and may be moved so as not to overlap the second magnet 672 when viewed from above the fourth face 6004. For example, when the electronic device 60 is switched from the folded state to the unfolded state, the magnetic shield member 680 may be moved so as to overlap the first magnet 671 when viewed from above the second face 6002, and may be moved so as not to overlap the second magnet 672 when viewed from above the fourth face 6004.

According to an embodiment, at least a part of the magnetic shield member 680 may be flexible. For example, the folding portion 683 of the magnetic shield member 680 may be arranged in a curved shape (e.g., a shape having a curvature) in the folded state (see FIG. 6B). According to an embodiment, the magnetic shield member 680 may be formed of a plate having a predetermined thickness (e.g., 5 mm or less) so as to be flexible.

According to an embodiment, the fifth portion 681 of the magnetic shield member 680 may be disposed parallel to the display 650. When the electronic device 60 is switched from the unfolded state to the folded state, the fifth portion 681 of the magnetic shield member 680 may be moved so as not to overlap the first magnet 671 when viewed from above the second face 6002. When the electronic device 60 is switched from the folded state to the unfolded state, the fifth portion 681 of the magnetic shield member 680 may be moved so as to overlap the first magnet 671 when viewed from above the second face 6002.

According to an embodiment, the sixth portion 682 of the magnetic shield member 680 may be disposed parallel to the display 650. When the electronic device 60 is switched from the unfolded state to the folded state, the sixth portion 682 of the magnetic shield member 680 may be moved so as not to overlap the second magnet 672 when viewed from above the fourth face 6004. When the electronic device 60 is switched from the folded state to the unfolded state, the sixth portion 682 of the magnetic shield member 680 may be moved so as to overlap the second magnet 672 when viewed from above the fourth face 6004.

According to an embodiment, the magnetic shield member 680 may be implemented to be durable so as not to be stretched or contracted by the force applied thereto for movement when switching is performed between the folded state and the unfolded state.

According to an embodiment, in the folded state (see FIG. 6B), the first magnet 671 and the second magnet 672 may be disposed to be aligned with or to face each other. In the folded state, the first portion 651 and the second portion 652 of the digitizer 650 and the third portion 661 and the fourth portion 662 of the digitizer 660 may be disposed between the first magnet 671 and the second magnet 672. According to an embodiment, the folded state of the electronic device 60 may be maintained by the attraction force between the first magnet 671 and the second magnet 672.

According to an embodiment, like the magnetic shield members 581 and 582 of FIGS. 5A and 5B, the magnetic shield member 680 may reduce the influence of the first magnet 671 and the second magnet 672 on the electronic device 60 in the unfolded state (see FIG. 6A).

Figure 7A:
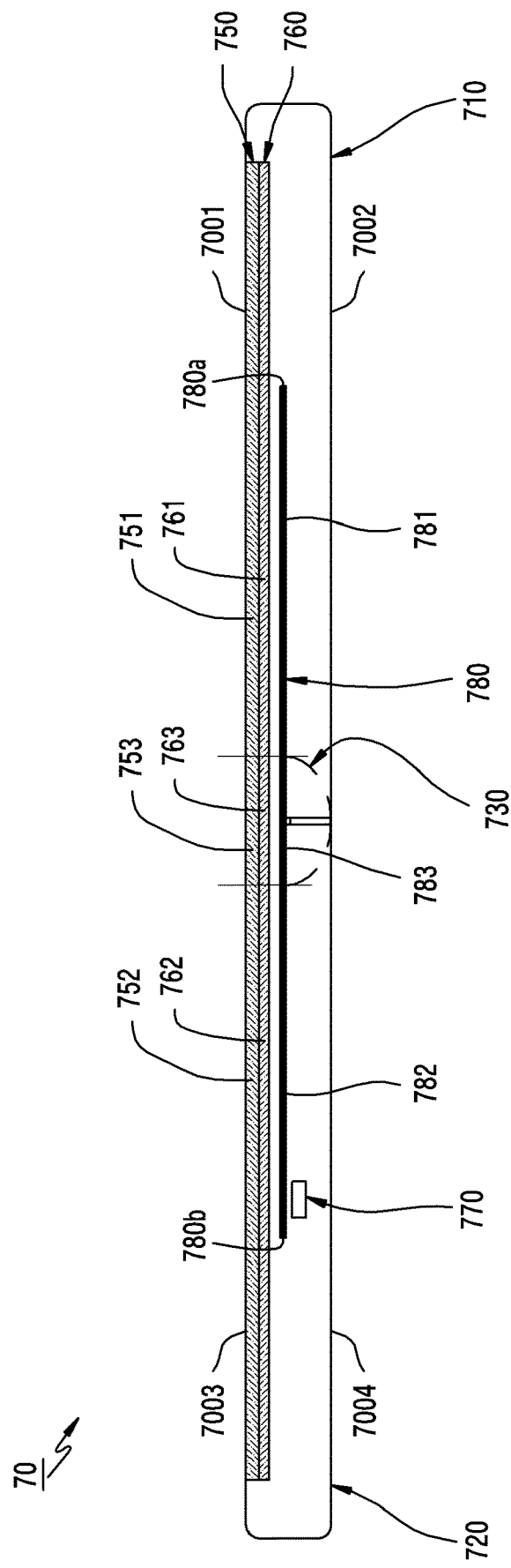
FIG. 7A is a cross-sectional view illustrating an example electronic device in the unfolded state according to an embodiment.
Figure 7B:
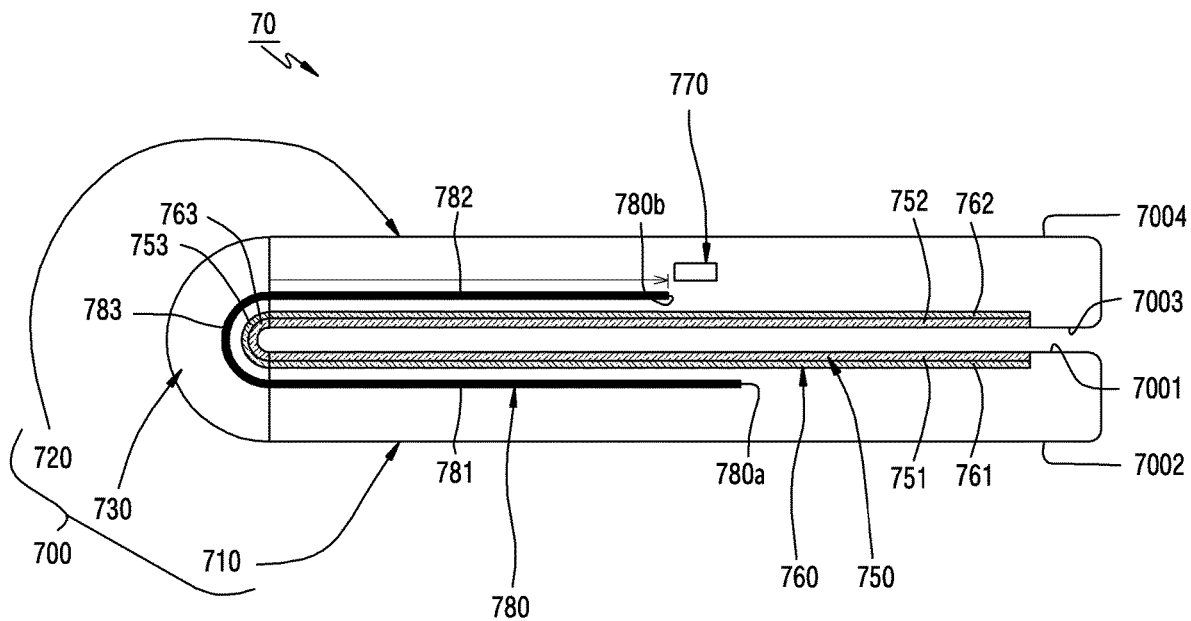
FIG. 7B is a cross-sectional view illustrating the example electronic device in the folded state according to an embodiment.

FIG. 7A is a cross-sectional view illustrating an example electronic device in the unfolded state according to an embodiment. FIG. 7B is a cross-sectional view illustrating the example electronic device in the folded state according to an embodiment.

Referring to FIGS. 7A and 7B, in an embodiment, an electronic device 70 (e.g., the electronic device 20 in FIG. 2) may include at least one of a foldable housing 700 (e.g., the foldable housing 200 in FIG. 2 or FIG. 3), a display 750 (e.g., the display 300 in FIG. 2), a digitizer 760, a magnet 770, and/or a magnetic shield member 780.

According to an embodiment, the foldable housing 700 may be substantially the same as the foldable housing 500 of FIG. 5A or 5B. For example, the foldable housing 700 may include a first housing structure 710 including a first face 7001 and a second face 7002, a second housing structure 720 including a third face 7003 and a fourth face 7004, and a hinge structure 730 connecting the first housing structure 710 and the second housing structure 720.

According to an embodiment, the display 750 may be substantially the same as the display 550 of FIG. 5A, and may include, for example, a first portion 751 forming at least a part of the first face 7001, a second portion 752 forming at least a part of the third face 7003, and a folding portion 753 between the first portion 751 and the second portion 752.

According to an embodiment, the digitizer 760 may be substantially the same as the digitizer 560 of FIG. 5A. For example, the digitizer 760 may include a third portion 761 corresponding to the first portion 751 of the display 750, a fourth portion 762 corresponding to the second portion 752 of the display 750, or a folding portion 763 corresponding to the folding portion 753 of the display 750.

According to an embodiment, the magnet 770 may be disposed inside the second housing structure 720, and may overlap the fourth portion 762 of the digitizer 760 when viewed from above the fourth face 7004. Since the magnet 770 is substantially similar to or the same as the second magnet 572 of FIG. 5A, a detailed description thereof may not be repeated here.

According to an embodiment, the magnetic shield member 780 may be disposed inside the foldable housing 700. For example, the magnetic shield member 780 may be a plate extending from one end portion 780a located in the first housing structure 710 to the other end 780b located in the second housing structure 720, and may include a material capable of blocking magnetic force, such as iron.

According to an embodiment, the magnetic shield member 780 may include a folding portion 783 fixed to the hinge structure 730, a fifth portion 781 extending from the folding portion 783 to the first housing structure 710, or a sixth portion 782 extending from the folding portion 783 to the second housing structure 720.

According to an embodiment, when the electronic device 70 is unfolded (see FIG. 7A) or folded (see FIG. 7B), due to the positional relationship between the first and second housing structures 710 and 720 and the hinge structure 730, the magnetic shield member 780 may be moved relative to the first and second housing structures 710 and 720.

When the electronic device 70 is switched from the folded state (see FIG. 7B) to the unfolded state (see FIG. 7A), the sixth portion 782 of the magnetic shield member 780 may be moved so as to overlap the magnet 770 when viewed from above the second face 7002. According to an embodiment, like the magnetic shield members 581 and 582 of FIGS. 5A and 5B, the sixth portion 782 of the magnetic shield member 780 may reduce the influence of the magnet 770 on the electronic device 70 in the state in which the electronic device 70 is unfolded.

For example, when the electronic device 70 is switched from the unfolded state to the folded state, the sixth portion 782 of the magnetic shield member 780 may be moved so as not to overlap the magnet 770 when viewed from above the fourth face 7004. In the state in which the electronic device 70 is folded, the fifth portion 781 of the magnetic shield member 780 may overlap the magnet 770 when viewed from above the second face 7002. The folded state of the electronic device 700 may be maintained by the attraction force between the magnet 770 and the fifth portion 781. In the state in which the electronic device 70 is folded, the attraction force between the magnet 770 and the fifth portion 781 of the magnetic shield member 780 may maintain the folded state against the elastic force of the display 750 (e.g., the restoring force for unfolding the folding portion 753 in the state in which the folding portion 753 is bent).

According to an embodiment, at least a part of the magnetic shield member 780 may be flexible. For example, the folding portion 783 of the magnetic shield member 780 may be arranged in a curved shape (e.g., a shape having a curvature) in the folded state (see FIG. 7B). According to an embodiment, the magnetic shield member 780 may be formed of a plate having a predetermined thickness (e.g., 5 mm or less) so as to be flexible.

According to an embodiment, the magnetic shield member 780 may be implemented to be durable so as not to be stretched or contracted by force applied thereto when the state of the electronic device 70 is switched.

According to some embodiments (not illustrated), the magnetic shield member 780 may be implemented with a first magnetic shield member 581 and a second magnetic shield member 582, which are separated from each other, as in the embodiment of FIG. 5B.

According to some embodiments (not illustrated), the fifth portion 781, extending from the folding portion 783 fixed to the hinge structure 730 of the magnetic shield member 780 to the first housing structure 710, may be omitted. The electronic device 70 may include a separate magnetic member, which is aligned with or faces the magnet 770 in the folded state (see FIG. 7B). The magnetic member may be disposed between the third portion 761 of the digitizer 660 and the second face 7002. The magnetic member may be disposed at a predetermined position of the first housing structure 710, regardless of whether the electronic device is in the folded state or the unfolded state. The folded state of the electronic device 70 may be maintained by the attraction force between the magnet 770 and the magnetic member.

Figure 8A:
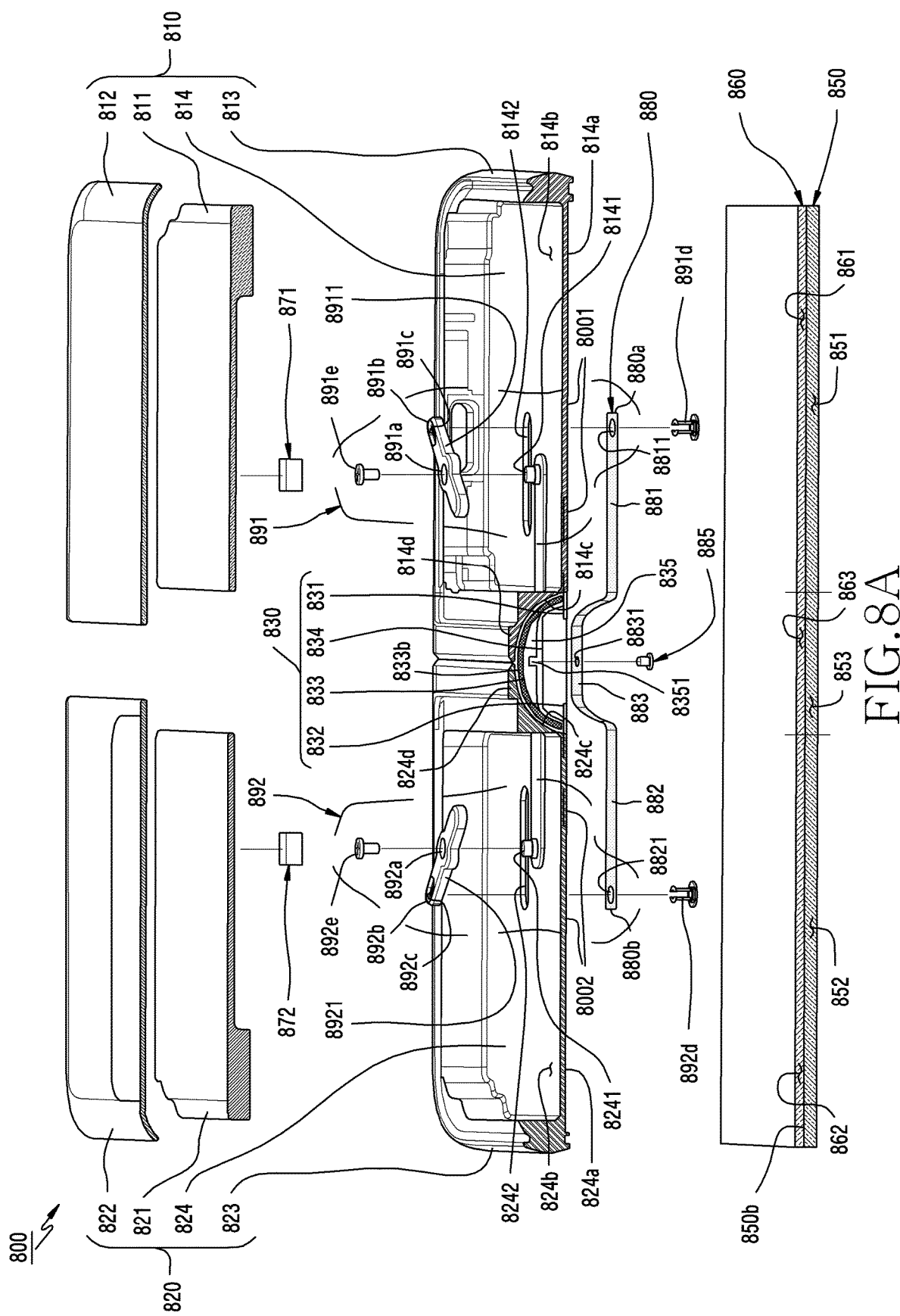
FIG. 8A is an exploded perspective view illustrating an example electronic device in the unfolded state according to an embodiment.
Figure 8B:
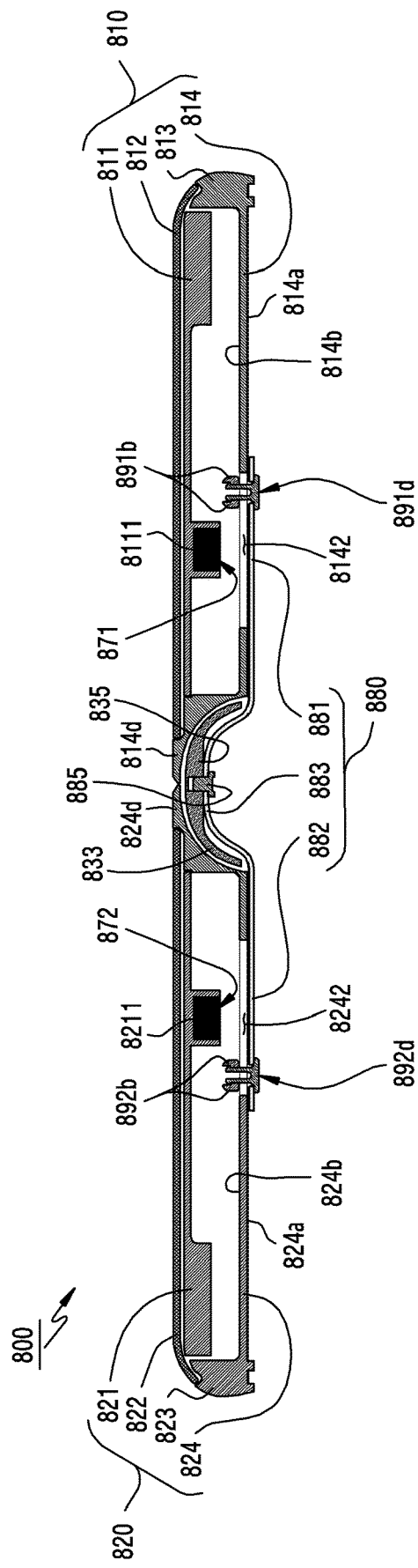
FIG. 8B is a cross-sectional view illustrating the example electronic device in the unfolded state according to an embodiment.
Figure 8C:
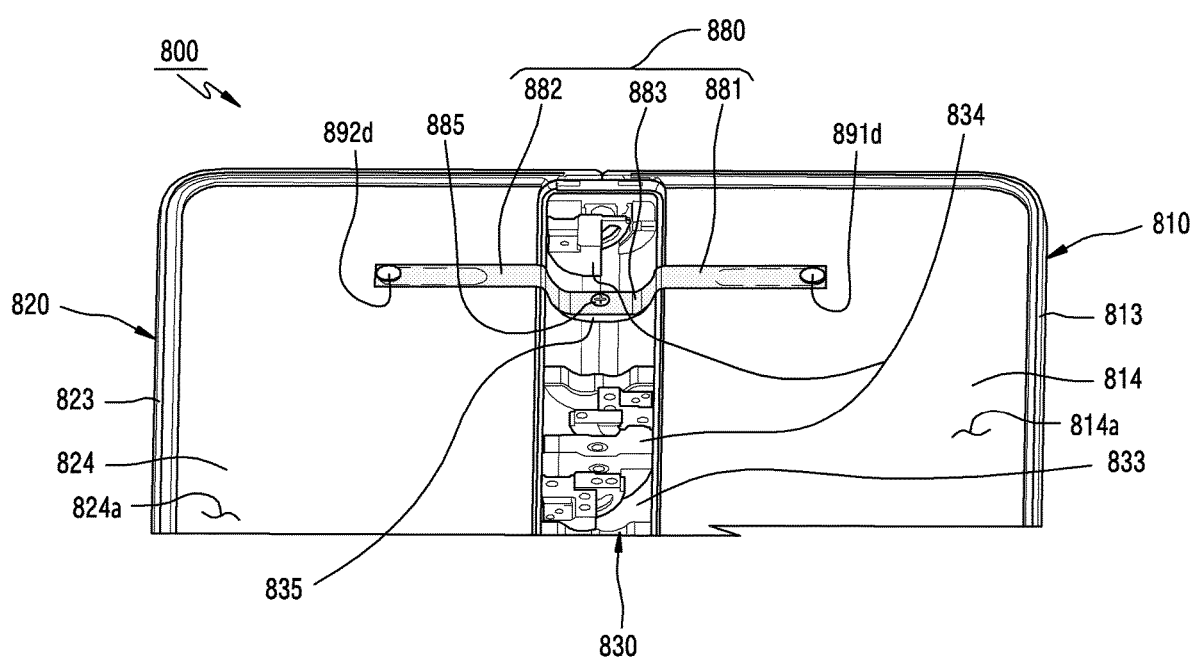
FIG. 8C is a perspective view illustrating the example electronic device according to an embodiment.
Figure 8D:
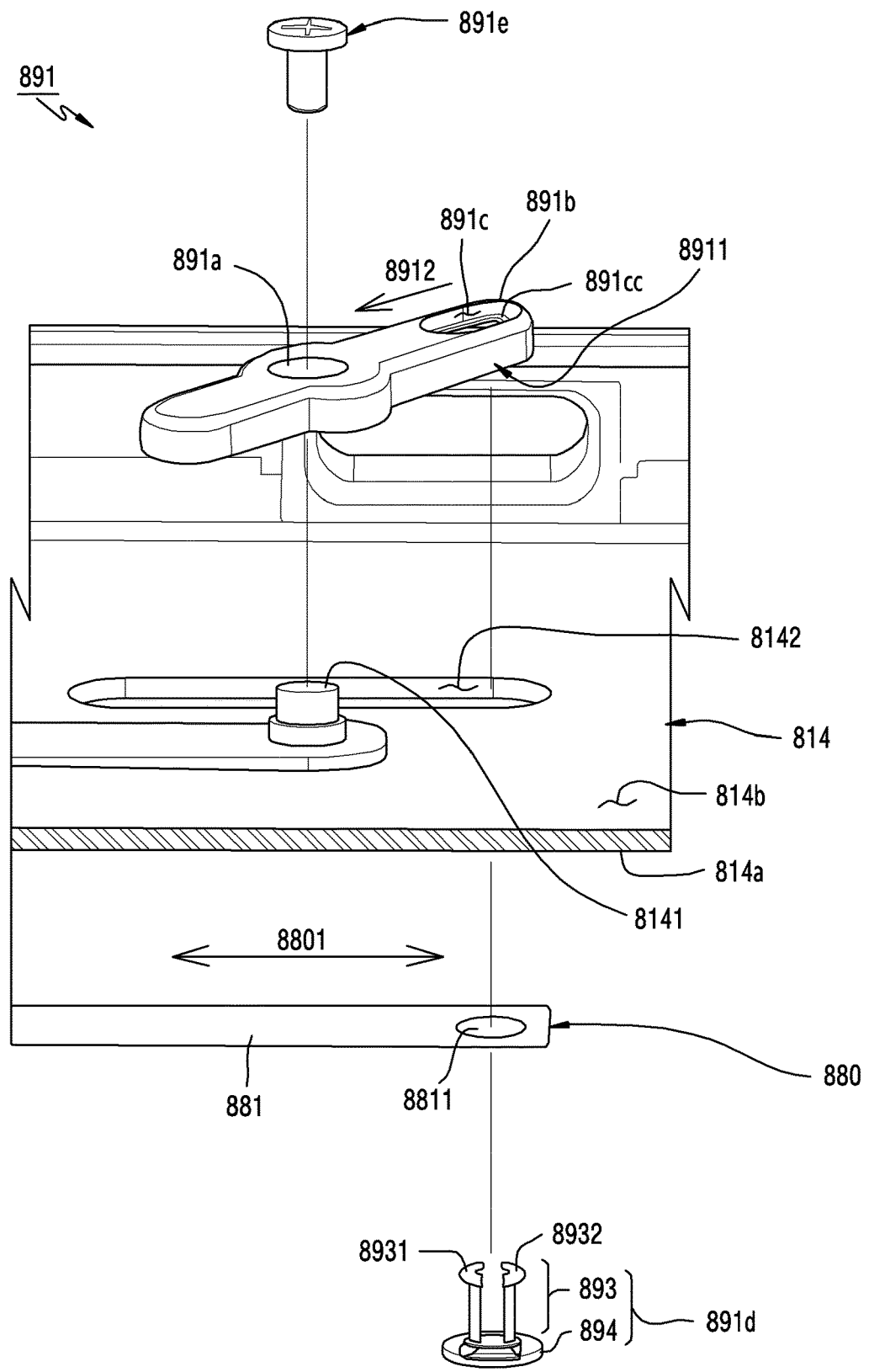
FIG. 8D is an exploded perspective view illustrating an example first guide device according to an embodiment.
Figure 8E:
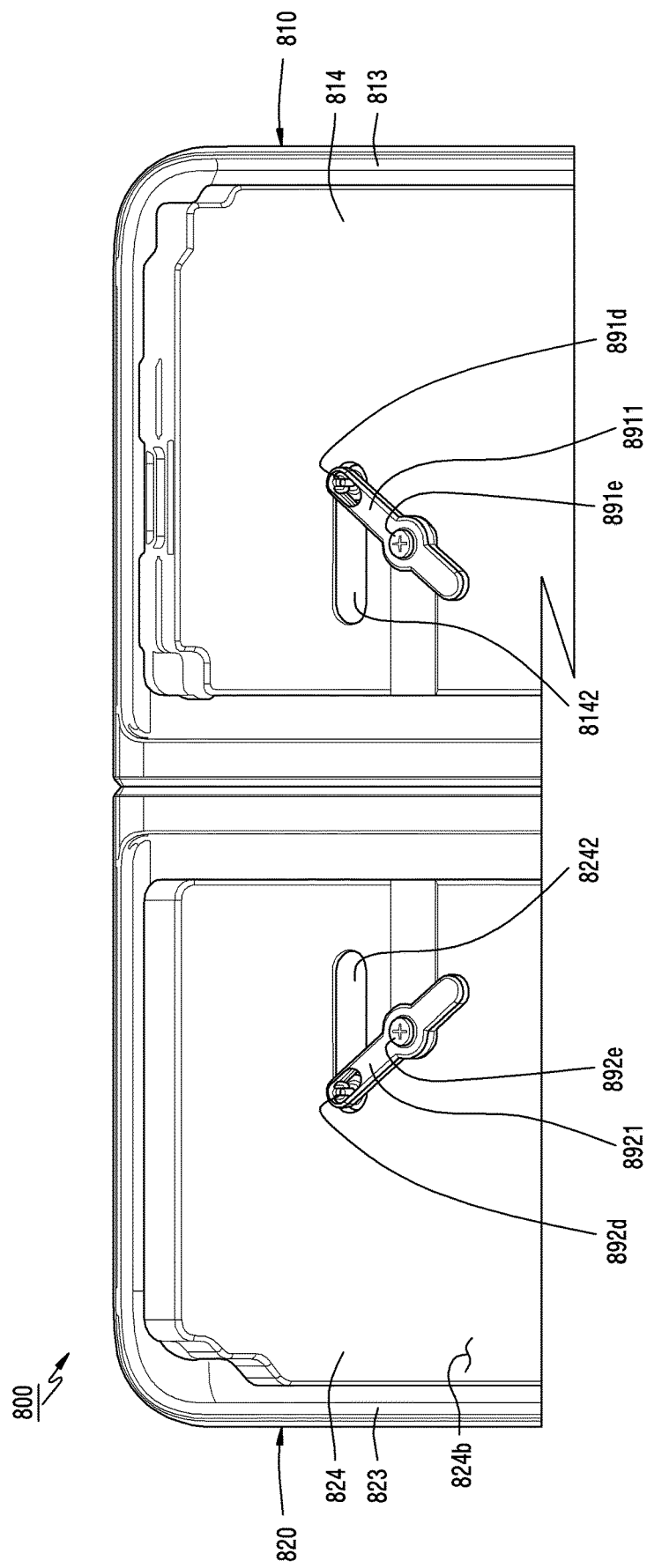
FIG. 8E is a perspective view illustrating an example electronic device according to an embodiment.

FIG. 8A is an exploded perspective view illustrating an example electronic device in the unfolded state according to an embodiment. FIG. 8B is a cross-sectional view illustrating the example electronic device in the unfolded state according to an embodiment. FIG. 8C is a perspective view illustrating the example electronic device according to an embodiment. FIG. 8D is an exploded perspective view illustrating an example first guide device according to an embodiment. FIG. 8E is a perspective view illustrating the example electronic device according to an embodiment.

Referring to FIGS. 8A, 8B, and 8C, in an embodiment, an electronic device 800 may include at least one of a first housing structure 810, a second housing structure 820, a hinge structure 830, a display 850, a digitizer 860, a first magnet 871, a second magnet 872, a magnetic shield member 880, a first guide device 891, and/or a second guide device 892. According to various embodiments, the electronic device 800 may include the electronic device 20 of FIG. 2 or the electronic device 60 of FIG. 6A. For example, the first housing structure 810 may include the first housing structure 210 of FIG. 2 or the first housing structure 610 of FIG. 6A. For example, the second housing structure 820 may include the second housing structure 220 of FIG. 2 or the second housing structure 620 of FIG. 6A. For example, the hinge structure 830 may include the hinge structure 401 of FIG. 4 or the hinge structure 630 of FIG. 6A. For example, the display 850 may include the display 300 of FIG. 2 or the display 650 of FIG. 6A. For example, the digitizer 860 may include the digitizer 660 of FIG. 6A. For example, the first magnet 871 may include the first magnet 671 of FIG. 6A. For example, the second magnet 872 may include the second magnet 672 of FIG. 6A.

According to an embodiment, the first housing structure 810 and the second housing structure 820 may be connected to the hinge structure 830 so as to be rotatable relative to each other about the hinge structure 830.

According to an embodiment, the display 850 may be coupled to the first housing structure 810 and the second housing structure 820. For example, the display 850 may include a first portion 851 (e.g., the first portion 651 of FIG. 6A) corresponding to the first housing structure 810, a second portion 852 (e.g., the second portion 652 in FIG. 6A) corresponding to the second housing structure 820, and a folding portion 853 (e.g., the folding portion 653 in FIG. 6A) corresponding to the hinge structure 830. In the unfolded state, the folding portion 853 may form the same plane as the first portion 851 and the second portion 852. In the folded state (see FIG. 3), the folding portion 853 may be disposed in the state of being bent in a curved shape, and the first portion 851 and the second portion 852 may be disposed to face each other.

According to an embodiment, the digitizer 860 may be coupled to or located adjacent to the display 850 along at least a part of the rear face 850b of the display 850. For example, the digitizer 860 may include a third portion 661 (e.g., the third portion 661 in FIG. 6A) disposed along the first portion 851 of the display 850, a fourth portion 862 (e.g., the fourth portion 662 in FIG. 6A) disposed along the second portion 852 of the display 850, and a folding portion 863 (e.g., the folding portion 663 in FIG. 6A) disposed along the folding portion 853 of the display 850.

According to an embodiment, the first housing structure 810 may include a first support member 814 (e.g., the first support member 410 in FIG. 4), a first side member 813 (e.g., the first side member 211 in FIG. 2), a first internal support member 811, or a first rear cover 812 (e.g., the first rear cover 280 in FIG. 2). The first support member 814 may include a mounting plate or a bracket so as to dispose thereon or fix thereto the first portion 851 of the display 850 and the third portion 861 of the digitizer 860 in the electronic device 800. According to various embodiments, a portion 814d of the first support member 814 may extend so as to form a part of the outer face (e.g., the rear face 200b in FIG. 2) of the electronic device 800 together with the first rear cover 812. The first internal support member 811 may include a mounting plate or a bracket so as to dispose thereon or fix thereto the first printed circuit board (e.g., the first board 451 in FIG. 4) in the electronic device 800. The first side member 813 may form the side face of the first housing structure 810. According to an embodiment, the first side member 813 may be integrally formed with the first support member 814, and may include the same material as the first support member 814.

According to an embodiment, the second housing structure 820 may include a second support member 824 (e.g., the second support member 420 in FIG. 4), a second side member 823 (e.g., the second side member 221 in FIG. 2), a second internal support member 821, or a second rear cover 822 (e.g., the second rear cover 290 in FIG. 2). The second support member 821 may include a mounting plate or a bracket so as to dispose thereon or fix thereto the second portion 852 of the display 850 and the fourth portion 862 of the digitizer 860 in the electronic device 800. According to various embodiments, a portion 824*d* of the second support member 824 may extend so as to form a part of the outer face (e.g., the rear face 200*b* in FIG. 2) of the electronic device 800 together with the second rear cover 822. The second internal support member 821 may include a mounting plate or a bracket so as to dispose thereon or fix thereto the second printed circuit board (e.g., the second board 452 in FIG. 4). The second side member 823 may form the side face of the second housing structure 820. According to an embodiment, the second side member 823 may be integrally formed with the second support member 824, and may include the same material as the second support member 824.

According to an embodiment, the hinge structure 830 may include at least one of a first hinge plate 831, a second hinge plate 832, a hinge 834, or a hinge cover 833 (e.g., the hinge cover 230 in FIG. 3). The first hinge plate 831 and the second hinge plate 832 may be rotatably connected to each other by at least one hinge 834. The first hinge plate 831 may be coupled to the first support member 814. The second hinge plate 832 may be coupled to the second support member 824. Because the first hinge plate 831 and the second hinge plate 832 are connected by the at least one hinge 834, the first housing structure 810 including the first support member 814 and the second housing structure 820 including the second support member 824 may be rotatable relative to each other about the hinge structure 830.

According to an embodiment, the display 850 and the digitizer 860 may be respectively disposed on the first support member 814 and the second support member 824, and may be unfolded or folded about the folding portions 853 and 863 depending on the angle formed by the first housing structure 810 and the second housing structure 820 about the hinge structure 830.

According to an embodiment, a portion of the first hinge plate 831 may extend between the digitizer 860 and the first support member 814, and may form a face for placing the digitizer 860 thereon (hereinafter, referred to as a first mounting face) 8001 together with the first support member 814. According to an embodiment, a portion of the second hinge plate 832 may extend between the digitizer 860 and the second support member 824, and may form a face for placing the digitizer 860 thereon (hereinafter, referred to as a second mounting face) 8002 together with the second support member 824.

According to an embodiment, the hinge cover 833 may be disposed between the first housing structure 810 and the second housing structure 820. The hinge cover 833 may be covered by a part of the first and second housing structures 810 and 820, or may be exposed to the outside depending on whether the electronic device 800 is in the unfolded state or the folded state (see FIG. 3).

According to an embodiment, the first support member 814 may include a first rotational support face 814*c* (e.g., the first rotational support face 212 in FIG. 4) facing the hinge cover 833 in the unfolded state. According to an embodiment, the second support member 824 may include a second rotational support face 824*c* (e.g., the second rotational support face 222 in FIG. 4) facing the hinge cover 833 in the unfolded state.

In an embodiment, when the electronic device 800 is in the unfolded state, the first rotational support face 814*c* and the second rotational support face 824*c* may cover the hinge cover 833, and the hinge cover 833 may not be exposed to the outside, or may be minimally exposed thereto. When the electronic device 800 is in the folded state (see FIG. 3), the hinge cover 833 may be exposed between the first rotational support face 814*c* and the second rotational support face 824*c*.

According to an embodiment, when the electronic device 800 is in the folded state, the hinge cover 833 may have a curved face 833*b*, which at least partially faces the first rotational support face 814*c* and the second rotational support face 824*c*. According to an embodiment, the first rotational support face 814*c* and/or the second rotational support face 824*c* may include a curved face (not shown) corresponding to the curved face 833*b* of the hinge cover 833. When the electronic device 800 is in the folded state (see FIG. 3), at least a portion of the curved face 833*b* may form at least a portion of one side face of the electronic device 800. According to an embodiment, when viewed in cross section, the hinge cover 833 may include a curved shape.

According to an embodiment, the first magnet 871 may be disposed between the first support member 814 and the first internal support member 811. For example, the first magnet 871 may be fixed to the first internal support member 811. In some embodiments, the first magnet 871 may be disposed between the first internal support member 811 and the first rear cover 812, and may be fixed to the first internal support member 811 or to the first rear cover 812. According to an embodiment, the first magnet 871 may overlap the third portion 861 of the digitizer 860 when viewed from above the first face 851 of the display 850.

According to various embodiments, the first magnet 871 may be disposed in a recess (or a structure including a recess) 8111 provided in the first internal support member 811. For example, the recess 8111 may provide a space into which the first magnet 871 is capable of being fitted. According to some embodiments, the first magnet 871 may be disposed inside the first internal support member 811.

According to an embodiment, the second magnet 872 may be disposed between the second support member 824 and the second internal support member 821. For example, the second magnet 872 may be fixed to the second internal support member 821. In some embodiments, the second magnet 872 may be disposed between the second internal support member 821 and the second rear cover 822, and may be fixed to the second internal support member 821 or to the second rear cover 822. According to an embodiment, the second magnet 872 may overlap the fourth portion 862 of the digitizer 860 when viewed from above the second face 852 of the display 850. For example, the second magnet 872 may include the second magnet 672 of FIG. 6A.

According to various embodiments, the second magnet 872 may be disposed in a recess (or a structure including a recess) 8211 provided in the second internal support member 821. For example, the recess 8211 may be formed in a shape into which the second magnet 872 is capable of being fitted.

According to some embodiments, the second magnet 872 may be disposed inside the second internal support member 821.

According to an embodiment, the magnetic shield member 880 (e.g., the magnetic shield member 680 in FIG. 6A) may include a material capable of blocking magnetic force. For example, the magnetic shield member 880 may include a single plate extending from one end portion 880*a*, located in the first housing structure 810 to the other end portion 880*b*, located in the second housing structure 820. According to an embodiment, the magnetic shield member 880 may include a folding portion 883 (e.g., the folding portion 683 in FIG. 6A) fixed to the hinge structure 830, a first extension 881 (e.g., the fifth portion 681 in FIG. 6A) extending from the folding portion 683 to the first housing structure 810, or a second extension 882 (e.g., the sixth portion 682 in FIG. 6A) extending from the folding portion 883 to the second housing structure 820. The first extension 881 may be disposed between the first mounting face 8001 and the third portion 861 of the digitizer 860, and the second extension 882 may be disposed between the second mounting face 8002 and the fourth portion 862 of the digitizer 860.

According to an embodiment, the folding portion 883 of the magnetic shield member 880 may be coupled to the hinge structure 830 using a bolt 885. For example, the folding portion 883 of the magnetic shield member 880 may include a through hole 8831 for bolting. The hinge structure 830 may include a structure 835 disposed in the space between the hinge cover 833 and the hinge plates 831 and 832. The structure 835 may be coupled to the hinge cover 833, and may include a hole or recess 8351 aligned with the through hole 8831 and fastened by the bolt 885. According to various embodiments, the structure 835 may be formed integrally with the hinge cover 833, and may include the same material as the hinge cover 833.

According to an embodiment, in the unfolded state, at least a part of the first extension 881 of the magnetic shield member 880 may overlap the first magnet 871 when viewed from above the display 850. In the folded state (see FIG. 6B), the first extension 881 of the magnetic shield member 880 may not overlap the first magnet 871 when viewed from above the first rear cover 812. According to an embodiment, in the unfolded state, at least a part of the second extension 882 of the magnetic shield member 880 may overlap the second magnet 872 when viewed from above the display 850. In the folded state (see FIG. 6B), the second extension 882 of the magnetic shield member 880 may not overlap the second magnet 872 when viewed from above the second rear cover 822.

According to an embodiment, when switching is performed between the unfolded state and the folded state (see FIG. 6B), due to the positional relationship between the first and second housing structures 810 and 820 and the hinge structure 830, the magnetic shield member 880 may be moved relative to the first and second housing structures 810 and 820. According to an embodiment, when the unfolded state is switched into the folded state, the first extension 881 of the magnetic shield member 880 may be moved so as not to overlap the first magnet 871 when viewed from above the first rear cover 812, and the second extension 882 of the magnetic shield member 880 may be moved so as not to overlap the second magnet 872 when viewed from above the second rear cover 822. According to an embodiment, when the folded state is switched into the unfolded state, the first extension 881 of the magnetic shield member 880 may be moved so as to overlap the first magnet 871 when viewed from above the display 850, and the second extension 882 of the magnetic shield member 880 may be moved so as to overlap the second magnet 872 when viewed from above the display 850.

Referring to FIGS. 8A, 8B, 8C, and 8D, in an embodiment, the first guide device 891 may be configured to guide the movement of the first extension 881 of the magnetic shield member 880 when switching is performed between the unfolded state and the folded state (see FIG. 6B) while causing the first extension 881 to be disposed so as to face the first mounting face 8001. The first support member 814 may include a first face 814*a* that faces the digitizer 860 and a second face 814*b* that faces away from the first face 814*a*. According to an embodiment, the first guide device 891 may include a first link 8911 disposed between the first support member 814 and the first internal support member 811. The first link 8911 may include a first joint 891*a* rotatably coupled to the second face 814*b* of the first support member 814. The first joint 891*a* may include a through hole, and the first support member 814 may include a shaft 8141 disposed on the second face 814*b* and inserted into the through hole. The first guide device 891 may include a bolt 891*e* coupled to the shaft 8141, and the bolt 891*e* may prevent and/or avoid the first joint 891*a* from being released from the shaft 8141.

According to an embodiment, the first link 8911 may include a second joint 891*a* rotatably connected to the first extension 881 of the magnetic shield member 880 using a pin 891*d*. The first support member 814 may include a slit 8142 passing through the space between the first face 814*a* and the second face 814*b*. The first extension 881 of the magnetic shield member 880 may include a through hole 8811. The pin 891*d* may include a head 894 and an extension 893 connected to the head 894. Through a method in which the extension 893 of the pin 891*d* passes through the through hole 8811 in the magnetic shield member 880 and the slit 8142 in the first support member 814 and is then fastened to the second joint 891*b* of the first link 8911, the first extension 881 of the magnetic shield member 880 may be connected to the second joint 891*b* of the first link 8911. According to an embodiment, the extension 833 of the pin 891*d* is a bifurcated structure, and the end portions 8931 and 8932 thereof may be elastically coupled to the second joint 891*b*. For example, the second joint 891*b* may include a through hole 891*c* including a ridge (or a stepped ridge) 891*cc*, and the end portions 8931 and 8932 formed on the extension 833 of the pin 891*d* may act like a hook to be fastened to the ridge 891*cc* (e.g., snap-fit fastening). The head 894 of the pin 891*d* is formed to have a width wider than the diameter of the through hole 8811 formed in the first extension 881 of the magnetic shield member 880, and the first extension 881 of the magnetic shield member 880 may be disposed to face the first face 814*a* of the first support member 814.

According to an embodiment, the through hole 891*c* formed in the second joint 891*b* may be a slit extending in the direction 8912 toward the first joint 891*a*. According to an embodiment, the slit 8142 formed in the first support member 814 may have a length (not illustrated) extending in a direction 8801 in which the first extension 881 of the magnetic shield member 880 is moved when switching is performed between the unfolded state and the folded state (see FIG. 6B). When switching is performed between the unfolded and folded states (see FIG. 6B), the first link 8911 is rotatable about the shaft 8141, and the pin 891*d* connected to the first extension 881 of the first magnetic shield member 880 may be shifted in position not only in the through hole 891*c* in the second joint 891*b*, but also in the slit 8142 formed in the first support member 814.

According to various embodiments (not illustrated), the slit 8142 formed in the first support member 814 may be formed in the shape of an arc having a corresponding angle with respect to the shaft 8141 when viewed from above the first hinge cover 812. In this case, the through hole in the second joint 891b may be formed in a shape that does not allow positional movement of the pin 891d. When switching is performed between the unfolded and folded states (see FIG. 6B), the pin 891d, connected to the first extension 881 of the magnetic shield member 880, may be shifted in position in the arc-shaped slit formed in the first support member 814 while maintaining a predetermined distance relative to the first joint 891a.

Referring to FIGS. 8A, 8B, 8C, and 8E, in an embodiment, the second support member 824 may include a third face 824a that faces the digitizer 860 and a fourth face 824b that faces away from the third face 824a. According to an embodiment, the second guide device 892 may be configured to guide the movement of the second extension 882 of the magnetic shield member 880 when switching is performed between the unfolded state and the folded state (see FIG. 6B) while causing the second extension 882 to be disposed so as to face the third face 824a. The second guide device 892 may have substantially the same structure as the first guide device 891, and a detailed description thereof may not be repeated here. For example, the second guide device 892 may include a second link 8921 connected to the second support member 824 and the magnetic shield member 880. For example, the second link 8921 may include a third joint 892a (e.g., the first joint 891a) rotatably coupled to a shaft 8241 (e.g., the shaft 8141) disposed on the fourth face 824b of the support member 824. For example, the first guide device 892 may include a bolt 892e (e.g., the bolt 891e) coupled to the shaft 8241, and the bolt 892e may prevent and/or avoid the third joint 892a from being released from the shaft 8241. For example, the second link 8921 may include a fourth joint 892b (e.g., the second joint 891b) including a slit 892c (e.g., the through hole 891c). The fourth joint 892b may be connected to a through hole 8821 formed in the second extension 882 of the magnetic shield member 880 via a pin 892d (e.g., the pin 891d) passing through a slit 8242 (e.g., the slit 8142) formed in the second support member 824.

According to various embodiments (not illustrated), there may be provided a plurality of structures, each including the magnetic shield member 880, the first guide device 891, the second guide device 892, the first magnet 871, and the second magnet 872.

According to various embodiments, at least a part of the magnetic shield member 880 may be flexible. For example, the folding portion 883 of the magnetic shield member 880 may be arranged in a curved shape (e.g., a shape having a curvature) in the folded state (see FIG. 6B). According to an embodiment, the magnetic shield member 880 may be formed of a plate having a predetermined thickness (e.g., 5 mm or less) so as to be flexible. According to various embodiments, the magnetic shield member 880 may be implemented to be durable so as not to be stretched or contracted by force applied thereto for movement when switching is performed between the folded state and the unfolded state.

According to an embodiment, in the folded state (see FIG. 6B), the first magnet 871 and the second magnet 872 may be disposed to be aligned with or to face each other. In the folded state, the first portion 851 and the second portion 852 of the display 850 and the third portion 861 and the fourth portion 862 of the digitizer 860 may be disposed between the first magnet 871 and the second magnet 872. According to an embodiment, the folded state of the electronic device 800 may be maintained by the attraction force between the first magnet 871 and the second magnet 872.

According to an embodiment, like the magnetic shield members 681 and 682 of FIGS. 6A and 6B, the magnetic shield member 880 may reduce the influence of the first magnet 871 and the second magnet 872 on the electronic device 800 in the unfolded state (see FIG. 6A). For example, when input is made using an electronic pen (e.g., the electronic pen 460 in FIG. 2) that utilizes a magnetic field in the unfolded state, the first magnetic shield member 881 may reduce the influence of the magnetic field from the first magnet 871 on the interaction between the electronic pen and the digitizer 860. For example, when input is made using an electronic pen that utilizes a magnetic field in the unfolded state, the second magnetic shield member 882 may reduce the influence of the magnetic field from the second magnet 872 on the interaction between the electronic pen and the digitizer 860.

Figure 9A:
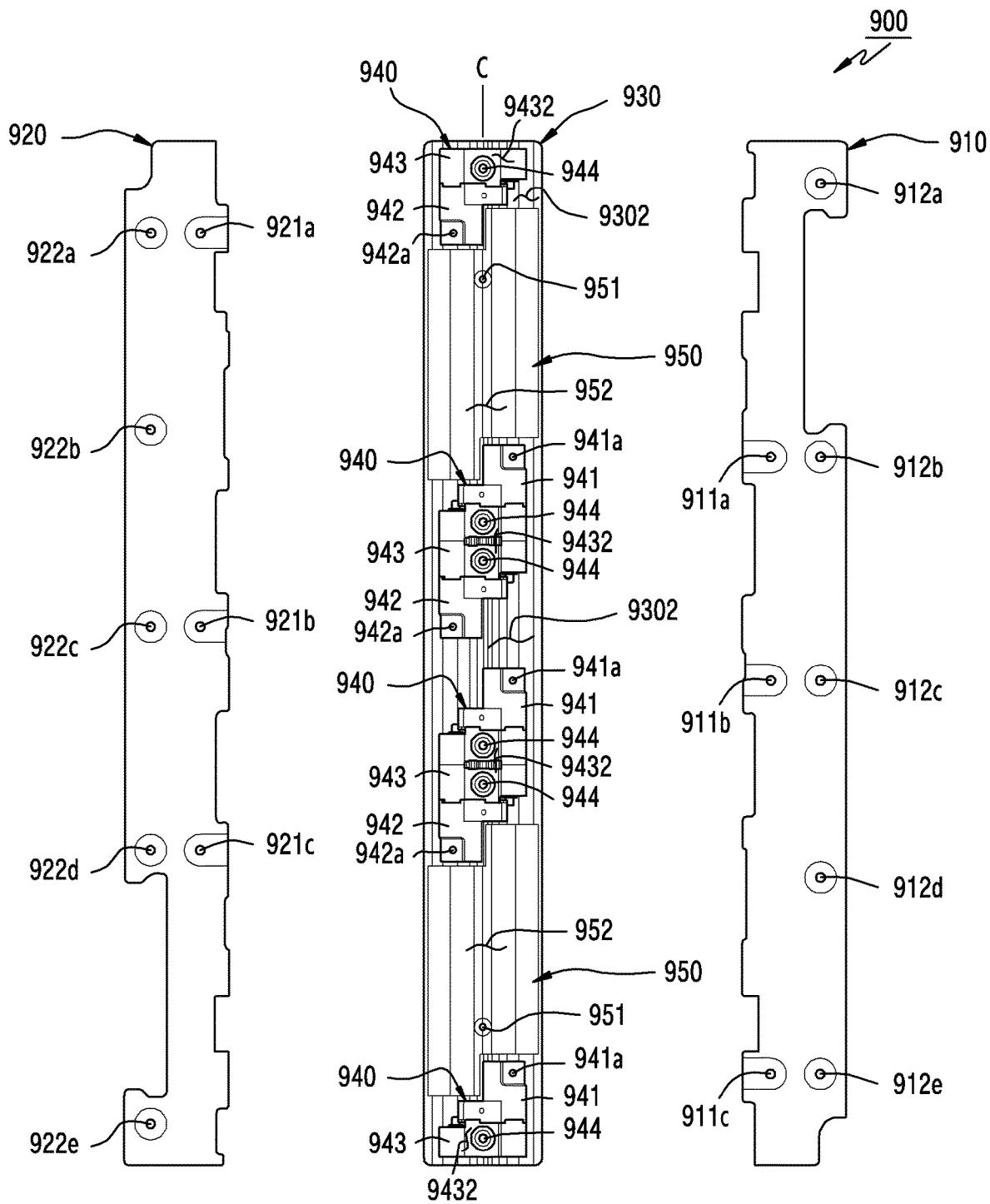
FIG. 9A is an exploded perspective view illustrating an example hinge structure according to an embodiment.
Figure 9B:
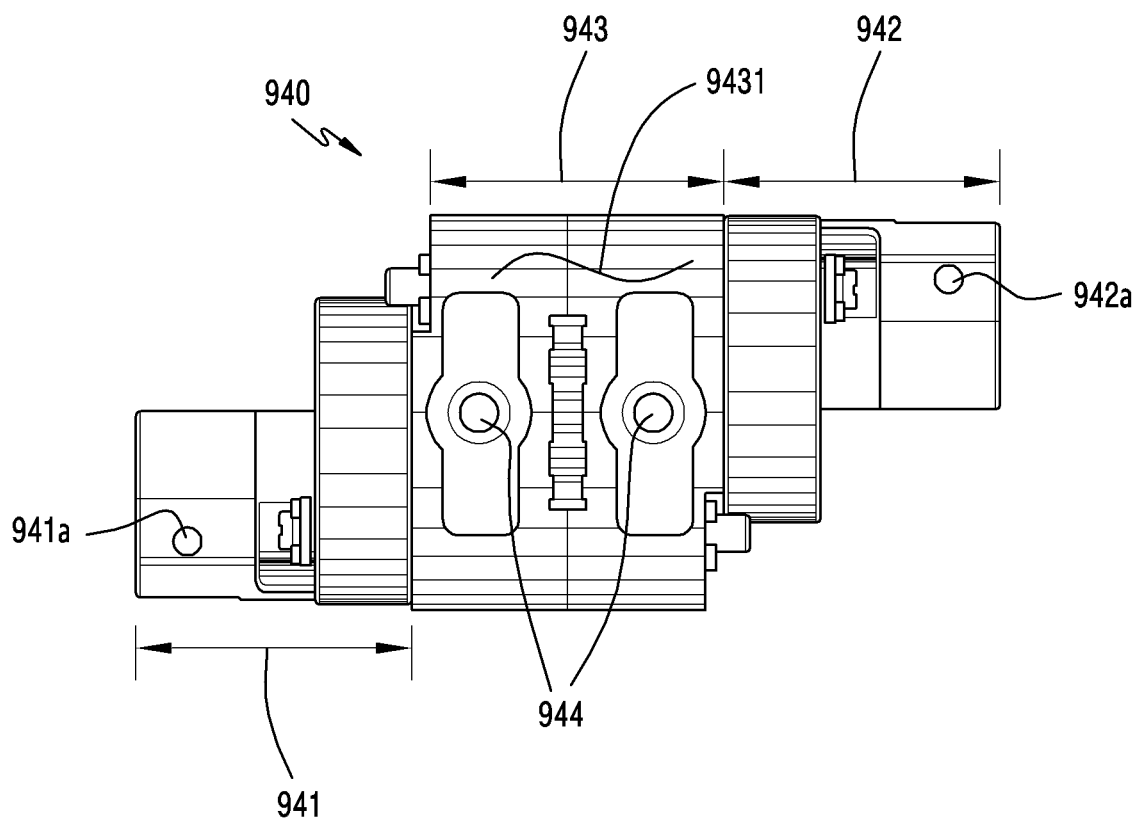
FIG. 9B is a rear view illustrating the example hinge structure according to the embodiment.

FIG. 9A is an exploded perspective view illustrating an example hinge structure according to an embodiment. FIG. 9B is a rear view illustrating the example hinge structure according to an embodiment.

Referring to FIG. 9A, in an embodiment, a hinge structure 900 (e.g., the hinge structure 401 in FIG. 4, the hinge structure 530 in FIG. 5B, the hinge structure 630 in FIG. 6B, the hinge structure 730 in FIG. 7B, or the hinge structure 830 in FIG. 8A) may include a first hinge plate 910 (e.g., the first hinge plate 831 in FIG. 8A), a second hinge plate 920 (e.g., the second hinge plate 832 in FIG. 8A), a hinge cover 930 (e.g., a hinge cover 833 in FIG. 8A), or a hinge 940 (e.g., the hinge 834 in FIG. 8C).

According to an embodiment, the first hinge plate 910 and the second hinge plate 920 may be rotatably connected to each other using at least one hinge 940. Referring to FIGS. 9A and 9B, in an embodiment, the hinge 940 may include a third portion 943 and a first portion 941, rotatably connected to the third portion 943 and coupled to the first hinge plate 910. The hinge 940 may include a second portion 942 rotatably connected to the third portion 943 and coupled to the second hinge plate 920. The first hinge plate 910 coupled with the first portion 941 may be rotatable about the third portion 943 relative to the second hinge plate 920 coupled with the second portion 942.

According to an embodiment, the first portion 941 and the first hinge plate 910 of the hinge 940 and/or the second portion 942 and the second hinge plate 920 of the hinge 940 are coupled using a bolt (not illustrated). For example, the first hinge plate 910 may include a plurality of holes 911a, 911b, and 911c formed so as to be parallel to a rotation center axis C between the first hinge plate 910 and the second hinge plate 920. The first portion 941 of the hinge 940 may include a hole 941a aligned with and fastened to the holes 911a, 911b, and 911c in the first hinge plate 910 by a bolt. For example, the second hinge plate 920 may include a plurality of holes 921a, 921b, and 921c formed so as to be parallel to a rotation center axis C. The second portion 942 of the hinge 940 may include a hole 942a aligned with the holes 921a, 921b, and 921c in the second hinge plate 920 and fastened to the holes 921a, 921b, and 921c by a bolt.

According to an embodiment, the first hinge plate 910 may include holes 912a, 912b, 912c, 912d, and 912e used for coupling the first hinge plate 910 with the first support member (e.g., the first support member 814 of FIG. 8A) with bolts. According to an embodiment, the second hinge plate 920 may include holes 922a, 922b, 922c, 922d, and 922e used for coupling the second hinge plate 910 with the second support member (e.g., the second support member 824 of FIG. 8A) with bolts.

According to an embodiment, when the first hinge plate 910 coupled with the first portion 941 and the second hinge plate 920 coupled with the second portion 942 are switched from a first state (e.g., the unfolded state), in which the first hinge plate 910 and the second hinge plate 920 form an angle of about 180 degrees therebetween, into a state in which the first hinge plate 910 and the second hinge plate 920 form an angle smaller than a predetermined angle (e.g., about 90 degrees), the first hinge plate 910 and the second hinge plate 920 may be automatically switched into a second state (e.g., the folded state), in which the first hinge plate 910 and the second hinge plate 920 form therebetween an angle ranging from about 0 degrees to 10 degrees without any external force. When the first hinge plate 910 coupled with the first portion 941 and the second hinge plate 920 coupled with the second portion 942 are switched into a state in which the first hinge plate 910 and the second hinge plate 920 form therebetween an angle larger than the predetermined angle (e.g., about 90 degrees) from the first state (e.g., the unfolded state) and then the external force applied thereto is released, the first hinge plate 910 and the second hinge plate 920 may be automatically returned to the first state.

According to an embodiment, when the first hinge plate 910 coupled with the first portion 941 of the hinge 940 and the second hinge plate 920 coupled with the second portion 942 of the hinge 940 are switched from the second state (e.g., the folded state), in which the first hinge plate 910 and the second hinge plate 920 form therebetween an angle ranging from about 0 degrees to 10 degrees, into the state in which the first hinge plate 910 and the second hinge plate 920 form an angle larger that the predetermined angle (e.g., about 90 degrees), the first hinge plate 910 and the second hinge plate 920 may be automatically switched into the first state (e.g., the unfolded state), in which the first hinge plate 910 and the second hinge plate 920 form an angle of about 180 degrees therebetween, without any external force. When the first hinge plate 910 coupled with the first portion 941 of the hinge 940 and the second hinge plate 920 coupled with the second portion 942 of the hinge 940 are switched into the state in which the first hinge plate 910 and the second hinge plate 920 form the second state (e.g., the folded state) and then the external force applied thereto is released, the first hinge plate 910 and the second hinge plate 920 may be automatically returned to the second state.

According to an embodiment, the hinge 940 may include an elastic structure (not illustrated) that enables the first portion 941 and/or the second portion 942 to be elastically rotated relative to the third portion 943. The elastic structure may enable automatic switching into the first state (e.g., the unfolded state) or the second state (e.g., the folded state) or automatic return to the first state or the second state.

According to an embodiment, the third portion 943 of the hinge 940 may include a first face 9431 facing the inner curved face 9302 of the hinge cover 930 and a second face 9432 disposed on the side opposite the first face 9431. According to an embodiment, the first face 9431 may include a curved face corresponding to the inner curved surface 9302 of the hinge cover 930, and the second surface 9432 may include a flat face.

According to an embodiment, the third portion 943 of the hinge 940 may be coupled with the hinge cover 930. For example, the third portion 943 may include at least one hole 944 formed between the first face 9431 and the second face 9432. The hinge cover 930 may include a hole or recess (not illustrated) that is aligned with at least one hole 944 in the third portion 943 and is fastened to the at least one hole 944 by a bolt.

According to an embodiment, the hinge structure 900 may include at least one structure 950 (e.g., the structure 835 in FIG. 8A) disposed on the inner curved face 9302 of the hinge cover 930. For example, the structure 950 may include a third face (not illustrated) disposed to face the inner curved face 9302 of the hinge cover 930 and a fourth face 952 disposed on the side opposite the third face. The third face may include a curved face corresponding to the inner curved face 9302 of the hinge cover 930. The fourth face 952 and the second face 9432 of the hinge 940 may face substantially the same direction.

According to an embodiment, the structure 950 may be coupled with the hinge cover 930 through a means such as bolting or bonding.

According to an embodiment, the structure 950 may be coupled with a magnetic shield member (e.g., the magnetic shield member 880 in FIG. 8A). For example, the structure 950 may include a recess (or a hole) 951 formed in the fourth face 952, and the magnetic shield member may be coupled to the recess 951 using a bolt. According to some embodiments, the magnetic shield member may be fixed to the hinge cover 930, the first hinge plate 910, the second hinge plate 920, or the hinge 940 included in the hinge structure 900.

Figure 10A:
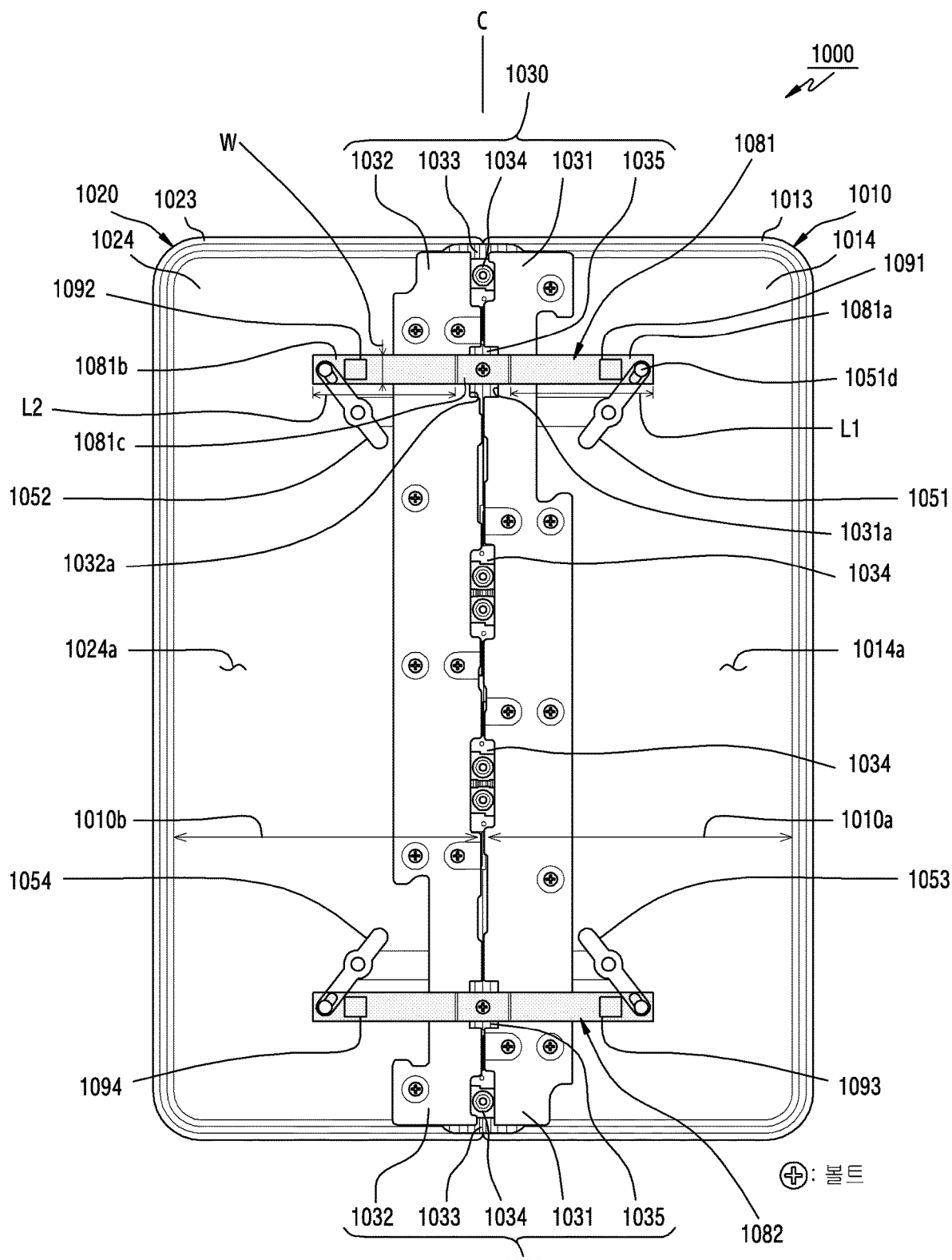
FIG. 10A is a diagram illustrating an example electronic device including magnets and magnetic shield members in the unfolded state according to an embodiment.
Figure 10B:
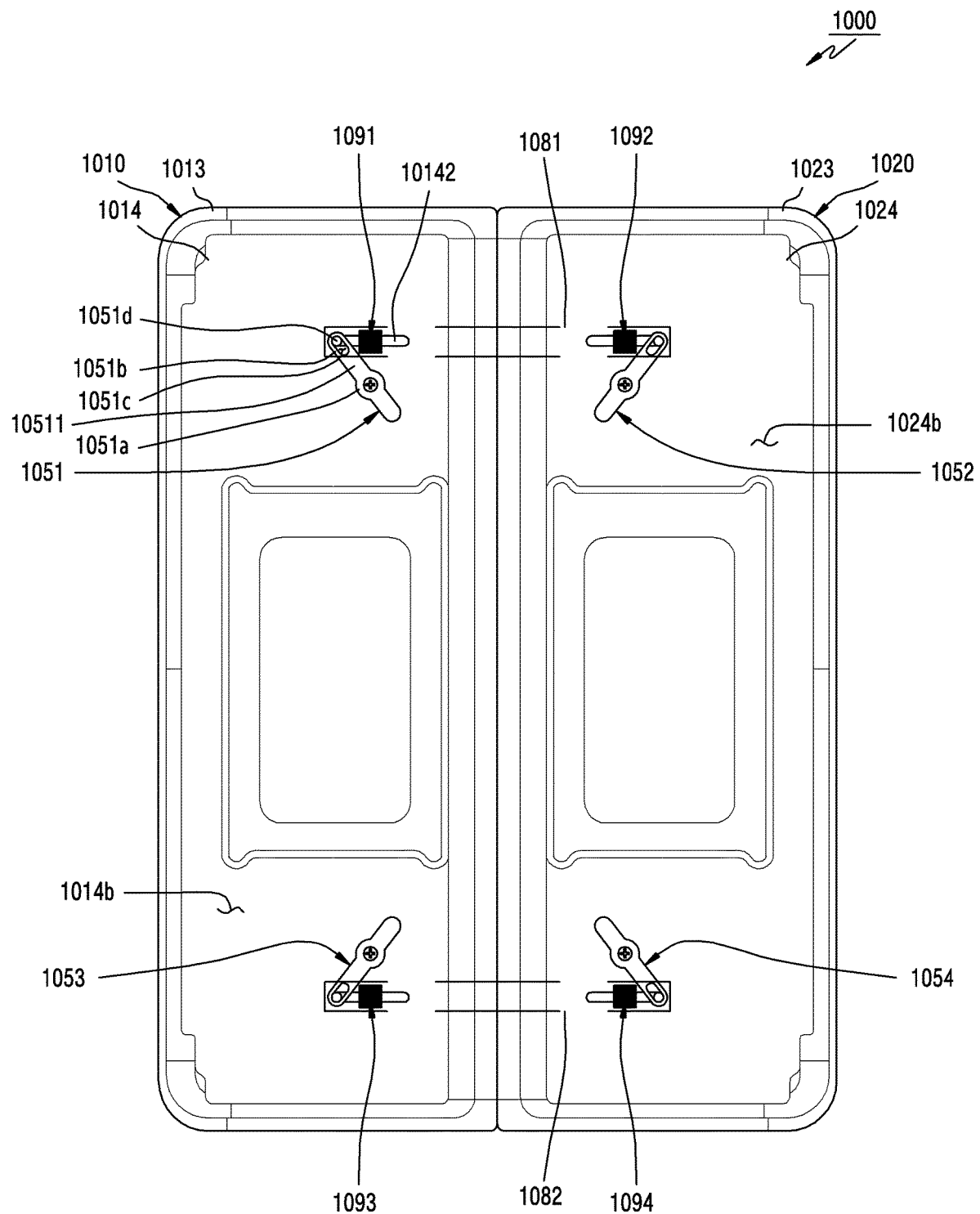
FIG. 10B is a diagram illustrating the example electronic device including magnets and magnetic shield members in the unfolded state according to an embodiment.
Figure 10C:
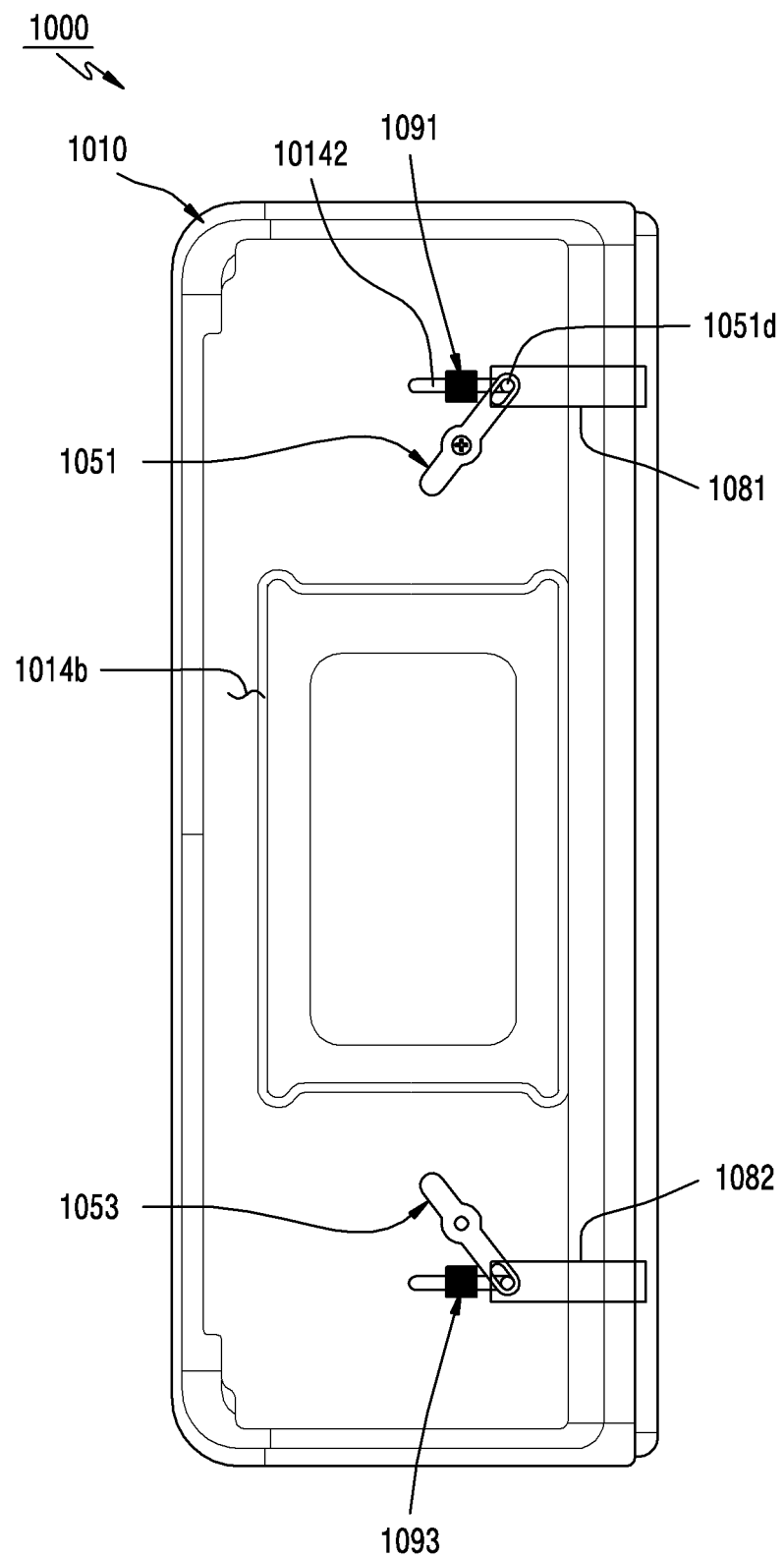
FIG. 10C is a diagram illustrating the example electronic device including the magnets and the magnetic shield members in the folded state according to an embodiment.
Figure 10D:
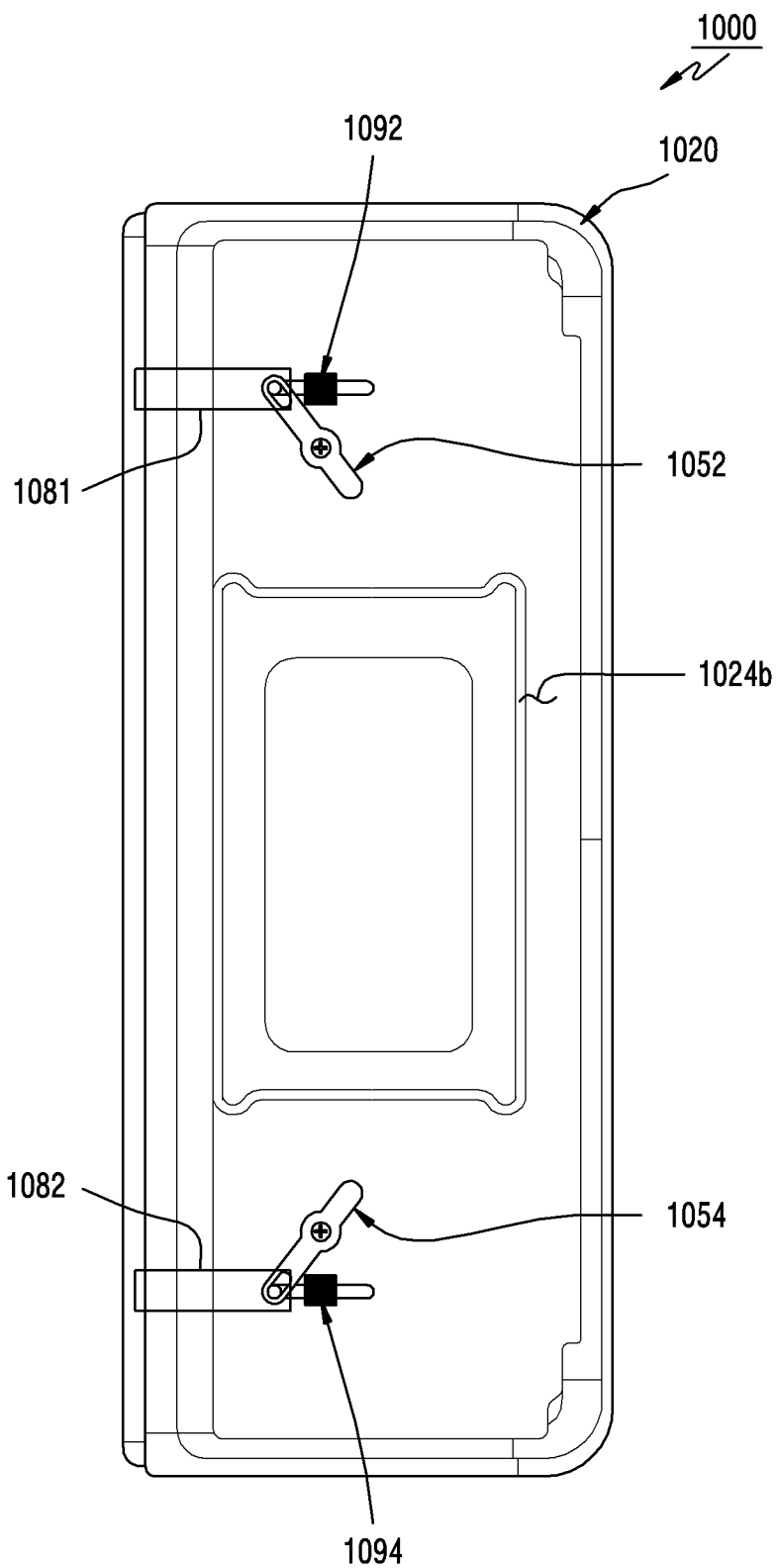
FIG. 10D is a diagram illustrating the example electronic device including the magnets and the magnetic shield members in the folded state according to an embodiment.

FIG. 10A is a diagram illustrating an example electronic device including magnets and magnetic shield members in the unfolded state according to an embodiment, and FIG. 10B is a diagram illustrating the example electronic device including magnets and magnetic shield members in the unfolded state according to an embodiment. FIG. 10C is a diagram illustrating the example electronic device including the magnets and the magnetic shield members in the folded state according to the embodiment, and FIG. 10D is a diagram illustrating the example electronic device including the magnets and the magnetic shield members in the folded state according to an embodiment.

Referring to FIGS. 10A and 10B, in an embodiment, an electronic device 1000 (e.g., the electronic device 20 in FIG. 2, the electronic device 60 in FIG. 6A, or the electronic device 800 in FIG. 8A) may include at least one of a first housing structure 1010, a second housing structure 1020, a hinge structure 1030, a first magnetic shield member 1081, a second magnetic shield member 1082, a first guide device 1051, a second guide device 1052, a third guide device 1053, a fourth guide device 1054, a first magnet 1091, a second magnet 1092, a third magnet 1093, and/or a fourth magnet 1094.

According to an embodiment, the first housing structure 1010 (e.g., the first housing structure 610 in FIG. 6A or the first housing structure 810 in FIG. 8A) may include a first side member 1013 (e.g., the first side member 211 in FIG. 2 or the first side member 813 in FIG. 8A) and a first support member 1014 (e.g., the first support member 814 in FIG. 8A) at least partially surrounded by the first side member 1013. According to an embodiment, the first support member 1014 may include a plate including a first face 1014*a* (e.g., the first face 814*a* in FIG. 8A) and a second face 1014*b* (e.g., the second face 814*b* in FIG. 8A), which face opposite directions.

According to an embodiment, the second housing structure 1020 (e.g., the second housing structure 620 in FIG. 6A or the second housing structure 820 in FIG. 8A) may include a second side member 1023 (e.g., the second side member 221 in FIG. 2 or the second side member 823 in FIG. 8A) and a second support member 1024 (e.g., the second support member 824 in FIG. 8A) at least partially surrounded by the second side member 1023. According to an embodiment, the second support member 1024 may include a plate including a third face 1024a (e.g., the third face 824a in FIG. 8A) and a fourth face 1024b (e.g., the fourth face 824b in FIG. 8A), which face opposite directions.

According to an embodiment, the hinge structure 1030 may connect the first housing structure 1010 and the second housing structure 1020, and the first housing structure 1010 and the second housing structure 1020 are rotatable relative to each other about the hinge structure 1030. In the folded state (see FIG. 3), the first face 1014a of the first support member 1014 and the third face 1024a of the second support member 1024 may be disposed to face each other.

According to an embodiment, the hinge structure 1030 (e.g., the hinge structure 900 in FIG. 9A) may include at least one of a first hinge plate 1031 (e.g., the first hinge plate 831 in FIG. 8A or the first hinge plate 910 in FIG. 9A), a second hinge plate 1032 (e.g., the second hinge plate 832 in FIG. 8A or the second hinge plate 920 in FIG. 9A), a hinge cover 1033 (e.g., the hinge cover 833 in FIG. 8A or a hinge cover 930 in FIG. 9A), a hinge 1034 (e.g., the at least one hinge 834 in FIG. 8C or the at least one hinge 940 in FIG. 9A), or a structure 1035 (e.g., the structure 835 in FIG. 8A or 8B or the at least one structure 950 in FIG. 9A).

According to an embodiment, the first hinge plate 1031 may be coupled with the first support member 1014 using a bolt so as to face the first face 1014a of the first support member 1014. The second hinge plate 1032 may be coupled with the second support member 1024 using a bolt so as to face the third face 1024a of the second support member 1024. According to various embodiments, the first hinge plate 1031 or the second hinge plate 1032 may be coupled with the support member using various other means such as bonding.

According to an embodiment, the first hinge plate 1031 and the second hinge plate 1032 may be rotatably connected to each other using at least one hinge 1034. Due to the first hinge plate 1031 and the second hinge plate 1032 connected by the at least one hinge 1034, the first housing structure 1010 including the first support member 1014 and the second housing structure 1020 including the second support member 1024 may be rotatable about the hinge structure 1030 relative to each other.

According to an embodiment, a first mounting face 1010a (e.g., the first mounting face 8001 in FIG. 8A), formed by coupling the first hinge plate 1031 and the first support member 1014, and a second mounting face 1010b (e.g., the second mounting face 8002 in FIG. 8A), formed by coupling the second hinge plate 1032 and the second support member 1024, may be utilized as an area in which a display (e.g., the display 650 in FIG. 6A or the display 850 in FIG. 8A) and a digitizer (e.g., the digitizer 660 in FIG. 6A or the digitizer 860 in FIG. 8A) is disposed.

According to an embodiment, at least one structure 1035 (e.g., the structure 835 in FIG. 8A or the structure 950 in FIG. 9A) may be disposed in a space defined by a hinge cover 1033, a first hinge plate 1031, and a second hinge plate 1032.

According to an embodiment, the first magnetic shield member 1081 (e.g., the magnetic shield member 680 in FIG. 6A) may extend from the first face 1014a of the first support member 1014 to the third face 1024a of the second support member 1024. The first magnetic shield member 1081 is a plate disposed to face the first face 1014a and the third face 1024a, and may include a material capable of blocking magnetic force.

According to an embodiment, the first magnetic shield member 1081 may include a plate formed of a material capable of blocking magnetic force and a layer formed by coating the plate with a material such as epoxy. The layer is capable of preventing and/or reducing oxidation of the plate. For example, the pattern layer may be formed through epoxy molding.

According to an embodiment, the first magnetic shield member 1081 may include a folding portion 1081c (e.g., the folding portion 683 in FIG. 6A or the folding portion 883 in FIG. 8A) fixed to the hinge structure 1030, a first extension 1081a (e.g., the fifth portion 681 in FIG. 6A or the first extension 881 in FIG. 8A) extending from the folding portion 1081c to the first housing structure 1010, or a second extension 1081b (e.g., the sixth portion 682 in FIG. 6A or the second extension 882 in FIG. 8A) extending from the folding portion 1081c to the second housing structure 1020. For example, the first extension 1081a or the second extension 1081b extends in a direction orthogonal to the rotation center axis C between the first housing structure 1010 and the second housing structure 1020.

According to various embodiments, a first length L1 of the first extension 1081a extending from the folding portion 1081c may be substantially the same as a second length L2 of the second extension 1081b extending from the folding portion 1081c. According to some embodiments, the first length L1 and the second length L2 may be different from each other.

According to an embodiment, the first magnetic shield member 1081 may be formed to have a predetermined width W (e.g., a width extending along the rotation center axis C). According to various embodiments, the folding portion 1081c may have a width different from that of the first extension 1081a or the second extension 1081b. For example, the folding portion 1081c may have a width larger than that of the first extension 1081a or the second extension 1081b, whereby damage to the folding portion 1081c may be suppressed.

According to an embodiment, the first magnetic shield member 1081 may have a predetermined thickness. According to various embodiments, the folding portion 1081c may have a thickness different from that of the first extension 1081a or the second extension 1081b. For example, the folding portion 1081c may have a thickness larger than that of the first extension 1081a or the second extension 1081b, whereby damage to the folding portion 1081c may be suppressed.

According to an embodiment, the folding portion 1081c of the first magnetic shield member 1081 may be fixed to the structure 1035 of the hinge structure 1030 using a bolt (e.g., the bolt 885 in FIG. 8A). According to an embodiment, a portion of the structure 1035 may be exposed through a space between the first hinge plate 1031 and the second hinge plate 1032, and the folding portion 1081c of the first magnetic shield member 1081 may be fixed to the exposed portion. For example, the first hinge plate 1031 may include a first cut notch 1031a, and the second hinge plate 1032 may include a second cut notch 1032a. One face of the structure 1035 (e.g., the fourth face 952 in FIG. 9A) may be exposed through the first notch 1031a and/or the second notch 1032a.

According to an embodiment, when switching is performed between the unfolded state (see FIGS. 10A and 10B) and the folded state (see FIGS. 10C and 10D), due to the positional relationship between the first and second housing structures 1010 and 1020 and the hinge structure 1030, the first extension 1081*a* of the first magnetic shield member 1081 may be moved relative to the first housing structure 1010, and the second extension 1081*b* of the first magnetic shield member 1081 may be moved relative to the second housing structure 1020. For example, the first extension 1081*a* or the second extension 1081*b* may be moved in a direction orthogonal to the rotation center axis C between the first housing structure 1010 and the second housing structure 1020.

According to an embodiment, the first guide device 1051 (e.g., the first guide device 891 in FIG. 8A) may be connected to the first extension 1081*a* of the first magnetic shield member 1081. The first guide device 1051 may be configured to guide the movement of the first extension 1081*a* when switching between the unfolded state and the folded state (see FIG. 6B) while causing the first extension 1081*a* to be disposed so as to face the first face 1014*a*.

According to an embodiment, the first guide device 1051 may include a link 10511 (e.g., the first link 8911 in FIG. 8D) having a first joint 1051*a* (e.g., the first joint 891*a* in FIG. 8D) rotatably coupled to the second face 1014*b* of the first support member 1014 and a second joint 1051*b* (e.g., the second joint 891*b* in FIG. 8D) rotatably connected to the first extension 1081*a* of the first magnetic shield member 1081. The second joint 1051*b* may include a slit 1051*c* (e.g., the through hole 891*c* in FIG. 8D). The first extension 1081*a* of the first magnetic shield member 1081 may be connected to the slit 1051*c* in the second joint 1151*b* via a pin 1051*d* (e.g., the pin 891*d* in FIG. 8D) passing through a slit 10142 (e.g., the slit 8142 in FIG. 8D) formed in the first support member 1014. According to an embodiment, when switching is performed between the unfolded and folded states (see FIGS. 10A and 10B), the first link 10511 is rotatable about the first joint 1051*a*, and the pin 1051*d*, connected to the first extension 1081*a* of the first magnetic shield member 1081, may be shifted in position not only in the through slit 1051*c* in the second joint 1051*b*, but also in the slit 10142 formed in the first support member 1014. According to some embodiments, the guide device may be referred to as a lever device.

According to an embodiment, the second guide device 1052 (e.g., the second guide device 892 in FIG. 8A) may be disposed on the second support member 1024, and may be connected to the second extension 1081*b* of the first magnetic shield member 1081. The second guide device 1052 may be configured to guide the movement of the second extension 1081*a* when switching is performed between the unfolded state and the folded state (see FIG. 6B, FIG. 10C, or FIG. 10D) while causing the second extension 1081*a* to be disposed so as to face the third face 1024*a*. The second guide device 1052 may have substantially the same structure as the first guide device 1051, and a detailed description thereof may not be repeated here.

According to an embodiment, the first magnet 1091 (e.g., the first magnet 671 in FIG. 6A or the first magnet 871 in FIG. 8A) may be disposed in the first housing structure 1010. For example, the first magnet 1091 may be disposed on a structure (e.g., the first internal support member 811 in FIG. 8A) disposed to face the second face 1014*b* of the first support member 1014.

According to some embodiments, the first magnet 1091 may be disposed on the first support member 1014. For example, the first magnet 1091 may be disposed in the recess provided in the first face 1014*a* of the first support member 1014. According to some embodiments, the first magnet 1091 may be disposed inside the first support member 1014.

According to various embodiments, a layer (not illustrated) including an amorphous metal, such as amorphous ribbon, or a material, such as polycarbonate (PC) or epoxy (e.g., an unmagnetized material), may be attached to the first magnetic shield member 1081. The layer may be attached to at least a part of the first magnetic shield member 1081 (e.g., the first extension 1081*a*) via the coating. According to an embodiment, the first extension 1081*a* of the first magnetic shield member 1081 may be brought close to the first magnet 1091 by magnetic force in the unfolded state, but, between the first extension 1081*a* and the first magnet 1091, the layer may prevent and/or avoid the first extension 1081*a* from coming into physical contact with the first magnet 1091. According to an embodiment, the layer may prevent and/or reduce the first extension 1081*a* from being magnetized by the first magnet 1091 in the state in which the electronic device 100 is unfolded.

According to an embodiment, the second magnet 1092 (e.g., the first magnet 672 in FIG. 6A or the second magnet 871 in FIG. 8A) may be disposed in the first housing structure 1020. For example, the second magnet 1092 may be disposed on a structure (e.g., the second internal support member 821 in FIG. 8A) disposed to face the fourth face 1024*b* of the second support member 1024.

According to some embodiments, the second magnet 1092 may be disposed on the second support member 1024. For example, the second magnet 1092 may be disposed in the recess provided in the third face 1024*a* of the second support member 1024. According to some embodiments, the second magnet 1092 may be disposed inside the second support member 1024. According to various embodiments, a layer (not illustrated) including an amorphous metal, such as amorphous ribbon, or a material such as polycarbonate or epoxy (e.g., an unmagnetized material), may be attached to the first magnetic shield member 1081. The layer may be attached to at least a part of the first magnetic shield member 1081 (e.g., the second extension 1081*b*) via the coating. According to an embodiment, the second extension 1081*b* of the first magnetic shield member 1081 may be brought close to the second magnet 1092 by magnetic force in the unfolded state, but, between the second extension 1081*b* and the second magnet 1092, the layer may prevent and/or avoid the second extension 1081*b* from coming into physical contact with the second magnet 1092. According to an embodiment, the layer may prevent and/or reduce the second extension 1081*b* from being magnetized by the second magnet 1092 in the state in which the electronic device 1000 is unfolded.

According to an embodiment, the distance between the first magnet 1091 and the rotation center axis C between the first housing structure 1010 and the second housing structure 1020 may be substantially the same as the distance between the second magnet 1092 and the rotation center axis C. According to an embodiment, in the folded state, the first magnet 1091 and the second magnet 1092 may be aligned with or face each other.

According to an embodiment, in the unfolded state (see FIG. 10A), the first extension 1081*a* of the first magnetic shield member 1081 may be located so as to overlap the first magnet 1091 when viewed from above the first face 1014*a*. In the unfolded state, the first extension 1081*a* of the first magnetic shield member 1081 may reduce or prevent the magnetic force from the first magnet 1091 from being released toward the first mounting face 1010*a*.

According to an embodiment, in the unfolded state (see FIG. 10A), the second extension 1081*b* of the first magnetic shield member 1081 may be located so as to overlap the second magnet 1092 when viewed from above the third face 1024a. In the unfolded state, the second extension 1081b of the first magnetic shield member 1081 may reduce or prevent the magnetic force from the second magnet 1092 from being released toward the second mounting face 1010b.

According to an embodiment, in the folded state (see FIG. 10C), the first extension 1081a of the first magnetic shield member 1081 may be located so as not to overlap the first magnet 1091 when viewed from above the second face 1014b. In the folded state (see FIG. 10D), the second extension 1081b of the first magnetic shield member 1081 may be located so as not to overlap the second magnet 1092 when viewed from above the fourth face 1024b. In the folded state (see FIGS. 10C and 10D), the first magnet 1091 and the second magnet 1092 may be arranged to overlap each other when viewed from above the fourth face 1024b. In the folded state, the first magnetic shield member 1081 may not be disposed between the first magnet 1091 and the second magnet 1092 when viewed from above the second face 1014b or the fourth face 1024b. The folded state of the electronic device 1000 may be maintained by the attraction force between the first magnet 1091 and the second magnet 1092.

According to an embodiment, substantially similar to or the same as the first magnetic shield member 1081, the second magnetic shield member 1082 may be provided in the electronic device 1000 so as to be spaced apart from the first magnetic shield member 1081, and a detailed description thereof may not be repeated here.

According to an embodiment, the third guide device 1053 may be disposed on the first support member 1014, and may be connected to the second magnetic shield member 1082. The fourth guide device 1054 may be disposed on the second support member 1024, and may be connected to the second magnetic shield member 1082. The third guide device 1053 or the fourth guide device 1054 may have substantially the same structure as the first guide device 1051, and a detailed description thereof may not be repeated here.

According to an embodiment, the third magnet 1093 may be disposed in the first housing structure 1010 to correspond to the second magnetic shield member 1082, and may be provided in the electronic device 1000 in a manner substantially similar to or the same as that of the first magnet 1091 corresponding to the first magnetic shield member 1081, and a detailed description thereof may not be repeated here.

According to an embodiment, the fourth magnet 1094 may be disposed in the second housing structure 1020 to correspond to the second magnetic shield member 1082 and may be provided in the electronic device 1000 in a manner substantially similar to or the same as that of the second magnet 1092 corresponding to the first magnetic shield member 1081, and a detailed description thereof may not be repeated here.

According to an embodiment, in the unfolded state (see FIGS. 10A and 10B), the second magnetic shield member 1082 may be located so as to overlap the third magnet 1093 when viewed from above the first face 1014a. In the unfolded state, the second magnetic shield member 1082 may reduce or prevent the magnetic force from the third magnet 1093 from being released toward the first mounting face 1010a. According to an embodiment, in the unfolded state, the second magnetic shield member 1082 may be located so as to overlap the fourth magnet 1094 when viewed from above the third face 1024a. In the unfolded state, the second magnetic shield member 1082 may reduce or prevent the magnetic force from the fourth magnet 1094 from being released toward the second mounting face 1010b.

According to an embodiment, in the folded state (see FIG. 10C), the second magnetic shield member 1082 may be located so as not to overlap the third magnet 1093 when viewed from above the second face 1014b. In the folded state (see FIG. 10D), the second magnetic shield member 1082 may be located so as not to overlap the fourth magnet 1094 when viewed from above the fourth face 1024b. In the folded state (see FIGS. 10C and 10D), the third magnet 1093 and the fourth magnet 1094 may be disposed so as to overlap each other when viewed from above the fourth face 1024b. In the folded state, the second magnetic shield member 1082 may not be disposed between the third magnet 1093 and the fourth magnet 1094 when viewed from above the second face 1014b or the fourth face 1024b. The folded state of the electronic device 1000 may be maintained by the attraction force between the third magnet 1093 and the fourth magnet 1094.

According to various embodiments, the distance between the third magnet 1093 (or the fourth magnet 1094) and the rotation center axis C between the first housing structure 1010 and the second housing structure 1020 may be substantially the same as the distance between the first magnet 1091 (or the second magnet 1092) and the rotation center axis C. According to some embodiments, the distance between the third magnet 1093 (or the fourth magnet 1094) and the rotation center axis C may be substantially the same as the distance between the first magnet 1091 (or the second magnet 1092) and the rotation center axis C.

Figure 11A:
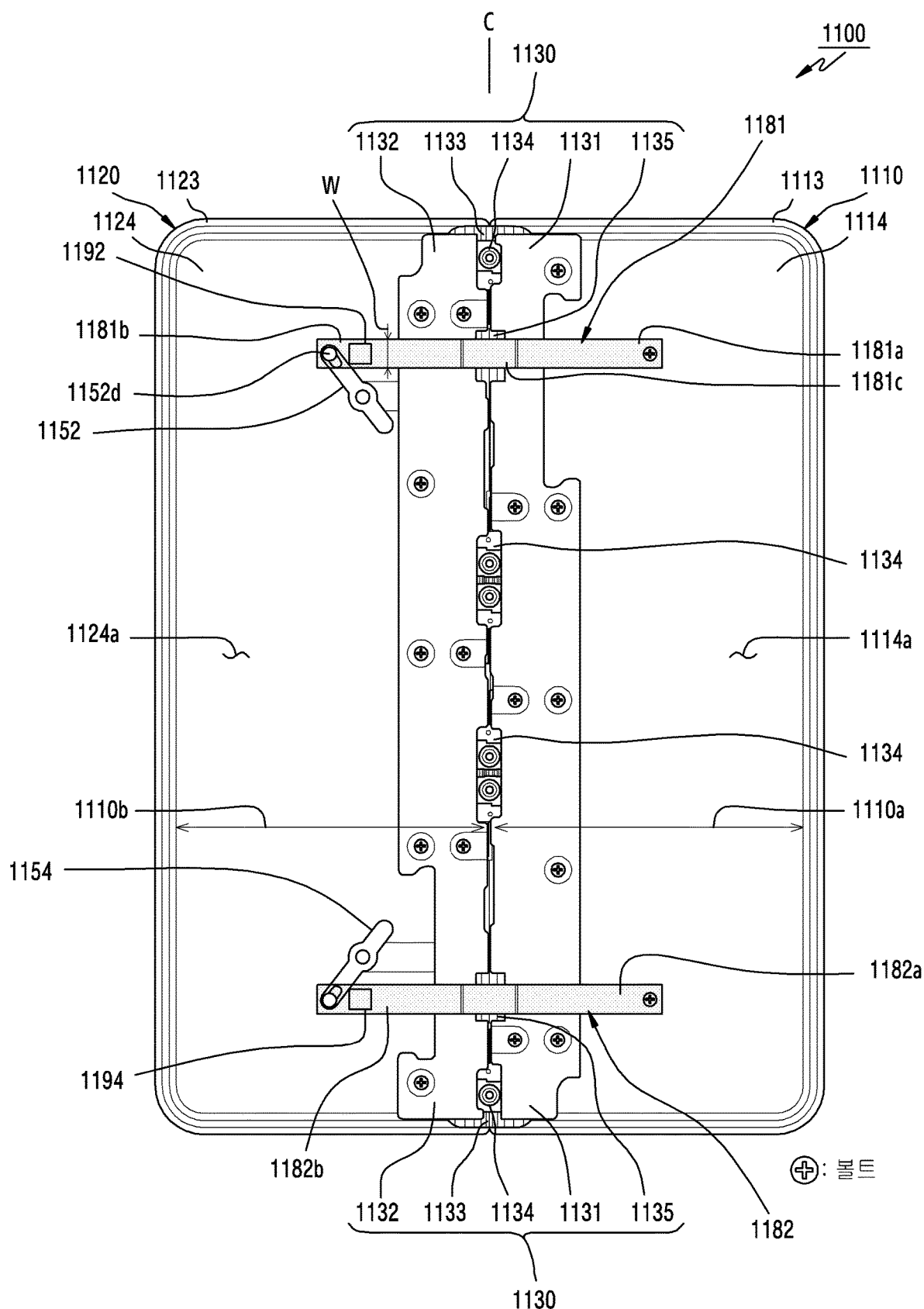
FIG. 11A is a diagram illustrating an example electronic device including magnets and magnetic shield members in the unfolded state according to an embodiment.
Figure 11B:
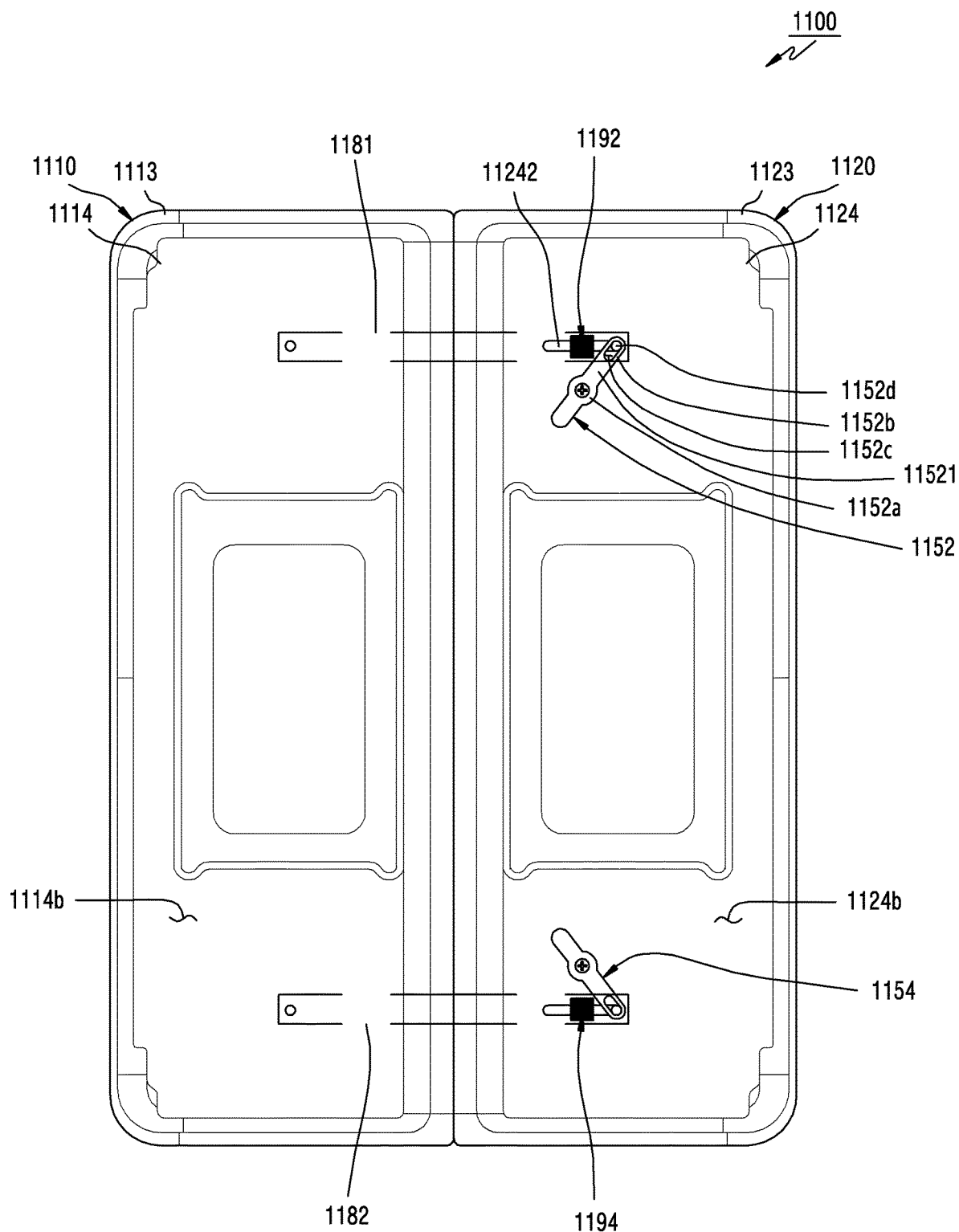
FIG. 11B is a diagram illustrating the example electronic device including magnets and magnetic shield members in the unfolded state according to an embodiment.
Figure 11C:
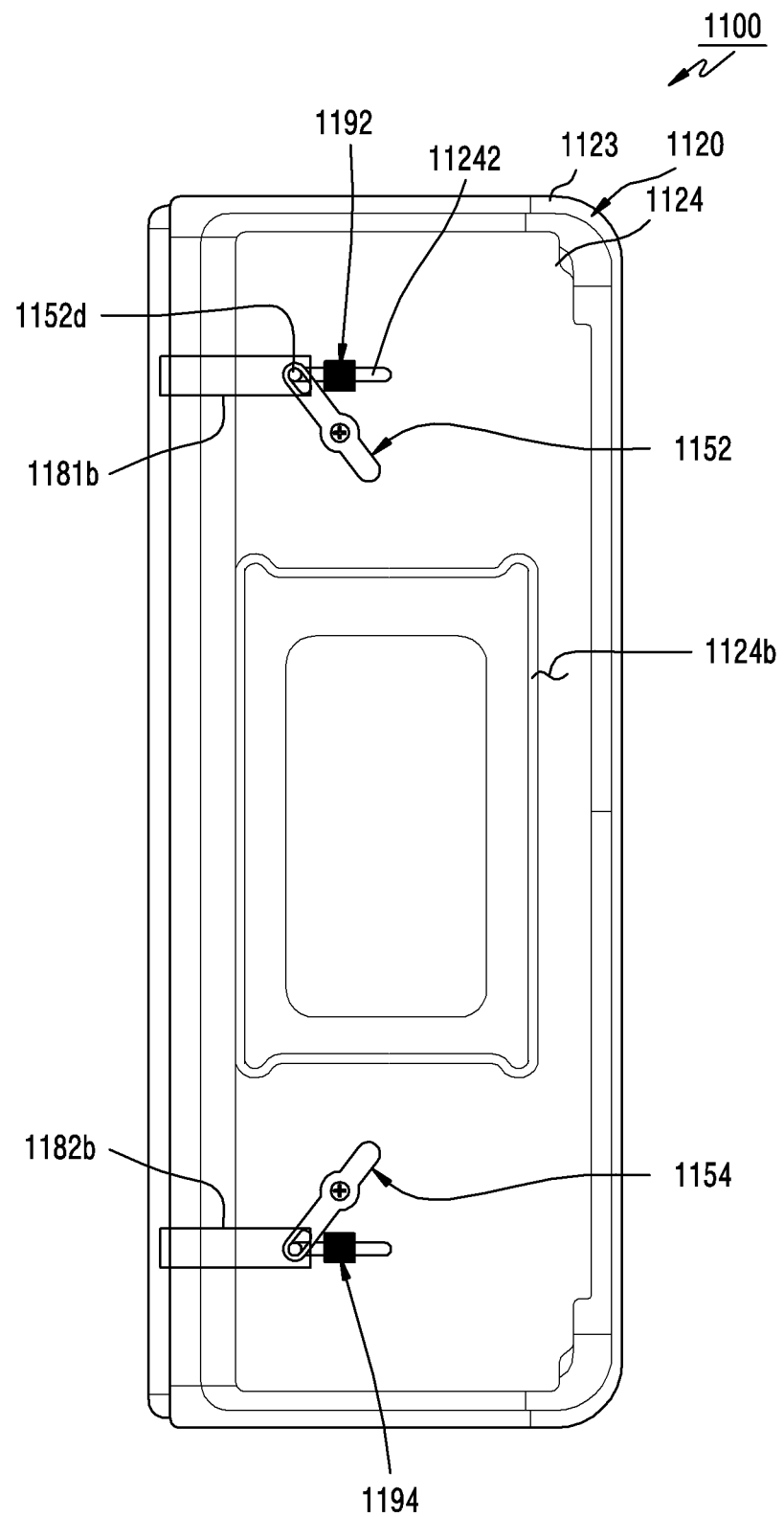
FIG. 11C is a diagram illustrating the example electronic device including magnets and magnetic shield members in the folded state according to an embodiment.

FIG. 11A is a diagram illustrating an example electronic device including magnets and magnetic shield members in the unfolded state according to an embodiment, and FIG. 11B is a diagram illustrating the example electronic device including magnets and magnetic shield members in the unfolded state according to an embodiment. FIG. 11C is a diagram illustrating the example electronic device including magnets and magnetic shield members in the folded state according to an embodiment.

Referring to FIGS. 11A and 11B, in an embodiment, an electronic device 1100 (e.g., the electronic device 20 in FIG. 2 or the electronic device 70 in FIG. 7A) may include at least one of a first housing structure 1110, a second housing structure 1120, a hinge structure 1130, a first magnetic shield member 1181, a second magnetic shield member 1182, a first guide device 1152, a second guide device 1054, a first magnet 1091, and/or a second magnet 1194.

According to an embodiment, the first housing structure 1110 (e.g., the first housing structure 710 in FIG. 7A) may include a first side member 1113 (e.g., the first side member 211 in FIG. 2 or the first side member 813 in FIG. 8A) and a first support member 1114 (e.g., the first support member 814 in FIG. 8A). Since the first housing structure 1110 is substantially similar to or the same as the first housing structure 1010 of FIG. 10A, a detailed description thereof may not be repeated here.

According to an embodiment, the second housing structure 1120 (e.g., the second housing structure 720 in FIG. 7A) may include a second side member 1123 (e.g., the second side member 221 in FIG. 2 or the second side member 823 in FIG. 8A) and a second support member 1124 (e.g., the second support member 824 in FIG. 8A). Since the second housing structure 1120 is substantially similar to or the same as the second housing structure 1020 of FIG. 10A, a detailed description thereof may not be repeated here.

According to an embodiment, the hinge structure 1130 (e.g., the hinge structure 900 in FIG. 9A) may connect the first housing structure 1110 and the second housing structure 1120, and may include at least one of a first hinge plate 1131 (e.g., the first hinge plate 910 in FIG. 9A), a second hinge plate 1132 (e.g., the second hinge plate 920 in FIG. 9A), a hinge cover 1133 (e.g., the hinge cover 930 in FIG. 9A), a hinge 1134 (e.g., the at least one hinge 940 in FIG. 9A), or a structure 1135 (e.g., the at least one structure 950 in FIG. 9A). Since the hinge structure 1130 is substantially similar to or the same as the hinge structure 1030 of FIG. 10A, a detailed description thereof may not be repeated here. According to an embodiment, a first mounting face 1110a (e.g., the first mounting face 8001 in FIG. 8A), formed by coupling the first hinge plate 1131 and the first support member 1114, and a second mounting face 1010b (e.g., the second mounting face 8002 in FIG. 8A), formed by coupling the second hinge plate 1132 and the second support member 1124, may be utilized as an area in which a display (e.g., the display 750 in FIG. 7A) and a digitizer (e.g., the digitizer 760 in FIG. 7A) are disposed.

According to an embodiment, the first magnetic shield member 1181 may include a folding portion 1181c (e.g., the folding portion 783 in FIG. 7A), a first extension 1181a (e.g., the fifth portion 781 in FIG. 7A) extending from the folding portion 1181c to the first housing structure 1110, or a second extension 1181b (e.g., the sixth portion 782 in FIG. 7A) extending from the folding portion 1181c to the second housing structure 1120. For example, the first extension 1181a or the second extension 1181b extends in a direction orthogonal to the rotation center axis C between the first housing structure 1110 and the second housing structure 1120.

According to an embodiment, the first magnetic shield member 1181 may be formed to have a predetermined width W (e.g., a width extending along the rotation center axis C). According to various embodiments, the folding portion 1181c may have a width different from that of the first extension 1181a or the second extension 1181b. For example, the folding portion 1181c may have a width larger than that of the first extension 1181a or the second extension 1181b.

According to an embodiment, the first magnetic shield member 1181 may have a predetermined thickness. According to various embodiments, the folding portion 1181c may have a thickness different from that of the first extension 1181a or the second extension 1181b. For example, the folding portion 1181c may have a thickness larger than that of the first extension 1181a or the second extension 1181b.

According to an embodiment, the first extension 1181a of the first magnetic shield member 1181 may be fixed to the first support member 1114. For example, the first extension 1181a may be fixed to the first support member 1114 using a bolt.

According to an embodiment, when switching is performed between the unfolded state (see FIGS. 11A and 11B) and the folded state (see FIG. 11C), due to the positional relationship between the first and second housing structures 1010 and 1120 and the hinge structure 1130, the second extension 1081b of the first magnetic shield member 1081 may be moved relative to the second housing structure 1020. For example, the second extension 1081b may be moved in a direction orthogonal to the rotation center axis C between the first housing structure 1110 and the second housing structure 1120.

According to an embodiment, the first guide device 1152 (e.g., the second guide device 892 in FIG. 8A) may include a link 11521 (e.g., the second link 8921 in FIG. 8A) having a first joint 1152a (e.g., the third joint 892a in FIG. 8A) rotatably coupled to the fourth face 1124b of the second support member 1124 and a second joint 1152b (e.g., the fourth joint 892b in FIG. 8D) rotatably connected to the second extension 1081a of the first magnetic shield member 1181. The second joint 1152b may include a slit 1152c, and the second extension 1081b of the first magnetic shield member 1181 may be connected to the slit 1152c in the second joint 1151b via a pin 1152d (e.g., the pin 892d in FIG. 8A) passing through a slit 11242 (e.g., the slit 8242 in FIG. 8A) formed in the second support member 1124. According to an embodiment, when switching is performed between the unfolded and folded states (see FIGS. 11A and 11B), the link 11521 is rotatable about the first joint 1151a, and the pin 1152d connected to the second extension 1081b of the first magnetic shield member 1181 may be shifted in position not only in the through slit 1152c in the second joint 1151b, but also in the slit 11242 formed in the second support member 1124.

According to an embodiment, the first magnet 1192 (e.g., the magnet 770 in FIG. 7A) may be disposed in the second housing structure 1120. For example, the first magnet 1192 may be disposed on a structure (e.g., the second internal support member 821 in FIG. 8A) disposed to face the fourth face 1124b of the second support member 1124. According to some embodiments, the first magnet 1192 may be disposed on the second support member 1124. For example, the first magnet 1192 may be disposed in the recess provided in the fourth face 1211 of the second support member 1124. According to some embodiments, the first magnet 1192 may be disposed inside the second support member 1124.

According to various embodiments, a layer (not illustrated), including an amorphous metal, such as amorphous ribbon, or a material such as polycarbonate or epoxy (e.g., an unmagnetized material), may be attached to the first magnetic shield member 1181. The layer may be attached to at least a part of the first magnetic shield member 1181 (e.g., the second extension 1181b) via the coating. According to an embodiment, the second extension 1181b of the first magnetic shield member 1181 may be brought close to the first magnet 1192 by magnetic force in the unfolded state, but, between the second extension 1081b and the first magnet 1192, the layer may prevent and/or avoid the second extension 1081b from coming into physical contact with the first magnet 1192.

According to an embodiment, in the unfolded state (see FIGS. 11A and 11B), the second extension 1181b of the first magnetic shield member 1181 may be located so as to overlap the first magnet 1192 when viewed from above the third face 1124a. In the unfolded state, the second extension 1181b of the first magnetic shield member 1181 may reduce or prevent the magnetic force from the first magnet 1192 from being released toward the second mounting face 1110b.

According to an embodiment, in the unfolded state, the second extension 1181b of the first magnetic shield member 1181 may be located so as to overlap the first magnet 1192 when viewed from above the second face 1114b. In the folded state (see FIG. 11C), the second extension 1181b of the first magnetic shield member 1181 may be located so as not to overlap the first magnet 1192 when viewed from above the second face 1114b. The folded state of the electronic device 1100 may be maintained by the attraction force between the first magnet 1192 and the first extension 1181a of the first magnetic shield member 1181.

According to an embodiment, substantially similar to or the same as the first magnetic shield member 1181, the second magnetic shield member 1182 may be provided in the electronic device 1100 so as to be spaced apart from the first magnetic shield member 1181, and a detailed description thereof may not be repeated here.

According to an embodiment, the second guide device 1154 has a structure including a link that connects the third face 1124a of the second support member 1124 and the second extension 1182b of the second magnetic shield member 1182. Since the second guide device 1154 is substantially the same as the first guide device 1152, a detailed description thereof may not be repeated here.

According to an embodiment, the second magnet 1194 may be disposed in the second housing structure 1120 to correspond to the second magnetic shield member 1182. Since the second magnet 1194 provided in the electronic device is substantially similar to or the same as the first magnet 1192, a detailed description thereof may not be repeated here.

According to an embodiment, in the unfolded state (see FIG. 11A), the second extension 1182b of the second magnetic shield member 1182 may be located so as to overlap the second magnet 1194 when viewed from above the third face 1124a. In the unfolded state, the second extension 1182b of the second magnetic shield member 1182 may prevent and/or reduce the magnetic force from the second magnet 1194 from being released toward the second mounting face 1110b.

According to an embodiment, in the folded state (see FIG. 11C), the second extension 1182b of the second magnetic shield member 1182 may be located so as not to overlap the second magnet 1194 when viewed from above the fourth face 1124b. The folded state of the electronic device 1100 may be maintained by the attraction force between the second magnet 1194 and the first extension 1182a of the second magnetic shield member 1182.

According to various embodiments, the distance between the second magnet 1194 and the rotation center axis C between the first housing structure 1110 and the second housing structure 1120 may be substantially the same as the distance between the first magnet 1192 and the rotation center axis C. According to some embodiments, the distance between the second magnet 1194 and the rotation center axis C may be substantially the same as the distance between the first magnet 1192 and the rotation center axis C.

According to various embodiments (not illustrated), the second extension 1181b of the first magnetic shield member 1181 may be fixed to the second support member 1124, and the first extension 1181a of the first magnetic shield member 1181 may be implemented to be connected with a guide device disposed on the first support member 1114. In this case, the first magnet 1192 may be disposed in the first housing structure 1110 to correspond to the first extension 1181a.

According to various embodiments (not illustrated), the second extension 1182b of the second magnetic shield member 1182 may be fixed to the second support member 1124, and the first extension 1182a of the second magnetic shield member 1182 may be implemented to be connected with the guide device disposed on the first support member 1114. In this case, the second magnet 1194 may be disposed in the first housing structure 1110 to correspond to the first extension 1182a.

Figure 12A:
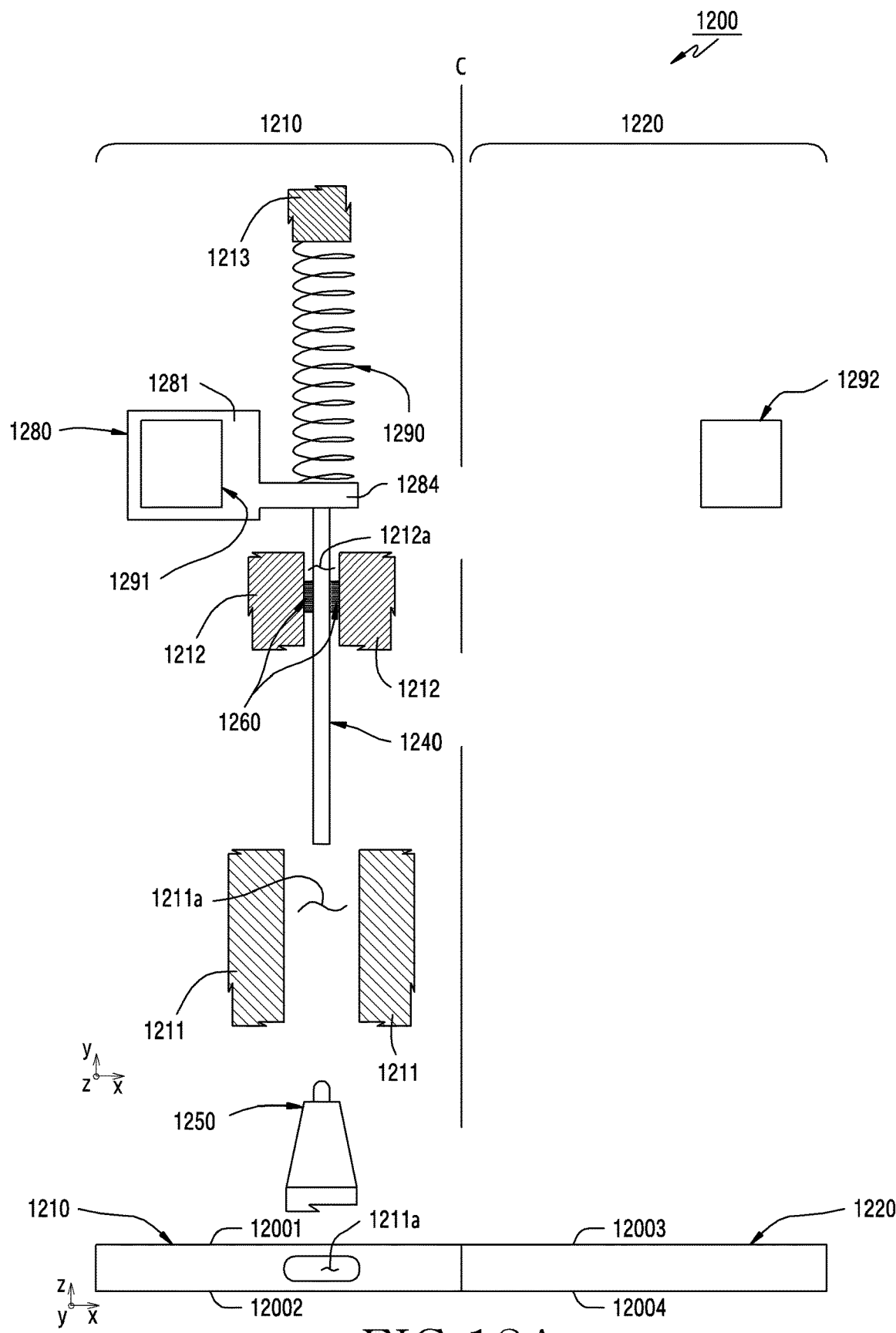
FIG. 12A is a diagram illustrating an example electronic device including magnets and magnetic shield members in a state in which an electronic pen is separated from the electronic device according to an embodiment.
Figure 12B:
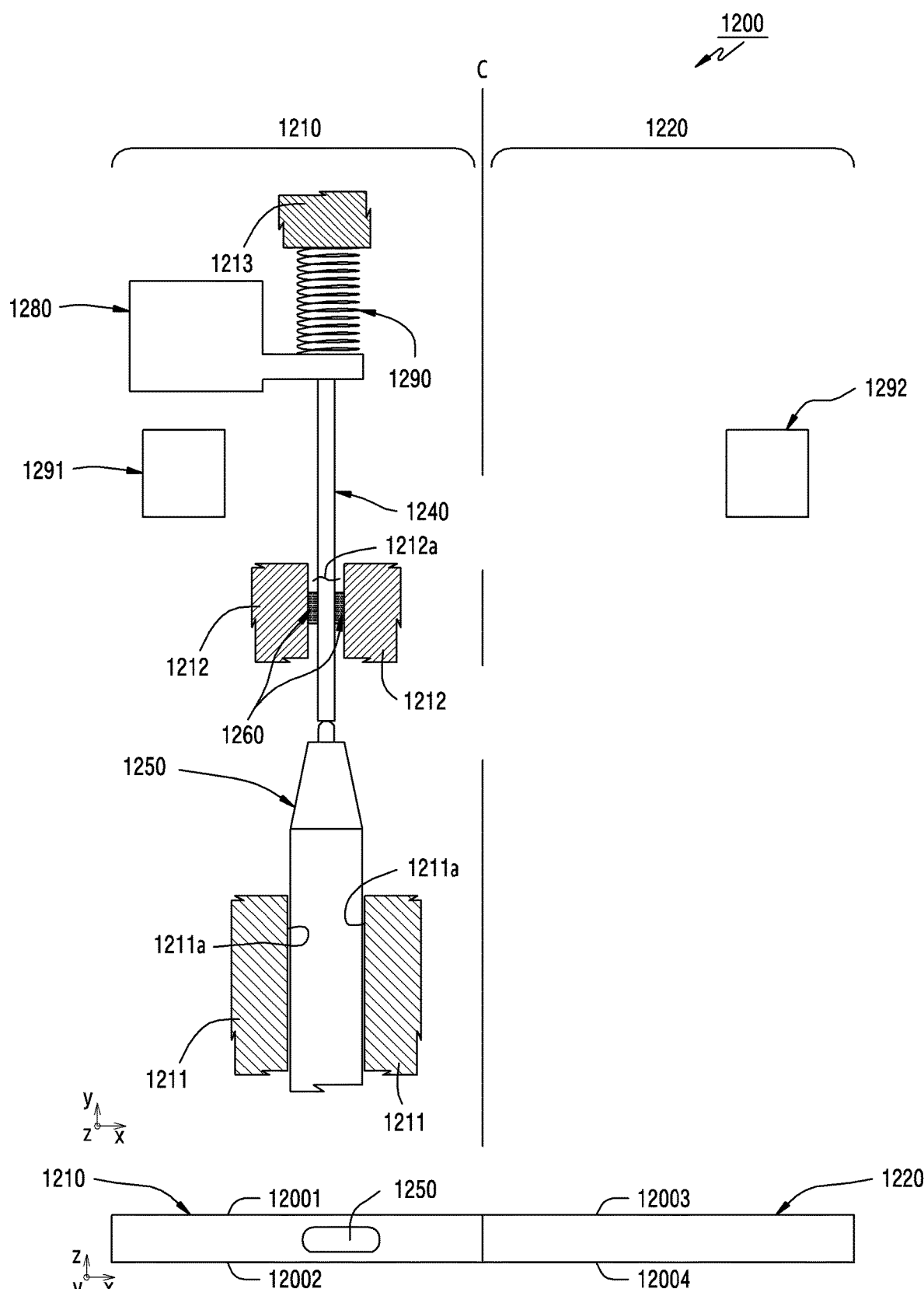
FIG. 12B is a diagram illustrating the example electronic device including magnets and magnetic shield members in the state in which the electronic pen is inserted into the electronic device according to an embodiment.

FIG. 12A is a diagram illustrating an example electronic device including magnets and magnetic shield members in the state in which an electronic pen is separated from the electronic device according to an embodiment. FIG. 12B is a diagram illustrating the example electronic device including magnets and magnetic shield members in the state in which the electronic pen is inserted into the electronic device according to an embodiment.

Referring to FIGS. 12A and 12B, in an embodiment, an electronic device 1200 (e.g., the electronic device 20 in FIG. 2) may include at least one of a first housing structure 1210, a second housing structure 1220, a magnet 1291, a magnetic member (or a member corresponding to the magnet) 1292, a magnetic shield member 1280, and/or an electronic pen 1250.

According to an embodiment, the first housing structure 1210 (e.g., the first housing structure 210 in FIG. 2) and the second housing structure 1220 (e.g., the second housing structure 220 in FIG. 2) may be connected to each other via a hinge structure (e.g., the hinge structure 401 in FIG. 4) so as to be rotatable relative to each other. For example, when the first housing structure 1210 and the second housing structure 1220 rotate relative to each other about the rotation center axis C and overlap each other, the electronic device 1200 may be in the folded state (see FIG. 3). For example, the first housing structure 1210 may include a first face 12001 (e.g., the first face 2001 in FIG. 2) and a second face 12002 (e.g., the second face of FIG. 2), which face away from each other. For example, the second housing structure 1220 may include a third face 12003 (e.g., the third face 2003 in FIG. 2) and a fourth face 12004 (e.g., the fourth face in FIG. 2), which face away from each other. In the state in which the electronic device 1200 is folded (see FIG. 3), the first face 12001 may face the third face 12003. In the state in which the electronic device 1200 is unfolded, the first face 12001 and the second face 12003 may face substantially the same direction.

According to an embodiment (not illustrated), the electronic device 1200 may include a display (e.g., the display 300 in FIG. 2) and/or a digitizer (e.g., the digitizer 660 in FIG. 6A) extending from the first face 12001 to the third face 12003.

According to an embodiment, the magnet 1291 may be disposed in the first housing structure 1210, and the magnetic member 1292 may be disposed in the second housing structure 1220. According to an embodiment, the magnetic shield member 1280 may include a material capable of blocking magnetic force, and may be disposed in the first housing structure 1210 to be movable to a position at which the magnetic shield member 1280 overlaps the magnet 1291 or a position at which the magnetic shield member 1280 does not overlap the magnet 1291.

According to an embodiment, the magnetic shield member 1280 may be moved when the electronic pen 1250 (e.g., the electronic pen 460 in FIG. 2) is inserted into or separated from the first housing structure 1210. For example, when the electronic pen 1250 is inserted into the first housing structure 1210, the magnetic shield member 1280 may be located so as not to overlap the magnet 1291. According to an embodiment, when the electronic pen 1250 is separated from the first housing structure 1210, the magnetic shield member 1280 may be located so as to overlap the magnet 1291.

According to an embodiment, the magnetic shield member 1280 may include a first portion 1281 in a form that overlaps the magnet 1291 and a second portion 1284 extending between an elastic member 1290 and a shaft 1240 when viewed above the first face 12001 in the case in which the electronic pen 1250 is separated from a space 1211a in the first structure 1210. When the electronic pen 1250 is separated from the first housing structure 1210, the second portion 1284 and the shaft 1240 may be moved by the elastic force of the elastic member 1290. As a result, when viewed from above the first face 12001, the first portion 1281 connected to the second portion 1284 may be moved to a position at which the first portion 1281 overlaps the magnet 1291.

According to various embodiments, the first portion 1281 and the second portion 1284 may be integrally formed, and may include the same material. According to some embodiments, the first portion 1281 may be formed of a material capable of blocking magnetic force, and the second portion 1284 may be formed of a material different from that of the first portion 1281.

According to an embodiment, a member 1211 (e.g., the first support member 814 and/or the first internal support member 811 of FIG. 8A) included in the first housing structure 1210 may include a space 1211a capable of accommodating the electronic pen 1250. For example, the electronic pen 1250 may be inserted into the space 1211a through a pen hole (e.g., the pen hole 247 in FIG. 2) formed in the outer face of the first housing structure 1210. According to an embodiment, when the electronic pen 1250 is inserted into the first housing structure 1210, the magnetic shield member 1280 is not movable due to the shaft (or a force transfer member) 1240 disposed between the electronic pen 1250 (e.g., a pen tip) and the magnetic shield member 1280. For example, when the electronic pen 1250 is inserted into the first housing structure 1210, the shaft 1240 may be pressed and moved by the electronic pen 1250 to transfer force to the magnetic shield member 1280. For example, the shaft 1240 or the magnetic shield member 1280 may perform a translation motion.

According to an embodiment, the member 1212 (e.g., the first support member 814 and/or the first internal support member 811 in FIG. 8A) included in the first housing structure 1210 may include a passage 1212a related to the shaft 1240. For example, the shaft 1240 may be disposed in the passage 1212a, and the passage 1212a may guide the movement of the shaft 1240.

According to an embodiment, the electronic device 1200 may include a sealing member 1260 disposed in the passage 1212. For example, the sealing member 1260 may be interposed between a face (not illustrated) of the passage 1212 and the shaft 1240, and may prevent and/or reduce foreign matter such as water from flowing into the first housing structure 1210 from the outside through the passage 1212. According to an embodiment, the sealing member 1260 is an elastic member, and may include, for example, an O-ring.

According to some embodiments, the sealing member 1260 may be disposed on the shaft 1240. For example, when the shaft 1240 is moved, the sealing member 1260 may be in sliding contact with the inner face of the passage 1212. According to various embodiments (not illustrated), the shaft 1240 may include a recess, and the sealing member 1260 may be disposed in the recess.

According to an embodiment, when the electronic pen 1250 is inserted into the first housing structure 1210, the magnetic shield member 1280 or the shaft 1240 may be moved while receiving elastic force from an elastic member 1290 (e.g., a compression coil spring 811) supported by a member 1213 (e.g., the first support member 814 and/or the first internal support member 811 of FIG. 8A) included in the first housing structure 1210. When the electronic pen 1250 is separated from the first housing structure 1210, the magnetic shield member 1280 may be moved to a position overlapping the magnet 1291 by the elastic force of the elastic member 1290 when viewed from above the first face 12001 or the second face 12002.

According to an embodiment, when the electronic device 1200 is in the folded state (see FIG. 3) and the electronic pen 1250 is inserted into the first housing structure 1210, the magnet 1291 and the magnetic member 1292 may be disposed to be aligned with or to face each other, and the magnetic shield member 1280 may not be located between the magnet 1291 and the magnetic member 1292. The folded state of the electronic device 1200 may be maintained by the attraction force between the magnet 1291 and the magnetic member 1292. According to an embodiment, the magnetic member 1292 may include various materials that react to a magnet.

According to an embodiment, when the electronic pen 1250 is separated from the first housing structure 1210, the magnetic shield member 1280 may be located so as to overlap the magnet 1291 when viewed from above the first face 12001 or the second face 12002. When the electronic pen 1250 is in the state of being separated from the first housing structure 1210, it may indicate that the user intends to operate a screen (e.g., the first face 12001 and/or the third face 12003) using the electronic pen 1250 after unfolding the electronic device 1200. When the electronic pen 1250 is separated from the first housing structure 1210, the magnetic shield member 1280 is positioned between the magnet 1291 and the digitizer. Thus, it is possible to reduce the influence of a magnetic field from the magnet 1291 on the interaction between the electronic pen 1250, which is of a magnetic-field type, and the digitizer.

Figure 13A:
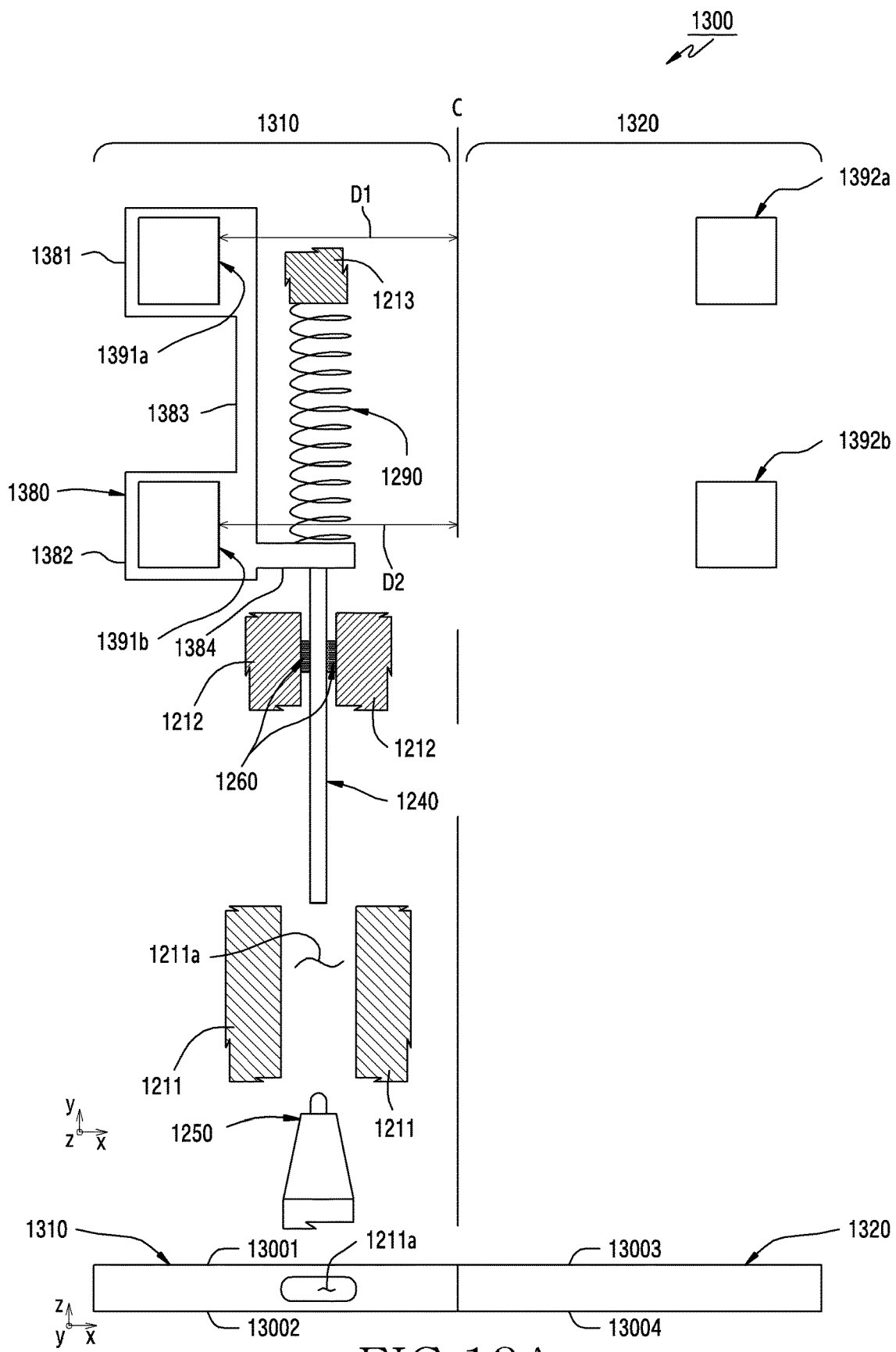
FIG. 13A is a diagram illustrating an example electronic device including magnets and magnetic shield members in the state in which an electronic pen is separated from the electronic device according to an embodiment.
Figure 13B:
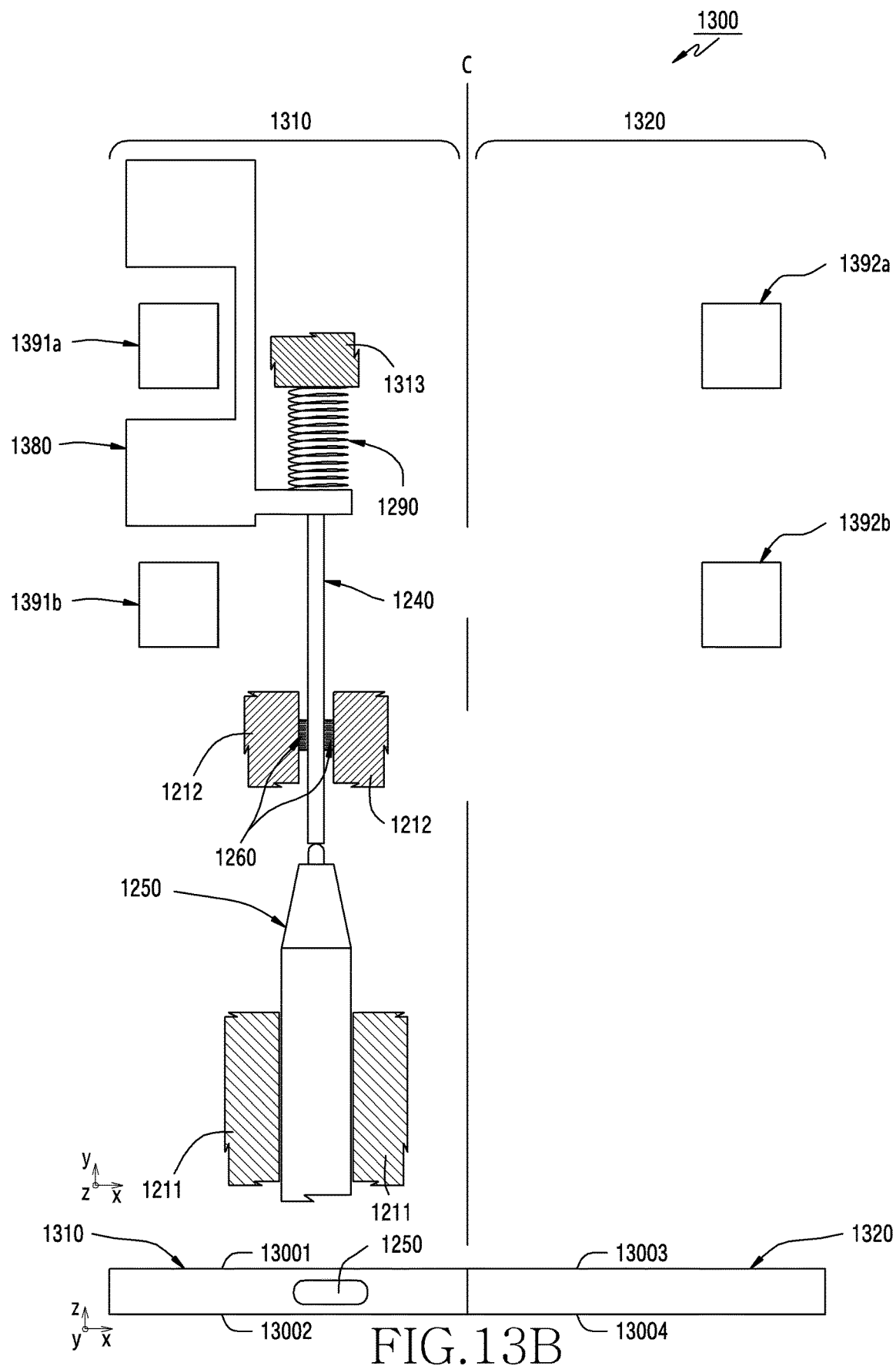
FIG. 13B is a diagram illustrating the example electronic device including magnets and magnetic shield members in the state in which the electronic pen is inserted into the electronic device according to an embodiment.

FIG. 13A is a diagram illustrating an example electronic device including magnets and magnetic shield members in the state in which an electronic pen is separated from the electronic device according to an embodiment. FIG. 13B is a diagram illustrating the example electronic device including magnets and magnetic shield members in the state in which the electronic pen is inserted into the electronic device according to an embodiment.

Referring to FIGS. 13A and 13B, in an embodiment, an electronic device 1300 (e.g., the electronic device 20 in FIG. 2) may include at least one of a first housing structure 1310, a second housing structure 1320, a first magnet 1391a, a second magnet 1391b, a first magnetic member 1392a, a second magnetic member 1392b, a magnetic shield member 1380, and/or an electronic pen 1250.

For example, the first housing structure 1310 may include a first face 13001 (e.g., the first face 2001 in FIG. 2) and a second face 13002 (e.g., the second face of FIG. 2), which face away from each other. For example, the second housing structure 1320 may include a third face 13003 (e.g., the third face 2003 in FIG. 2) and a fourth face 13004 (e.g., the fourth face in FIG. 2), which face away from each other. In the state in which the electronic device 1300 is folded (see FIG. 3), the first face 13001 may face the third face 13003. In the state in which the electronic device 1300 is unfolded, the first face 13001 and the third face 13003 may face substantially the same direction. According to an embodiment (not illustrated), the electronic device 1300 may include a display (e.g., the display 300 in FIG. 2) and/or a digitizer (e.g., the digitizer 660 in FIG. 6A) extending from the first face 13001 to the third face 13003.

Since the operation principle and structure in which the magnetic shield member 1380 is moved when the electronic pen 1250 is inserted or separated in the embodiment of FIGS. 13A and 13B are substantially the same as those illustrated in FIGS. 12A and 12B, a detailed description thereof may not be repeated here.

According to an embodiment, the first magnet 1391a or the second magnet 1391b may be disposed in the first housing structure 1310 (e.g., the first housing structure 1210 in FIG. 12A), and the first magnetic member 1392a or the second magnetic member 1392b may be disposed in the second housing structure 1320 (e.g., the second housing structure 1220 in FIG. 12A). According to an embodiment, the magnetic shield member 1380 may include a material capable of blocking magnetic force, and may be disposed in the first housing structure 1310 so as to be movable to a position at which the magnetic shield member 1380 overlaps the first magnet 1391a and the second magnet 1391b or a position at which the magnetic shield member 1380 does not overlap the first magnet 1391a and the second magnet 1391b when viewed from above the first face 13001 or the second face 13002.

According to an embodiment, the magnetic shield member 1380 may be moved when the electronic pen 1250 (e.g., the electronic pen 460 in FIG. 2) is inserted into or separated from the first housing structure 1310. For example, when the electronic pen 1250 is inserted into the first housing structure 1310, the magnetic shield member 1380 may be located so as not to overlap the first magnet 1391a or the second magnet 1391b when viewed from above the first face 13001 or the second face 13002. According to an embodiment, when the electronic pen 1250 is separated from the space 1211a in the first housing structure 1310, the magnetic shield member 1380 may be located so as to overlap the first magnet 1391a and the second magnet 1391b when viewed from above the first face 13001 or the second face 13002.

According to an embodiment, the first magnet 1391a and the second magnet 1391b may be located so as to be spaced apart from each other when viewed from above the first face 13001 or the second face 13002. For example, the first magnet 1391a and the second magnet 1391b may be arranged to be spaced apart from each other along the rotation center axis C.

According to an embodiment, the magnetic shield member 1380 may include a first portion 1381 in a form that overlaps the first magnet 1391a and a second portion 1382 in a form that overlaps the second magnet 1391b when viewed above the first face 13001 in the case in which the electronic pen 1250 is separated from a space 1211a in the first structure 1310, and may further include a third portion 1383 connecting the first portion 1381 and the second portion 1382. According to an embodiment, the magnetic shield member 1380 may include a fourth portion 1384 extending between the elastic member 1290 and the shaft 1240. When the electronic pen 1250 is separated from the first housing structure 1310, the fourth portion 1384 and the shaft 1240 may be moved by the elastic force of the elastic member 1290. As a result, when viewed from above the first face 13001, the first portion 1381, connected to the fourth portion 1384, may be moved to a position at which the first portion 1281 overlaps the first magnet 1391a, and the second portion 1382, connected to the fourth portion 1384, may be moved to a position at which the second portion 1392 overlaps the second magnet 1391b.

According to various embodiments, the first portion 1381, the second portion 1382, the third portion 1383, and the fourth portion 1384 may be integrally formed, and may include the same material.

According to some embodiments, the first portion 1381 and the second portion 1382 may be formed of a material capable of blocking magnetic force, and the third portion 1383 or the fourth portion 1384 may be formed of a material different from that of the first portion 1381 (or the second portion 1382).

According to an embodiment, when the electronic device 1300 is in the folded state (see FIG. 3) and the electronic pen 1250 is inserted into the first housing structure 1310, the first magnet 1391a and the first magnetic member 1392a may be disposed so as to be aligned with or to face each other, and the second magnet 1391b and the second magnetic member 1392b may be disposed so as to be aligned with or to face each other. When the electronic device 1300 is in the folded state (see FIG. 3) and the electronic pen 1250 is inserted into the first housing structure 1310, the magnetic shield member 1380 may not be located between the first magnet 1391a and the first magnetic member 1392a and between the second magnet 1391b and the second magnetic member 1392b. The folded state of the electronic device 1300 may be maintained by the attraction force between the first magnet 1391a and the first magnetic member 1392a and the attraction force between the second magnet 1391b and the second magnetic member 1392b. According to an embodiment, the first magnetic member 1392a and the second magnetic member 1392b may include various materials that react to a magnet.

According to an embodiment, a first distance D1 between the first magnet 1391a and the rotation center axis C may be substantially the same as a second distance D2 between the second magnet 1391b and the rotation center axis C. According to some embodiments, the first distance D1 and the second distance D2 may be different from each other.

According to an embodiment, when the electronic pen 1250 is separated from the first housing structure 1310, the magnetic shield member 1380 may be located so as to overlap the first magnet 1391a and the second magnet 1391b. When the electronic pen 1250 is separated from the first housing structure 1310, the magnetic shield member 1380 is positioned between the first and second magnets 1391a and 1391b and the digitizer. Thus, it is possible to reduce the influence of the magnetic field of the first and second magnets 1391a and 1391b on the interaction between the electronic pen 1250, which is of a magnetic-field type, and the digitizer.

According to various embodiments, the positions or number of magnets may vary, and are not limited to the example illustrated in FIG. 13A.

Figure 14A:
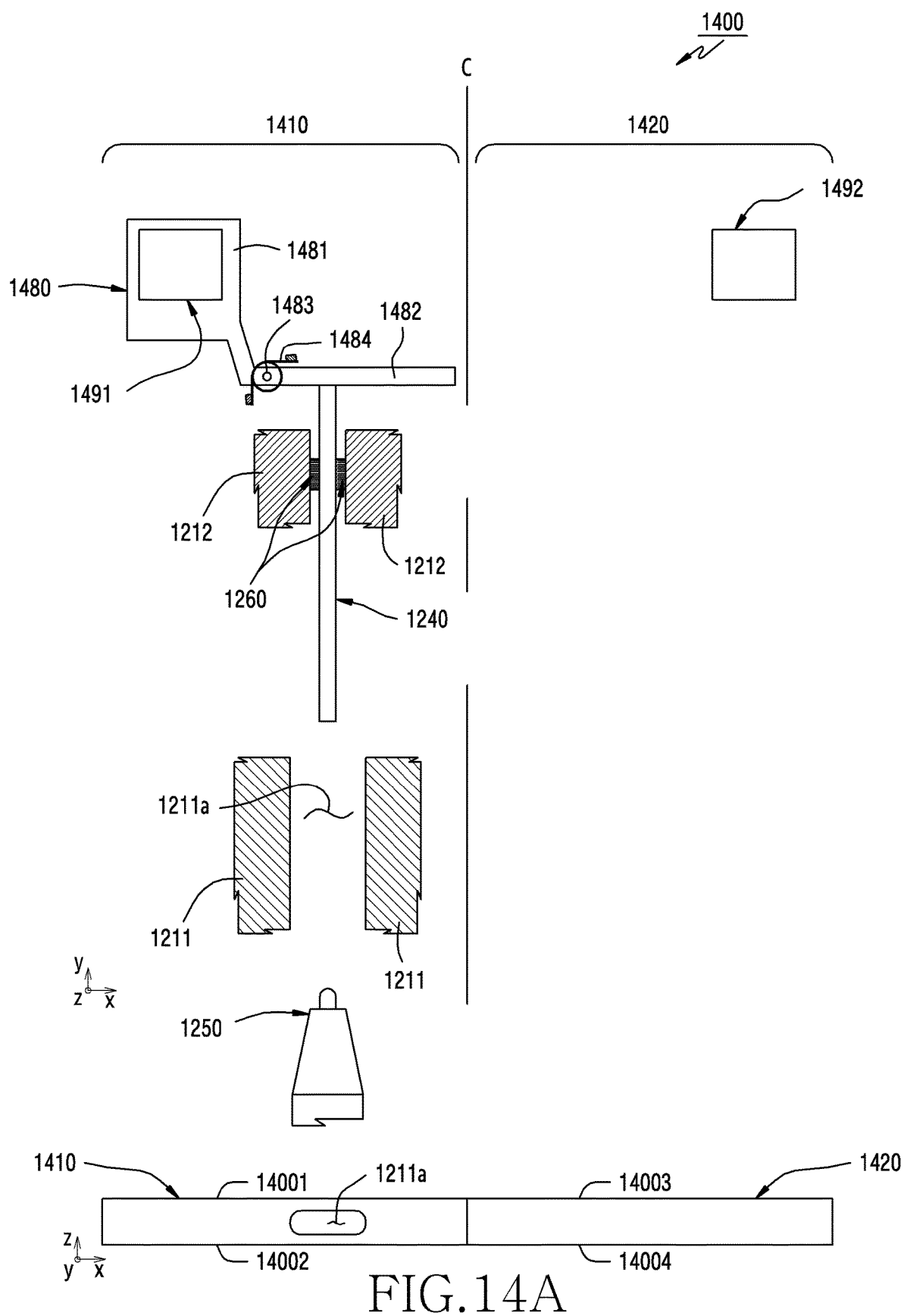
FIG. 14A is a diagram illustrating an example electronic device including magnets and magnetic shield members in the state in which an electronic pen is inserted into the electronic device according to an embodiment.
Figure 14B:
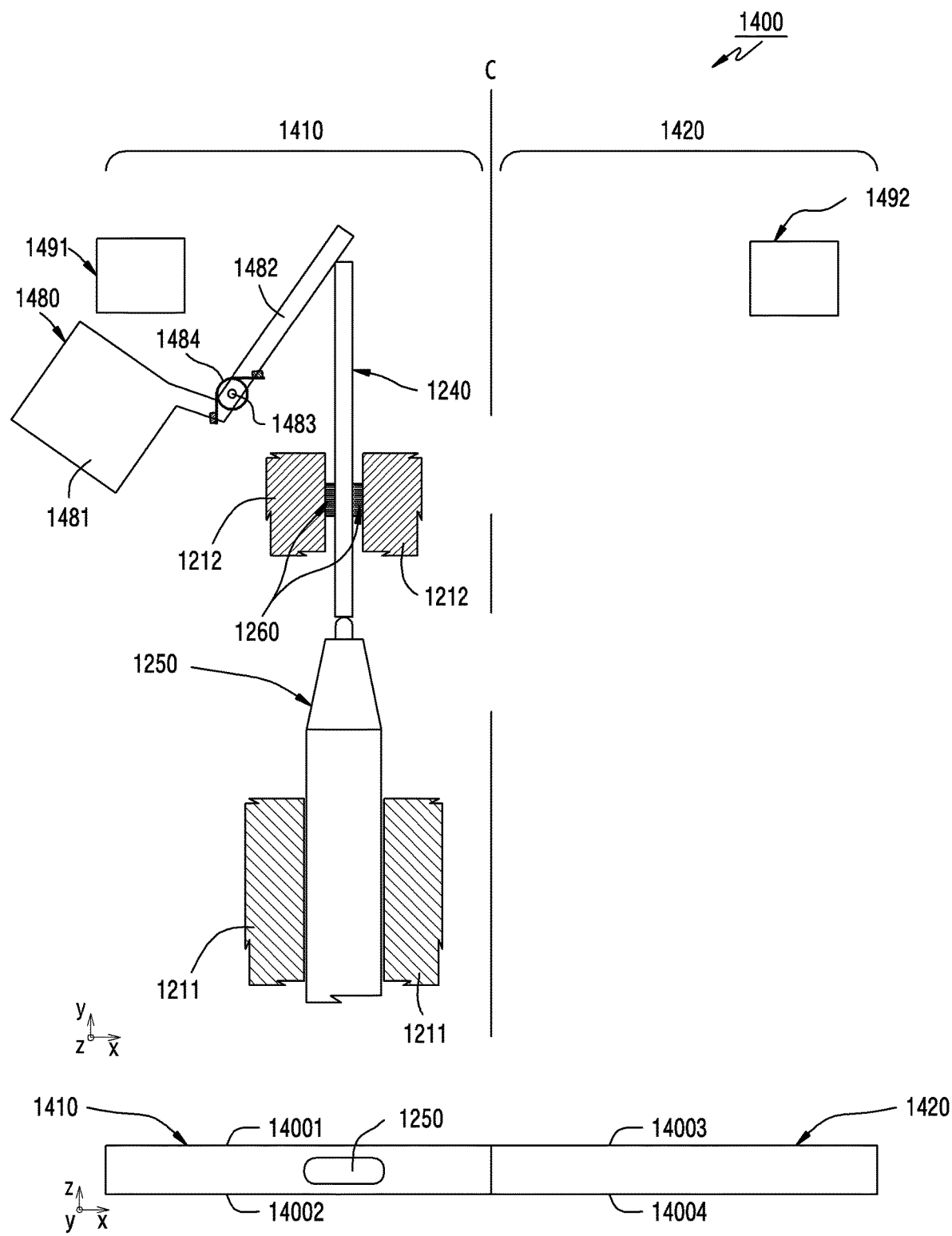
FIG. 14B is a diagram illustrating the example electronic device including magnets and magnetic shield members in the state in which the electronic pen is inserted into the electronic device according to an embodiment.

FIG. 14A is a diagram illustrating an example electronic device including magnets and magnetic shield members in the state in which an electronic pen is separated from the electronic device according to an embodiment. FIG. 14B illustrates the electronic device including magnets and magnetic shield members in the state in which the electronic pen is inserted into the electronic device according to an embodiment.

Referring to FIGS. 14A and 14B, in an embodiment, an electronic device 1400 (e.g., the electronic device 20 in FIG. 2) may include at least one of a first housing structure 1410, a second housing structure 1420, a magnet 1491, a magnetic member 1492, a magnetic shield member 1480, and/or an electronic pen 1250.

For example, the first housing structure 1410 may include a first face 14001 (e.g., the first face 2001 in FIG. 2) and a second face 14002 (e.g., the second face of FIG. 2), which face away from each other. For example, the second housing structure 1420 may include a third face 14003 (e.g., the third face 2003 in FIG. 2) and a fourth face 14004 (e.g., the fourth face in FIG. 2), which face away from each other. In the state in which the electronic device 1400 is folded (see FIG. 3), the first face 14001 may face the third face 14003. In the state in which the electronic device 1400 is unfolded, the first face 14001 and the second face 14003 may face substantially the same direction. According to an embodiment (not illustrated), the electronic device 1400 may include a display (e.g., the display 300 in FIG. 2) and/or a digitizer (e.g., the digitizer 660 in FIG. 6A) extending from the first face 14001 to the third face 14003.

The embodiment of FIGS. 14A and 14B is different from the embodiment of FIGS. 12A and 12B only in the operation principle and structure in which the magnetic shield member 1480 is moved when the electronic pen 1250 is inserted or separated, and is substantially the same as the embodiment of FIGS. 12A and 12B as to the operation and structure in which force is transferred to the magnetic shield member 1480.

According to an embodiment, the magnet 1491 may be disposed in the first housing structure 1410 (e.g., the first housing structure 1210 in FIG. 12A), and the magnetic member 1492 may be disposed in the second housing structure 1420 (e.g., the second housing structure 1220 in FIG. 12A). According to an embodiment, the magnetic shield member 1480 may include a material capable of blocking magnetic force, and may be disposed in the first housing structure 1410 so as to be movable to a position at which the magnetic shield member 1480 overlaps the magnet 1491 or a position at which the magnetic shield member 1480 does not overlap the magnet 1491.

According to an embodiment, the magnetic shield member 1480 may include at least one of a magnetic shield area 1481, an extension area 1482 extending from the magnetic shield area 1481, a rotation shaft 1483, or an elastic member 1484. The magnetic shield member 1480 may be rotated about the rotation shaft 1483 when the electronic pen 1250 (e.g., the electronic pen 460 in FIG. 2) is inserted into or separated from the first housing structure 1310. For example, when the electronic pen 1250 is inserted into the first housing structure 1410, the shaft 1240 may press the extension area 1482 due to the movement thereof, whereby the magnetic shield member 1480 may rotate about the rotation shaft 1483. When the electronic pen 1250 is inserted into the first housing structure 1410, the magnetic shield area 1481 may be located so as not to overlap the magnet 1491 when viewed from above the first face 14001 or the second face 14002.

According to various embodiments, the magnetic shield area 1481 and the extension area 1482 may be integrally formed, and may include the same material. According to some embodiments, the magnetic shield area 1482 may be formed of a material capable of blocking magnetic force, and the extension area 1482 may be formed of a material different from that of the magnetic shield area 1482.

According to an embodiment, when the electronic device 1400 is in the folded state (see FIG. 3) and the electronic pen 1250 is inserted into the first housing structure 1410, the magnetic shield member 1480 may not be located between the magnet 1491 and the magnetic member, and the magnet 1491 and the magnetic member 1492 may be disposed to be aligned with or to face each other. The folded state of the electronic device 1400 may be maintained by the attraction force between the magnet 1491 and the magnetic member 1492. According to an embodiment, the magnetic member 1492 may include various materials that react to a magnet.

According to an embodiment, when the electronic pen 1250 is separated from the first housing structure 1410, the magnetic shield member 1480 is rotated about the rotation shaft 1482 by an elastic member 1484 (e.g., a torsion spring) applied to the rotation shaft 1483, whereby the magnetic shield area 1481 is located so as to overlap the magnet 1491 when viewed from above the first face 14001 or the second face 14002. When the electronic pen 1250 is separated from the first housing structure 1410, the magnetic shield area 1481 of the magnetic shield member 1480 is positioned between the magnet 1491 and the digitizer. Thus, it is possible to reduce the influence of a magnetic field from the magnet 1491 on the interaction between the electronic pen 1250, which is of a magnetic-field type, and the digitizer.

Figure 15:
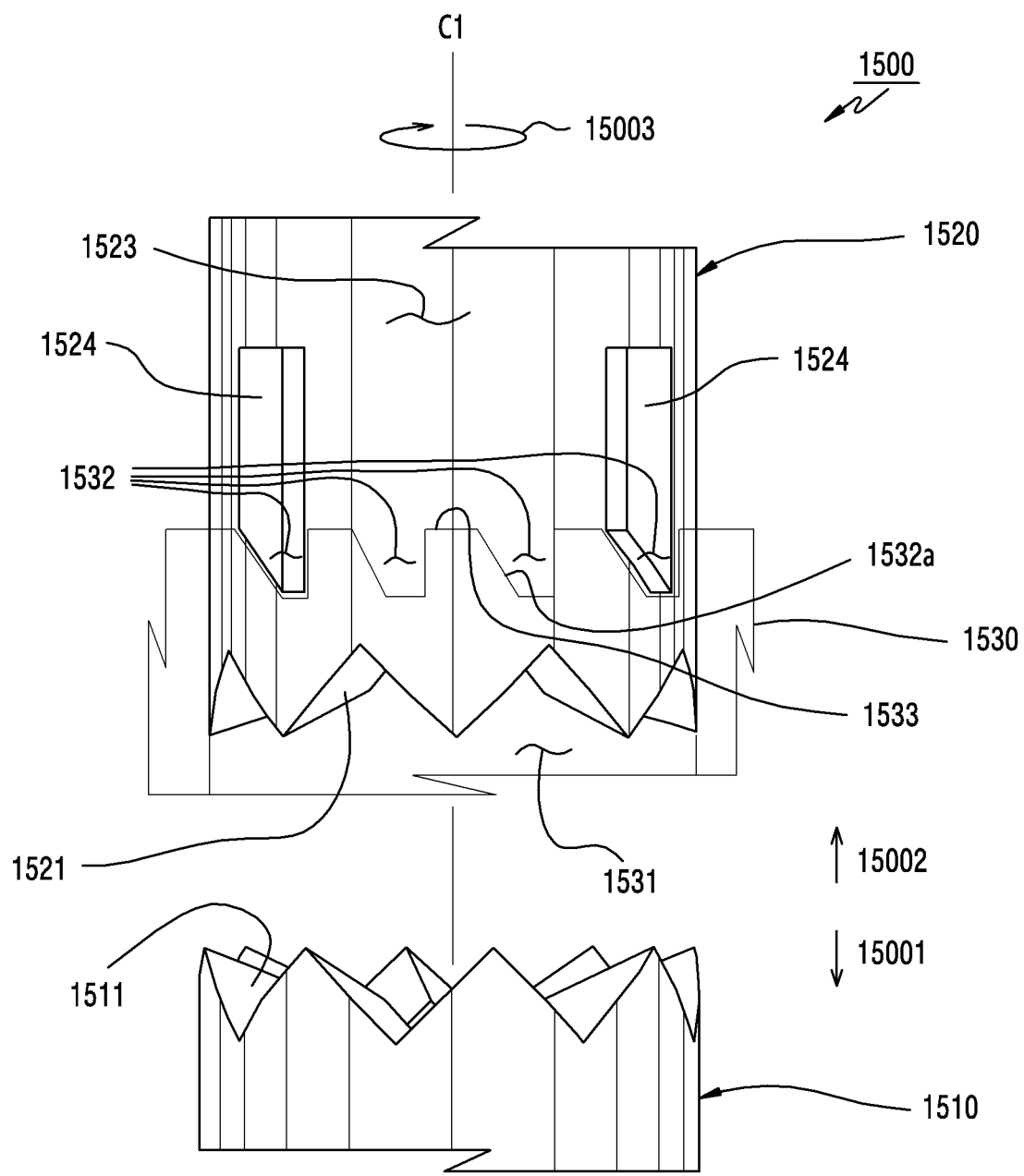
FIG. 15 is a diagram illustrating an example structure of a shaft for transmitting force between an electronic pen and a magnetic shield member according to an embodiment.

FIG. 15 is a diagram illustrating an example structure of a shaft for transmitting a force between an electronic pen and a magnetic shield member according to an embodiment.

Referring to FIG. 15, in an embodiment, the shaft 1500 may include a first shaft portion 1510 and a second shaft portion 1520. In an embodiment, the shaft 1500 may include the shaft 1240 of FIG. 12A. For example, referring to FIGS. 12A and 15, the first shaft portion 1510 may be a portion pressed by the electronic pen 1250, and the second shaft portion 1520 may be a portion pressing the second portion 1284 of the magnetic shield member 1280. The first shaft portion 1510 and/or the second shaft portion 1520 may have a cylindrical shape having a rounded side face.

According to an embodiment, the first shaft portion 1510 may include a first face 1511 that faces the second shaft portion 1520. The second shaft portion 1520 may include a second face 1521 that faces the first face 1511 of the first shaft portion 1510. According to an embodiment, the first face 1511 may include first gear teeth arranged in a circular shape. The second face 1521 may include second gear teeth capable of being engaged with the first gear teeth of the first face 1511.

According to an embodiment, the second shaft portion 1520 may include protrusions 1524 protruding from the rounded side face 1523 thereof and extending in a first direction 15001 toward the first face 1511 from the second face 1521. For example, the protrusions 1524 may be arranged at a corresponding angle about an axis C1.

According to an embodiment, the shaft 1500 may be disposed on the support member 1530. According to an embodiment, the support member 1530 may include a through hole 1531, and the shaft 1500 may be disposed in the through hole 1531. According to an embodiment, the support member 1530 may be a member 1212 included in the first housing structure 1210 of FIG. 12A. According to an embodiment, the support member 1530 may include recesses 1532 having a predetermined depth in the first direction 15001 and repeatedly arranged in the inner face of the through hole 1531.

According to an example embodiment, when the electronic pen (e.g., the electronic pen 1250 in FIG. 12A) is inserted into the first housing structure (e.g., the first housing structure 1210 in FIG. 12A), the first shaft portion 1510 may be moved in the second direction 15002 opposite the first direction 15001 to press the second shaft portion 1520. By sliding between the inclined faces of the first gear teeth included in the first face 1511 and the inclined faces of the second gear teeth included in the second face 1521, the second shaft portion 1520 is rotatable about the axis C1 (15003). The rotation angle may be determined by the gear ratio of the first gear teeth and the second gear teeth.

According to an embodiment, each of the recesses 1532 of the support member 1530 may include an inclined face 1532a. When the second shaft portion 1520 is rotated, the protrusions 1524 may be guided and moved on the inclined faces 1532a to be separated from the recesses 1532 and to be disposed on one face 1533 of the support member 1530. As a result, the second shaft portion 1520 may be moved by a predetermined distance in the second direction 15002 relative to the support member 1530 to press the second portion 1284 of the magnetic shield member 1280 illustrated in FIG. 12A, and, as illustrated in FIG. 12B, the magnetic shield member 1280 may be disposed so as not to overlap the magnet 1291 when viewed from above the first face 12001.

According to an embodiment, when separating the electronic pen (e.g., the electronic pen 1250 in FIG. 12A) from the first housing structure (e.g., the first housing structure 1210 in FIG. 12A), a method of applying external force to one face of the electronic pen, which is exposed to the outside, in the second direction 15002 and then releasing the external force may be applied. For example, when pushing the electronic pen into the first housing structure (e.g., the first housing structure 1210 in FIG. 12A) by a predetermined distance and then releasing the external force, the first shaft portion 1510 may move the electronic pen in the first direction 15001 by an elastic structure (not illustrated) such as a compression spring. As a result, the electronic pen may at least partially protrude to the outside of the first housing structure. By the external force applied to the electronic pen in the second direction 15002 when separating the electronic pen, the first shaft portion 1510 may be moved in the second direction 15002, and may press the second shaft portion 1520. By the sliding between the inclined faces of the first gear teeth included in the first face 1511 and the inclined faces of the second gear teeth included in the second face 1521, the second shaft portion 1520 is rotatable about the axis C1 (15003), and the protrusions 1524 may get out of the one face 1533 and may be inserted into the recesses 1532. As a result, the second shaft portion 1520 may be moved a predetermined distance in the first direction 15001 relative to the support member 1530, and, as illustrated in FIG. 12A, the magnetic shield member 1280 may be disposed so as to overlap the magnet 1291 when viewed from above the first face 12001.

According to some embodiments, when the electronic pen (e.g., the electronic pen 1250 in FIG. 12A) is separated from the first housing structure (e.g., the first housing structure 1210 in FIG. 12A), the second shaft portion 1520 may be rotated by a predetermined angle by the elastic force of the elastic member 1290, and the protrusions 1524 may get out of the one face 1533, and may be inserted into the recesses 1532. For example, the shaft 1500 may include a guide device (not illustrated) that rotates the second shaft portion 1520 by a predetermined angle when the electronic pen is separated and the elastic member 1290 presses the second shaft portion 1520 in the first direction 15001.

Figure 16A:
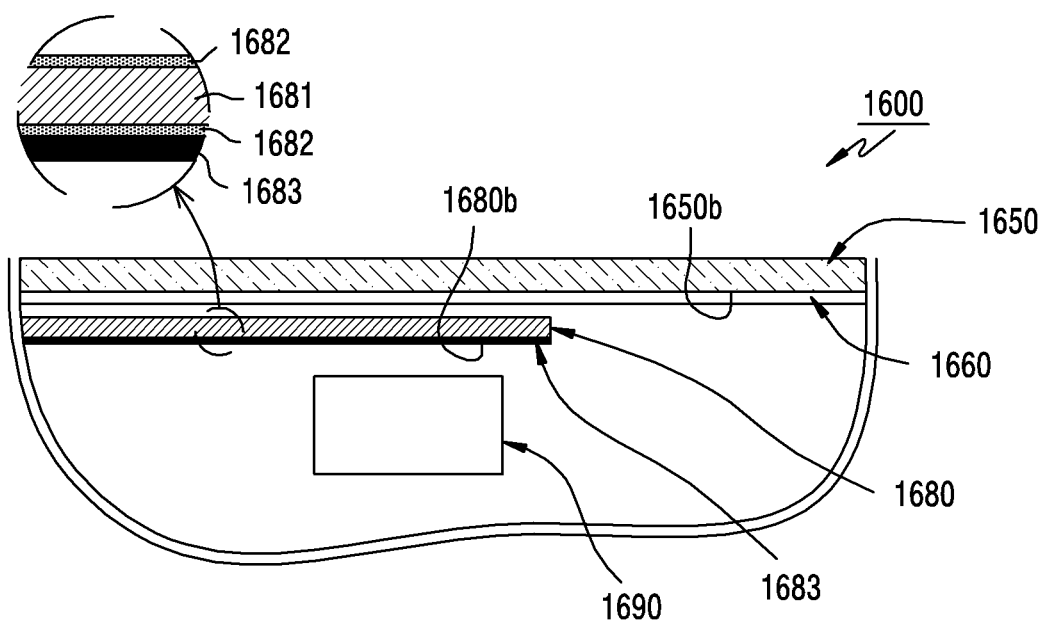
FIG. 16A is a cross-sectional view illustrating an example electronic device including a magnet in the unfolded state according to an embodiment.
Figure 16B:
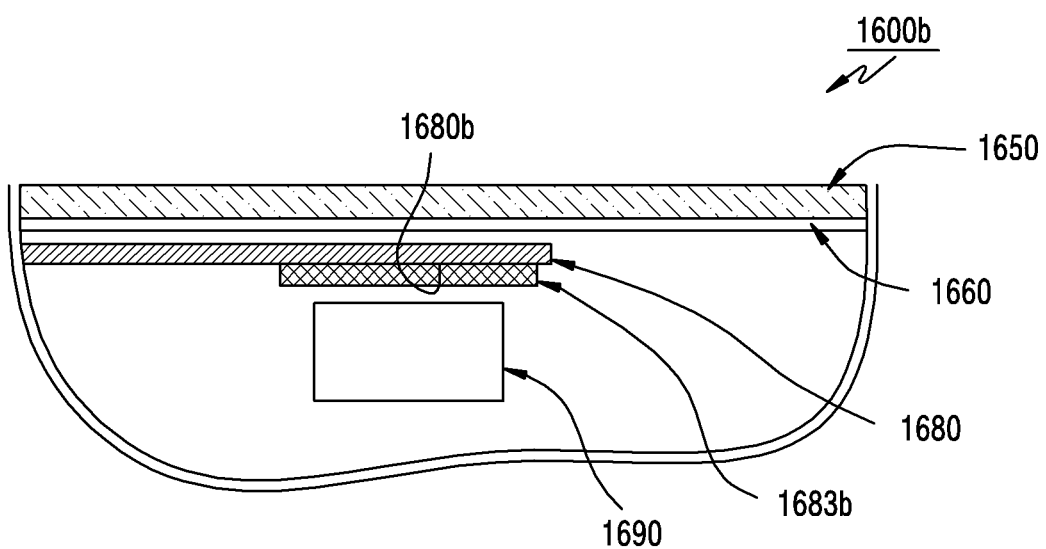
FIG. 16B is a cross-sectional view illustrating the example electronic device including a magnet in the unfolded state according to an embodiment.

FIG. 16A is a cross-sectional view illustrating an example electronic device including a magnet in the unfolded state according to an embodiment. FIG. 16B is a cross-sectional view illustrating the example electronic device including a magnet in the unfolded state according to an embodiment.

Referring to FIG. 16A, in an embodiment, the electronic device 1600 may include at least one of a display 1650, a digitizer 1660, a magnetic shield member 1680, a sheet 1683, and/or a magnet 1690. According to various embodiments, the electronic device 1600 may include the electronic device 20 in FIG. 2, the electronic device 50 in FIG. 5A, the electronic device 60 in FIG. 6A, the electronic device 70 in FIG. 7A, the electronic device 800 of FIG. 8A, the electronic device 1000 in FIG. 10A, the electronic device 1100 in FIG. 11A, the electronic device 1200 in FIG. 12A, the electronic device 1300 in FIG. 13A, or the electronic device 1400 in FIG. 14A.

According to an embodiment, the display 1650 is a flexible or foldable display, and may include, for example, the display 300 in FIG. 2, the display 550 in FIG. 5A, the display 650 in FIG. 6A, the display 750 in FIG. 7A, or the display 850 in FIG. 8A.

According to an embodiment, the digitizer 1660 may be coupled to or disposed adjacent to the rear face 160*b* of the display 1650, and may include, for example, the digitizer 560 in FIG. 5A, the digitizer 660 in FIG. 6A, the digitizer 760 in FIG. 7A, or the digitizer 860 in FIG. 8A.

According to an embodiment, in the state in which the electronic device 1600 is unfolded, the magnetic shield member 1680 may be located so as to overlap the magnet 1690 when viewed from above the display 1650. Although not illustrated, in the state in which the electronic device 1600 is folded (see FIG. 3), the magnetic shield member 1680 may be located so as not to overlap the magnet 1690 when viewed from above the second face (e.g., the second face 5002 in FIG. 5A).

According to various embodiments, the magnet 1690 may include the magnet 571 or 572 in FIG. 5A, the magnet 671 or 672 in FIG. 6A, the magnet 770 in FIG. 7A, the magnet 871 or 872 in FIG. 8A, the magnet 1091, 1092, 1093, or 1094 in FIG. 10A, the magnet 1192 or 1194 in FIG. 11A, the magnet 1129 or 1292 in FIG. 12A, the magnet 1391*a*, 1391*b*, 1392*a*, or 1392*b* in FIG. 13A, or the magnet 1491 or 1492 in FIG. 14A.

According to various embodiments, the magnetic shield member 1680 may include the magnetic shield member 581 or 582 in FIG. 5A, the magnetic shield member 680 in FIG. 6A, the magnetic shield member 780 in FIG. 7A, the magnetic shield member 881 or 882 in FIG. 8A, the magnetic shield member 1081 or 1082 in FIG. 10A, the magnetic shield member 1181 or 1182 in FIG. 11A, the magnetic shield member 1280 in FIG. 12A, the magnetic shield member 1380 in FIG. 13A, or the magnetic shield member 1480 in FIG. 14A.

According to an embodiment, the magnetic shield member 1680 may include a plate formed of a material capable of blocking magnetic force and a layer 1682 formed by coating the plate 1681 with a material such as epoxy. The layer 1682 may prevent and/or reduce oxidation of the plate 1681. For example, the layer 1682 may be formed through epoxy molding.

According to an embodiment, the sheet 1683 may be disposed on or may be attached to the rear face 1680*b* of the magnetic shield member 1680 that faces the magnet 1690. Referring to FIG. 16B, in various embodiments, the sheet 1683*b* may be disposed in an area of the rear face 1680*b* of the magnetic shield member 1680, which overlaps the magnet 1690 when viewed from the display 1650 in the state in which the electronic device 1600*b* is unfolded. Referring to FIGS. 16A and 16B, the magnetic shield member 1680 may be brought close to the magnet 1690 by magnetic force in the state in which the electronic device 1600 or 1600*b* is unfolded, but, between the magnetic shield member 1680 and the magnet 1690, the sheet 1683 or 1683*b* may prevent and/or avoid the magnetic shield member 1680 from coming into physical contact with the magnet 1690. According to an embodiment, the sheet 1683 or 1683*b* may prevent and/or reduce the magnetic shield member 1680 from being magnetized by the magnet 1690 in the state in which the electronic device 1600 or 1600*b* is unfolded. According to an embodiment, the sheet 1683 or 1683*b* may include an amorphous metal, such as amorphous ribbon, or a material such as polycarbonate or epoxy (e.g., an unmagnetized material). According to various embodiments, a layer may be formed to replace the sheet 1683 or 1683*b* by coating a material on the rear face 1680*b* of the magnetic shield member 1680.

Figure 17:
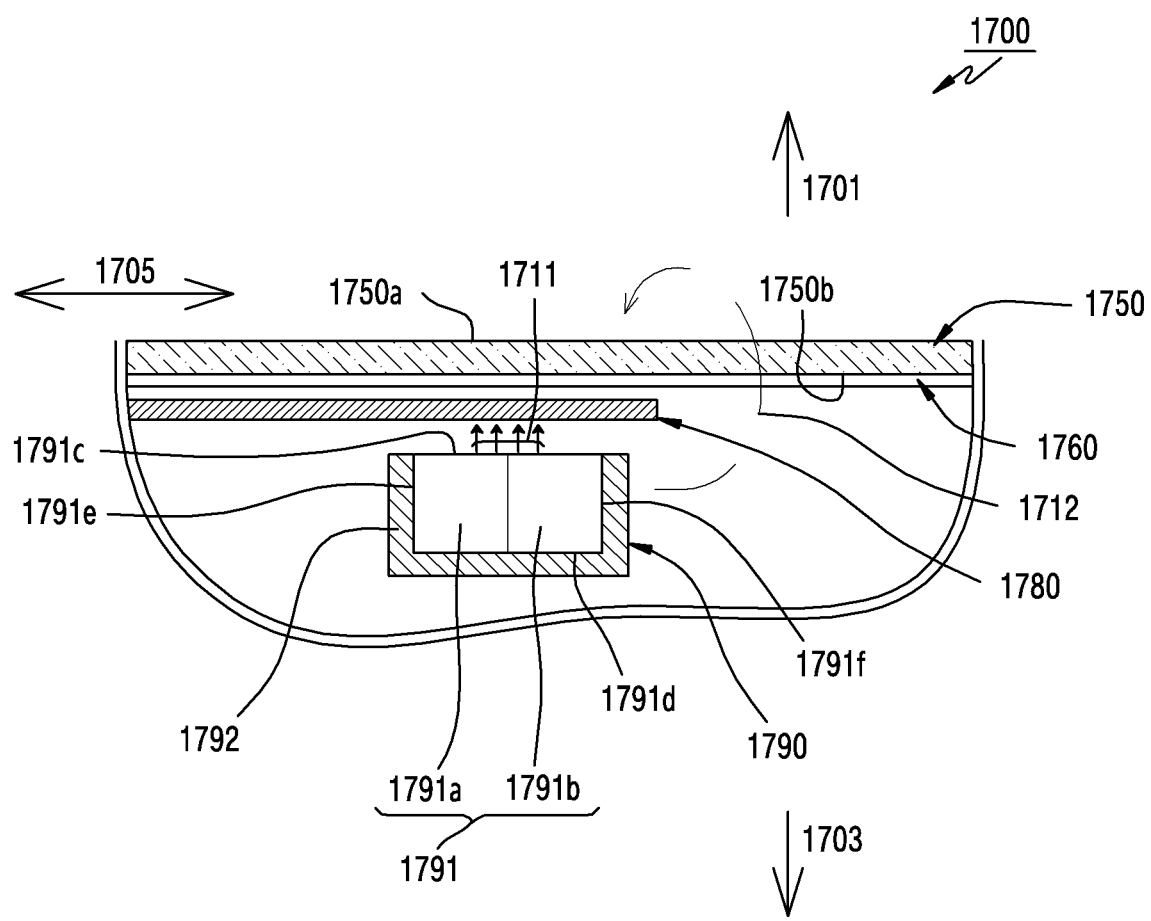
FIG. 17 is a cross-sectional view illustrating an example electronic device including a magnet in the unfolded state according to an embodiment.

FIG. 17 is a cross-sectional view illustrating an example electronic device including a magnet in the unfolded state according to an embodiment.

Referring to FIG. 17, in an embodiment, the electronic device 1700 may include at least one of a display 1750, a digitizer 1760, a magnetic shield member 1780, and/or a shield magnet 1790. According to various embodiments, the electronic device 1700 may include the electronic device 20 in FIG. 2, the electronic device 50 in FIG. 5A, the electronic device 60 in FIG. 6A, the electronic device 70 in FIG. 7A, the electronic device 800 in FIG. 8A, the electronic device 1000 in FIG. 10A, the electronic device 1100 in FIG. 11A, the electronic device 1200 in FIG. 12A, the electronic device 1300 in FIG. 13A, or the electronic device 1400 in FIG. 14A.

According to an embodiment, the display 1750 is a flexible or foldable display, and may include, for example, the display 300 in FIG. 2, the display 550 in FIG. 5A, the display 650 in FIG. 6A, the display 750 in FIG. 7A, or the display 850 in FIG. 8A.

According to an embodiment, the digitizer 1760 may be coupled to or disposed adjacent to the rear face 1750*b* of the display 1750, and may include, for example, the digitizer 560 in FIG. 5A, the digitizer 660 in FIG. 6A, the digitizer 760 in FIG. 7A, or the digitizer 860 in FIG. 8A.

According to an embodiment, in the state in which the electronic device 1700 is unfolded, the magnetic shield member 1780 may be located so as to overlap the magnet 1790 when viewed from above the display 1750. Although not illustrated, in the state in which the electronic device 1700 is folded (see FIG. 3), the magnetic shield member 1780 may be located so as not to overlap the magnet 1790 when viewed from above the second face (e.g., the second face 2002 in FIG. 2). According to various embodiments, the magnetic shield member 1780 may include the magnetic shield member 581 or 582 in FIG. 5A, the magnetic shield member 680 in FIG. 6A, the magnetic shield member 780 in FIG. 7A, the magnetic shield member 881 or 882 in FIG. 8A, the magnetic shield member 1081 or 1082 in FIG. 10A, the magnetic shield member 1181 or 1182 in FIG. 11A, the magnetic shield member 1280 in FIG. 12A, the magnetic shield member 1380 in FIG. 13A, or the magnetic shield member 1480 in FIG. 14A.

For example, the shield magnet 1790 may be a metal magnetic substance that gives directionality to magnetic force lines formed between the N pole 1791*a* and the S pole 1791*b* of the magnet 1791. According to an embodiment, the shield magnet 1790 may cause the magnetic force lines 1711 to be distributed in a first direction 1701 that a face 1750*a* (e.g., the first face 2001 or the third face 2003 in FIG. 2) formed by the display 1750 substantially faces. For example, in the state in which the electronic device 1700 is unfolded, the magnetic force 1711 emitted from the shield magnet 1790 in the first direction 1701 may have difficulty moving to the digitizer 1760 by being blocked by the magnetic shield member 1780.

According to an embodiment, the shield magnet 1790 may include a shield structure 1792 including the magnet 1791 and a ferromagnetic substance (e.g., iron) coupled to the magnet 1791. The magnet 1791 may include a first face 1791*c* that faces the first direction 1701, a second face 1791*d* that faces a second direction 1703 opposite the first direction 1701, and side faces (e.g., the third face 1791*e* and the fourth face 17910 that face a third direction orthogonal to the first direction 1701. According to an embodiment, the shield structure 1792 may cover the second face 1791*d*, the third face 1791*e*, and the fourth face 1791*f*, among the first face 1791*c*, the second face 1791*d*, the third face 1791*e*, and the fourth face 1791*f*. According to an embodiment, the N pole 1791*a* and the S pole 1791*b* of the magnet 1791 may be arranged in the third direction 1705. According to various embodiments, the positions of the N pole 1791*a* and the S pole 1791*b* of the magnet 1791 may be interchanged. The shield magnet 1790 may prevent and/or reduce magnetic force 1780 from passing over the magnetic shield member 1780. The shield magnet 1790 may cause magnetic force lines 1711 to be distributed in the first direction 1701, among the first direction 1701, the second direction 1702, and the third direction 1705.

According to various embodiments, the magnet 571 or 572 in FIG. 5A, the magnet 671 or 672 in FIG. 6A, the magnet 770 in FIG. 7A, the magnet 871 or 872 in FIG. 8A, the magnet 1091, 1092, 1093, or 1094 in FIG. 10A, the magnet 1192 or 1194 in FIG. 11A, the magnet 1129 or 1292 in FIG. 12A, the magnet 1391*a*, 1391*b*, 1392*a* or 1392*b* in FIG. 13A, the magnet 1491 or 1492 in FIG. 14A, or the magnet 1690 in FIG. 16A or FIG. 16B may include the shield magnet 1790 in FIG. 17.

Figure 18A:
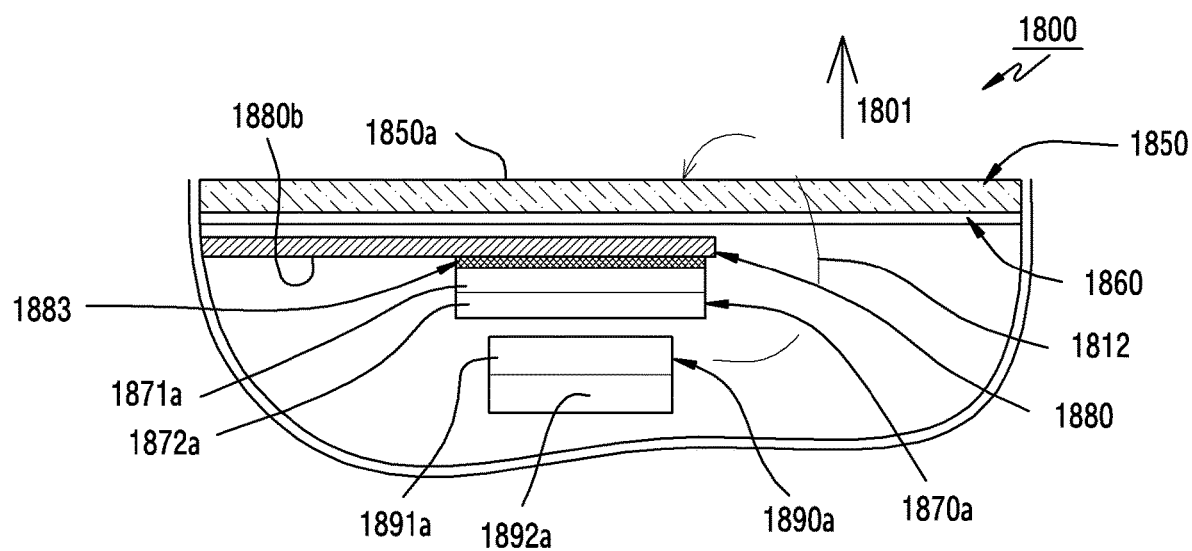
FIG. 18A is a cross-sectional view illustrating an example electronic device including a magnet in the unfolded state according to an embodiment.
Figure 18B:
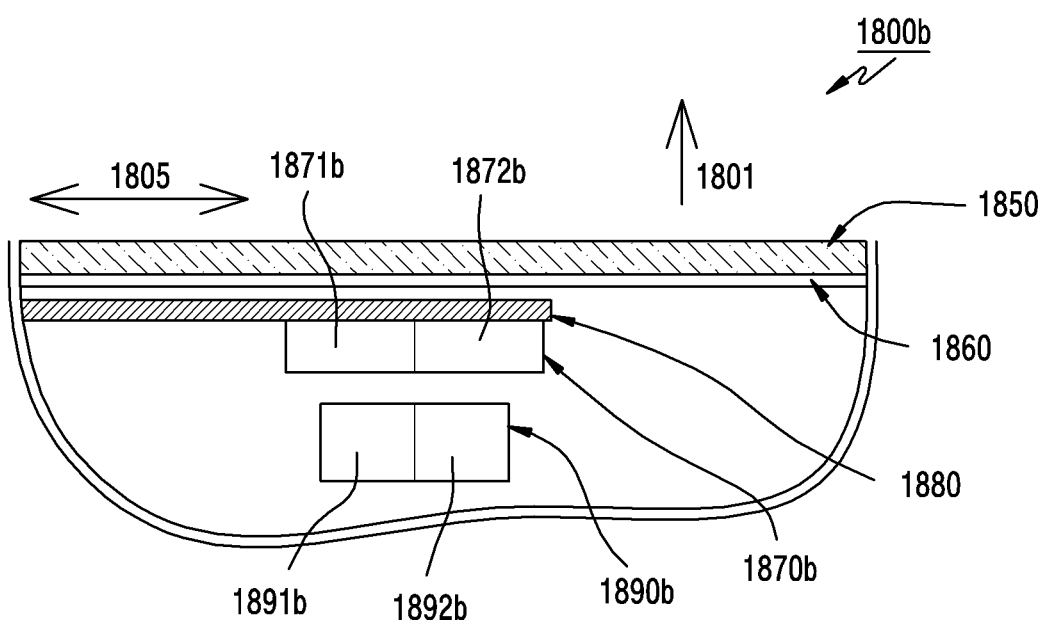
FIG. 18B is a cross-sectional view illustrating the example electronic device including a magnet in the unfolded state according to an embodiment.

FIG. 18A is a cross-sectional view illustrating an example electronic device including a magnet in the unfolded state according to an embodiment. FIG. 18B is a cross-sectional view illustrating the example electronic device including a magnet in the unfolded state according to an embodiment.

Referring to FIG. 18A, in an embodiment, an electronic device 1800 may include at least one of a display 1850, a digitizer 1860, a magnetic shield member 1880, a first magnet 1890*a*, and/or a second magnet 1870*a*. According to various embodiments, the electronic device 1800 may include the electronic device 20 in FIG. 2, the electronic device 50 in FIG. 5A, the electronic device 60 in FIG. 6A, the electronic device 70 in FIG. 7A, the electronic device 800 of FIG. 8A, the electronic device 1000 in FIG. 10A, the electronic device 1100 in FIG. 11A, the electronic device 1200 in FIG. 12A, the electronic device 1300 in FIG. 13A, or the electronic device 1400 in FIG. 14A.

According to an embodiment, the digitizer 1860 may be coupled to or disposed adjacent to the display 1850, and may include, for example, the digitizer 560 in FIG. 5A, the digitizer 660 in FIG. 6A, the digitizer 760 in FIG. 7A, or the digitizer 860 in FIG. 8A.

According to an embodiment, in the state in which the electronic device 1800 is unfolded, the magnetic shield member 1880 may be located so as to overlap the first magnet 1890*a* when viewed from above the display 1850. Although not illustrated, in the state in which the electronic device 1800 is folded (see FIG. 3), the magnetic shield member 1880 may be located so as not to overlap the first magnet 1890*a* when viewed from above the second face (e.g., the second face 2002 in FIG. 2). According to various embodiments, the magnetic shield member 1880 may include the magnetic shield member 581 or 582 in FIG. 5A, the magnetic shield member 680 in FIG. 6A, the magnetic shield member 780 in FIG. 7A, the magnetic shield member 881 or 882 in FIG. 8A, the magnetic shield member 1081 or 1082 in FIG. 10A, the magnetic shield member 1181 or 1182 in FIG. 11A, the magnetic shield member 1280 in FIG. 12A, the magnetic shield member 1380 in FIG. 13A, or the magnetic shield member 1480 in FIG. 14A.

According to an embodiment, the first magnet 1890*a* may include a first magnetic pole 1891*a* and a second magnetic pole 1892*a* arranged in a first direction 1801 that a face 1850a (e.g., the first face 2001 or the third face 2003 in FIG. 2) formed by the display 1850 faces. According to various embodiments, the first magnet 1890a may include the magnet 571 or 572 in FIG. 5A, the magnet 671 or 672 in FIG. 6A, the magnet 770 in FIG. 7A, the magnet 871 or 872 in FIG. 8A, the magnet 1091, 1092, 1093, or 1094 in FIG. 10A, the magnet 1192 or 1194 in FIG. 11A, the magnet 1129 or 1292 in FIG. 12A, the magnet 1391a, 1391b, 1392a, or 1392b in FIG. 13A, or the magnet 1491 or 1492 in FIG. 14A.

According to an embodiment, in the state in which the electronic device 1800 is unfolded, the magnetic shield member 1880 may be located so as to overlap the first magnet 1890a when viewed from above the display 1850. For example, in the state in which the electronic device 1800 is unfolded, the magnetic force emitted from the first magnet 1890a may have difficulty moving to the digitizer 1860 by being blocked by the magnetic shield member 1880.

According to an embodiment, in the state in which the electronic device 1800 is unfolded, the second magnet 1870a may be disposed between the magnetic shield member 1880 and the first magnet 1890a. For example, the second magnet 1870a may be disposed on the rear face 1880b of the magnetic shield member 1880, which faces the first magnet 1890a in the state in which the electronic device 1800 is unfolded. For example, the magnetic force emitted from the second magnet 1870a may have difficulty moving to the digitizer 1860 by being blocked by the magnetic shield member 1880. In the state in which the electronic device 1800 is unfolded, the second magnet 1870a may be aligned with or may face the first magnet 1890a. According to an embodiment, in the state in which the electronic device 1800 is unfolded, the magnetic force (or magnetic field) emitted from the first magnet 1890a may be canceled out by the magnetic force (or magnetic field) emitted from the second magnet 1870a. According to an embodiment, the second magnet 1870a may prevent and/or reduce magnetic force 1810 from passing over the magnetic shield member 1780.

According to various embodiments, the electronic device 1800 may include a layer 1883 formed of a nonmagnetic material (e.g., an amorphous metal such as amorphous ribbon, polycarbonate, or epoxy) and at least partially disposed between the magnetic shield member 1880 and the second magnet 1870a. The layer 1883 may be, for example, in the form of a sheet attachable to the magnetic shield member 1880 or the second magnet 1870a, or may be formed through coating. The layer 1883 may prevent and/or reduce the magnetic shield member 1880 from being magnetized by the second magnet 1870a.

According to various embodiments, the layer 1883 may not be limited to the form illustrated in FIG. 18A. For example, the nonmagnetic material may be disposed in at least one area of the magnetic shield member 1880 or the second magnet 1870a such that magnetic fields from the second magnet 1870a are not substantially distributed on the side of the magnetic shield member 1880. For example, the nonmagnetic material may be disposed in at least one area of the magnetic shield member 1880 or the second magnet 1870a such that magnetic fields from the second magnet 1870a are substantially distributed on the side of the first magnet 1890a in the state in which the electronic device 1800 is unfolded.

According to an embodiment, the second magnet 1870a may include a third magnetic pole 1187a and a fourth magnetic pole 1872a arranged in the first direction 1801. According to an embodiment, the first magnetic pole 1891a of the first magnet 1890a and the fourth magnetic pole 1872a of the second magnet 1870a may have the same polarity. The second magnetic pole 1892a of the first magnet 1890a and the third magnetic pole 1187a of the second magnet 1870a may have a polarity different from that of the first magnetic pole 1891a (or the fourth magnetic pole 1872a).

According to various embodiments, the first magnet 1890a of FIG. 18A may be replaced with the first magnet 1890b of FIG. 18B, and the second magnet 1870a of FIG. 18A may be replaced with the second magnet 1870b of FIG. 18B. Referring to FIG. 18B, the first magnet 1890b may include a first magnetic pole 1891b and a second magnetic pole 1892b arranged in a third direction 1805 orthogonal to the first direction 1801. The second magnet 1870a may include a third magnetic pole 1871b and a fourth magnetic pole 1872a arranged in the third direction 1805. According to an embodiment, the first magnetic pole 1891b and the third magnetic pole 1871b may have the same polarity, and the second magnetic pole 1892b and the third magnetic pole 1892b may have a polarity different from that of the first magnetic pole 1891b (or the fourth magnetic pole 1872b). According to various embodiments (not illustrated), a nonmagnetic material like the layer 1883 in FIG. 18A may be disposed in at least one area of the magnetic shield member 1880 or the second magnet 1870b such that magnetic fields from the second magnet 1870b are not substantially distributed on the side of the magnetic shield member 1880. According to various embodiments (not illustrated), a nonmagnetic material like the layer 1883 in FIG. 18A may be disposed in at least one area of the magnetic shield member 1880 or the second magnet 1870b such that magnetic fields from the second magnet 1870b are substantially distributed on the side of the first magnet 1890b in the state in which the electronic device 1800b is unfolded.

Figure 19A:
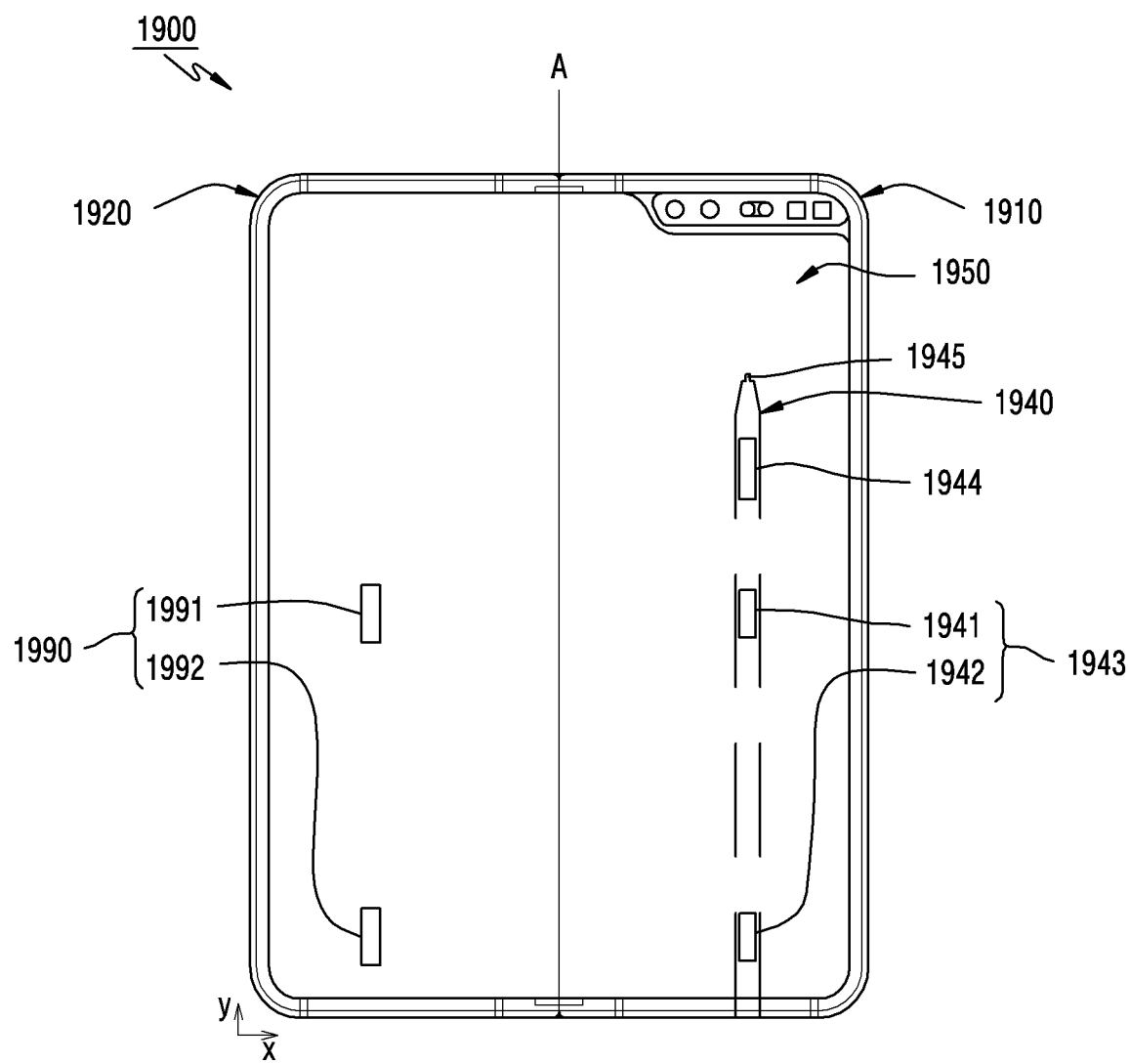
FIG. 19A is a diagram illustrating an example electronic device including a magnet in the unfolded state according to an embodiment.
Figure 19B:
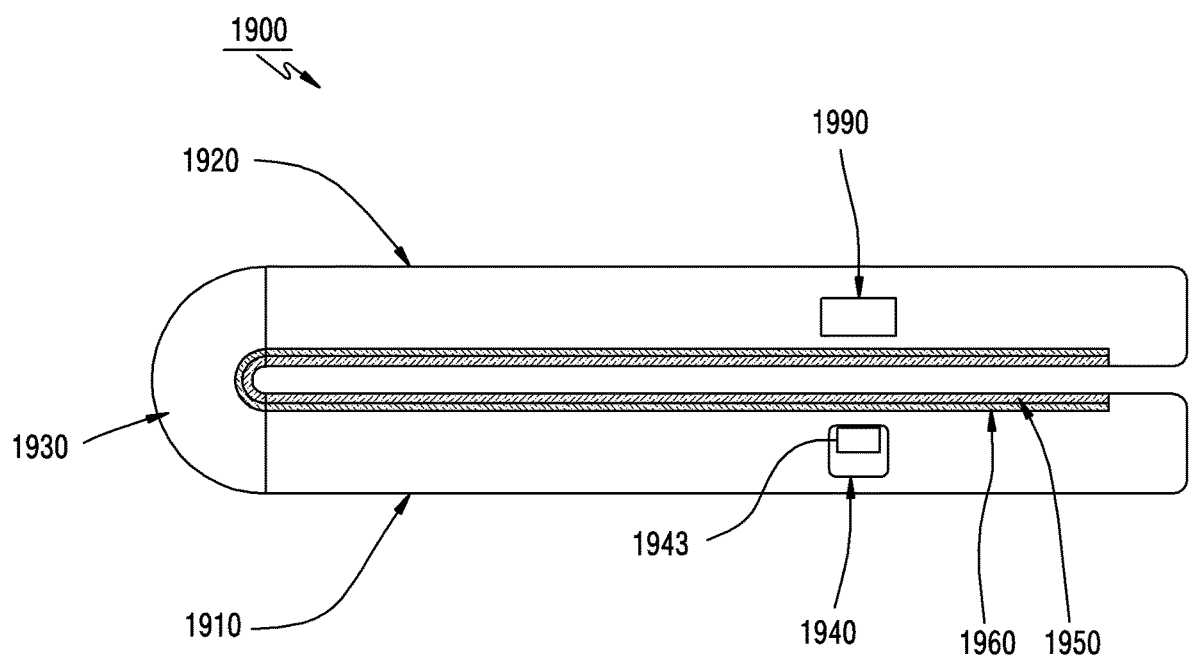
FIG. 19B is a diagram illustrating the example electronic device in the folded state according to an embodiment.

FIG. 19A is a diagram illustrating an example electronic device including a magnet in the unfolded state according to an embodiment. FIG. 19B is a diagram illustrating the example electronic device in the folded state according to an embodiment.

Referring to FIGS. 19A and 19B, in an embodiment, an electronic device 1900 (e.g., the electronic device 200 in FIG. 2) may include a first housing structure 1910, a second housing structure 1920, a hinge structure 1930, a display 1950, a digitizer 1960, an electronic pen 1940, and/or at least one magnetic member 1990.

According to an embodiment, the first housing structure 1910, the second housing structure 1920, the hinge structure 1930, the display 1950, and the digitizer 1960 are substantially similar to or the same as those in FIG. 5A, and thus detailed descriptions thereof may not be repeated here.

According to an embodiment, one or more magnetic members 1990 may be disposed in the second housing structure 1920. For example, the one or more magnetic members 1990 may include a first magnetic member 1991 and/or a second magnetic member 1992, which are disposed at substantially the same distance from the folding axis A. According to an embodiment, the one or more magnetic members 1990 may include a material (e.g., iron (Fe)) that is magnetized by a magnetic field formed from a magnet, rather than independently forming a magnetic force.

According to an embodiment, the electronic pen 1940 may include one or more magnets 1943 (e.g., a first magnet 1941 and a second magnet 1942). When the electronic pen 1940 is inserted into the first housing structure 1910 and the electronic device 1900 is folded, the first magnetic member 1991 and the first magnet 1941 may be disposed to be aligned with or to face each other, and the second magnetic member 1992 and the second magnet 1942 may be disposed to be aligned with or to face each other. The folded state of the electronic device 1900 may be maintained by the attraction force between the first magnetic member 1991 and the first magnet 1941 and the attraction force between the second magnetic member 1992 and the second magnet 1942. According to various embodiments, the number of magnets included in the electronic pen 1940 may vary, and is not limited to what is illustrated in FIG. 19A, and thus the number of magnetic members disposed in the second housing 1920 may also vary.

According to an embodiment, the electronic pen 1940 may include a resonance circuit 1944. The resonance circuit 1944 may include an element such as an inductor (e.g., a coil for electromagnetic resonance operation) or a capacitor, may generate current through interaction (e.g., electromagnetic induction) with the digitizer 1960, and may form a magnetic field using the generated current.

According to an embodiment, the one or more magnets 1943 may be disposed farther from the pen tip 1945 than the resonance circuit 1944. For example, the resonance circuit 1944 may be disposed between the one or more magnets 1943 and the pen tip 1945. This arrangement may reduce the influence of the magnetic field from the one or more magnets 1943 on the interaction between the resonance circuit 1944 and the digitizer 1960.

According to various embodiments (not illustrated), the first magnetic member 1991 or the second magnetic member 1992 may include a magnet. In this case, the electronic device 1900 may include at least one first magnetic shield member (not illustrated) corresponding to the first magnetic member 1991 and/or the second magnetic member 1992 including a magnet. In the state in which the electronic device 1900 is unfolded, the first magnetic shield member may be located so as to overlap the first magnetic member 1991 and/or the second magnetic member 1992 including a magnet, when viewed from above the display 1950. In the state in which the electronic device 1900 is folded, the first magnetic shield member may be located so as not to overlap the first magnetic member 1991 or the second magnetic member 1992, including a magnet, when viewed from above the fourth face (e.g., the fourth face 2004 in FIG. 2).

According to various embodiments (not illustrated), the electronic device 1900 may include at least one second magnetic shield member corresponding to the first magnet 1941 and/or the second magnet 1942. In the state in which the electronic device 1900 is unfolded, the second magnetic shield member may be located so as to overlap the first magnet 1941 and/or the second magnet 1942 of the electronic pen 1940 inserted into the electronic device 1950 when viewed from above the display 1950. In the state in which the electronic device 1900 is folded, the second magnetic shield member may be located so as not to overlap the first magnet 1941 or the second magnet 1942 when viewed from above the second face (e.g., the second face 2002 in FIG. 2).

According to various embodiments, the first magnetic shield member or the second magnetic shield member may include, for example, the magnetic shield member 581 or 582 in FIG. 5A, the magnetic shield member 680 in FIG. 6A, the magnetic shield member 780 in FIG. 7A, the magnetic shield member 880 in FIG. 8A, the magnetic shield member 1081 or 1082 in FIG. 10A, the magnetic shield member 1181 or 1182 in FIG. 11A, the magnetic shield member 1280 in FIG. 12A, the magnetic shield member 1380 in FIG. 13A, or the magnetic shield member 1480 in FIG. 14A.

According to various embodiments, at least one of the first magnetic member 1991, the second magnetic member 1992, the first magnet 1941, and the second magnet 1942 may include a shield magnet (e.g., the shield magnet 1790 in FIG. 17).

According to various embodiments, an embodiment in which an electronic pen 1940 including one or more magnets 1943 is disposed in the second housing structure 1920 and the one or more magnetic members 1990 are disposed in the first housing structure 1910 may also be possible.

Figure 20:
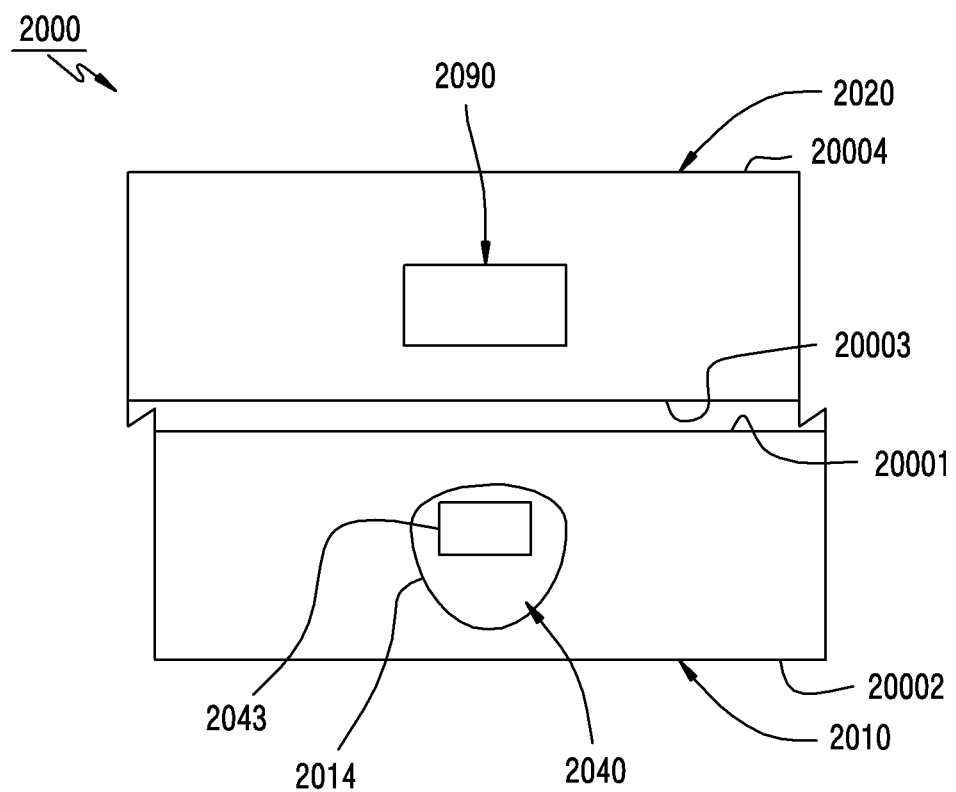
FIG. 20 is a diagram illustrating an example electronic device including a magnet in the folded state according to an embodiment.

FIG. 20 is a diagram illustrating an example electronic device including a magnet in the folded state according to an embodiment.

According to an embodiment, an electronic device 2000 may include a first housing structure 2010 and a second housing structure 2020. For example, the first housing structure 2010 may include a first face 20001 (e.g., the first face 2001 in FIG. 2) and a second face 20002 (e.g., the second face in FIG. 2), which face away from each other. For example, the second housing structure 2020 may include a third face 20003 (e.g., the third face 2003 in FIG. 2) and a fourth face 20004 (e.g., the fourth face in FIG. 2), which face away from each other. In the state in which the electronic device 2000 is folded, the first face 20001 and the third face 20003 may face each other. According to an embodiment (not illustrated), the electronic device 2000 may include a display (e.g., the display 300 in FIG. 2) and/or a digitizer (e.g., the digitizer 660 in FIG. 6A) extending from the first face 20001 to the third face 20003.

Referring to FIG. 20, in the state in which the electronic device 2000 is folded, when viewed from above the second face 20002, one or more magnets 2090 (e.g., the one or more magnets 1990 in FIG. 19B) disposed in the second housing structure 2020 may overlap one or more magnets 2043 (e.g., the one or more magnets 1943 in FIG. 19B) provided in an electronic pen 2040 (e.g., the electronic pen 1940 in FIG. 19B) inserted into the first housing structure 2010 (e.g., the first housing structure 1910 in FIG. 19B). According to an embodiment, a pen hole 2014 (e.g., the pen hole 247 in FIG. 2) provided in the first housing structure 2010 may be formed based on the shape of the electronic pen 2040 when viewed in the direction in which the electronic pen 2040 is inserted.

In an embodiment, when the electronic pen 2040 is inserted into the first housing 2010, the magnetic force generated by the one or more magnets 2043 included in the electronic pen 2040 in the state in which the electronic device 2000 is folded may be directed to one or more magnets 2090 included in the second housing structure 2020.

Figure 21:
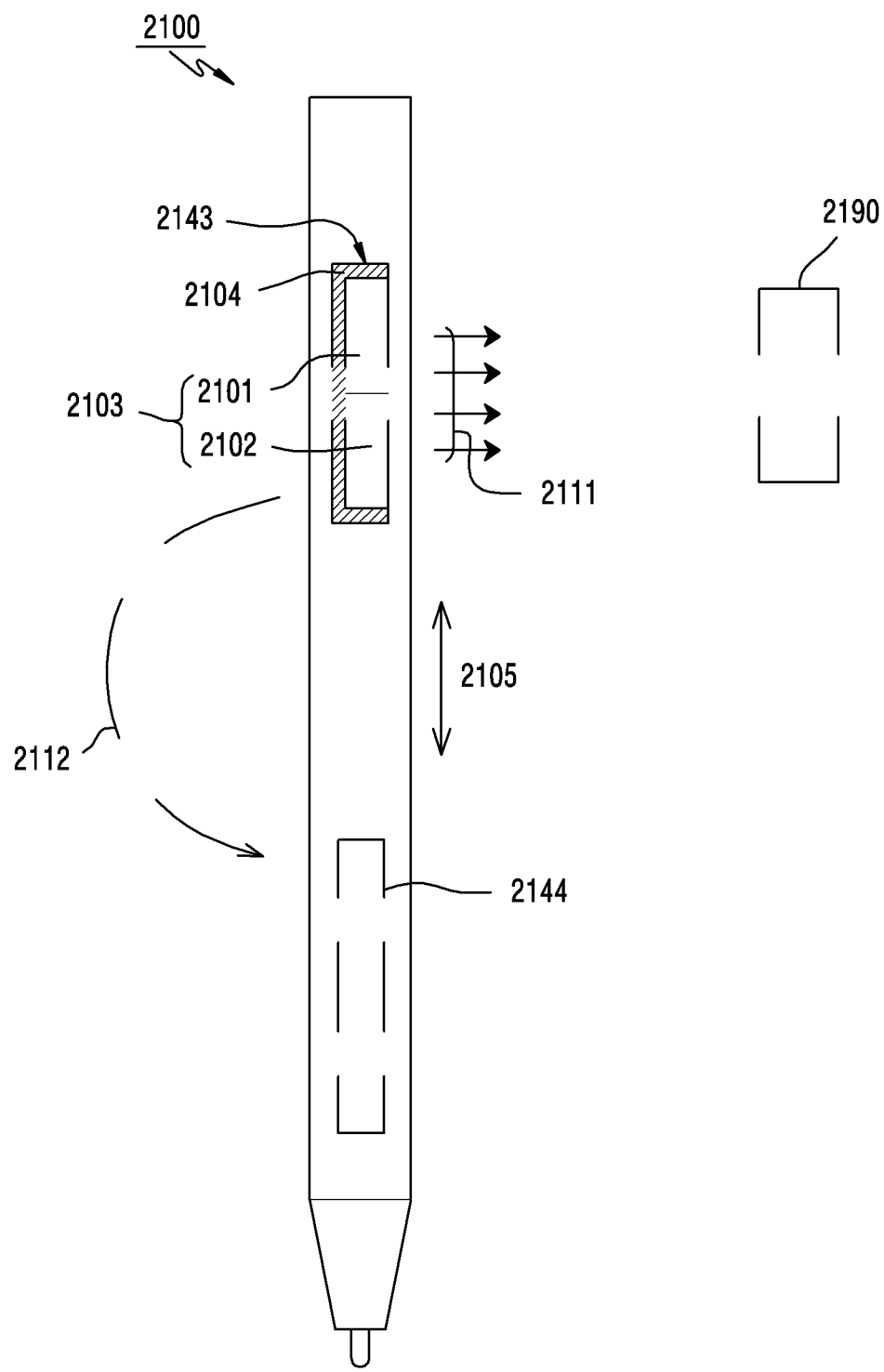
FIG. 21 is a diagram illustrating an example electronic pen including a shield magnet according to an embodiment.

FIG. 21 is a diagram illustrating an example electronic pen including a shield magnet according to an embodiment.

Referring to FIG. 21, in an example embodiment, a shield magnet 2143 (e.g., the one or more magnets 1943 in FIG. 19A or the one or more magnets 2043 in FIG. 20) included in an electronic pen 2100 (e.g., the electronic pen 1940 of FIG. 19A or the electronic pen 2040 in FIG. 20) may include a magnet 2103 including an N pole 2101 and an S pole 2102, arranged in the longitudinal direction 2105 of the electronic pen 2100, and a shield structure 2104 including a ferromagnetic substance coupled to the magnet 2103. According to various embodiments, the positions of the N pole 2101 and the S pole 2102 of the magnet 1791 may be interchanged. The shield magnet 2143 may give directionality to magnetic force lines formed between the N pole 2101 and the S pole 2102.

According to an embodiment of the disclosure, in the state in which the electronic device (e.g., the electronic device 20 in FIG. 2) into which the electronic pen 2100 is inserted is folded, the shield magnet 2143 may substantially cause magnetic force lines 2111 to be distributed toward the magnet 2190 (e.g., the one or more magnets in FIG. 19B or the one or more magnets 2090 in FIG. 20) of the electronic device.

According to an embodiment, the shield magnet 2143 may prevent and/or reduce the magnetic force lines 2112 from being distributed toward the resonance circuit 2144 (e.g., the resonance circuit 1944 in FIG. 19A). The shield magnet 2143 may reduce the magnetic influence on the resonance circuit 2144.

According to an example embodiment, an electronic device (e.g., the electronic device 50 in FIG. 5A) may include a foldable housing (e.g., the foldable housing 500 in FIG. 5B). The foldable housing may include: a hinge (e.g., the hinge structure 530 in FIG. 5A); a first housing (e.g., the first housing structure 510 in FIG. 5A) connected to the hinge and including a first face (e.g., the first face 5001 in FIG. 5A) facing a first direction (e.g., the first direction 501 in FIG. 5A) and a second face (e.g., the second face 5002 in FIG. 5A) facing a second direction (e.g., the second direction 502 in FIG. 5A) opposite the first direction; and a second housing (e.g., the second housing structure 520 in FIG. 5A) connected to the hinge and including a third face (e.g., the third face 5003 in FIG. 5A) facing a third direction (e.g., the third direction 503 in FIG. 5A) and a fourth face (e.g., the fourth face 5004 in FIG. 5A) facing a fourth direction (e.g., the fourth direction 504 in FIG. 5D) opposite the third direction, the second housing configured to be folded relative to the first housing about the hinge. In the folded state (see, e.g., FIG. 5B), the first face may face the third face, and in the unfolded state (see, e.g., FIG. 5A), the third direction may be the same as the first direction. The electronic device may include a display (e.g., the display 650 in FIG. 5A) including a first portion (e.g., the first portion 651 in FIG. 5A) and a second portion (e.g., the second portion 652 in FIG. 5A) extending from the first face to the third face to form the first face and the third face, respectively. The electronic device may include a digitizer (e.g., the digitizer 660 in FIG. 5A) including a third portion (e.g., the third portion 661 in FIG. 5A) disposed between the first portion of the display and the second face and a fourth portion (e.g., the fourth portion 662 in FIG. 5A) disposed between the second portion of the display and the fourth face. The electronic device may include a first magnet (e.g., the first magnet 571 in FIG. 5A) disposed in the first housing to overlap the third portion of the digitizer when viewed from above the second face. The electronic device may include a second magnet (e.g., the second magnet 572 in FIG. 5A) disposed in the second housing to overlap the fourth portion of the digitizer when viewed from above the fourth face and to face the first magnet in the folded state. The electronic device may include a first magnetic shield (e.g., the first magnetic shield member 581 in FIG. 5A) fixed to the hinge and at least partially disposed in the first housing, the first magnetic shield configured to be movable relative to the first magnet wherein, when viewed from above the second face, the first magnetic shield does not overlap the first magnet in the folded state, and overlaps the first magnet in the unfolded state. The electronic device may include a second magnetic shield (e.g., the second magnetic shield member 582 in FIG. 5A) fixed to the hinge and at least partially disposed in the second housing, the second magnetic shield configured to be movable relative to the second magnet wherein, when viewed from above the fourth face, the second magnetic shield member does not overlap the second magnet in the folded state, and overlaps the second magnet in the unfolded state.

According to various example embodiments, the first magnetic shield (e.g., the first magnetic shield member 581 in FIG. 5A) and the second magnetic shield (e.g., the second magnetic shield member 582 in FIG. 5A) may be connected to each other.

According to an example embodiment, the first magnetic shield (e.g., the first magnetic shield member 581 in FIG. 5A) may include a first plate extending from one end portion of the first magnetic shield connected to the hinge to another end portion of the first magnetic shield disposed in the first housing.

According to an example embodiment, the second magnetic shield (e.g., the second magnetic shield member 582 in FIG. 5A) may include a second plate extending from one end portion of the second magnetic shield connected to the hinge to another end portion of the second magnetic shield disposed in the second housing.

According to an example embodiment, the first housing (e.g., the first housing structure 810 in FIG. 8A) may include a first support (e.g., the first support member 814 in FIG. 8A) disposed between the third portion (e.g., the third portion 861 in FIG. 8A) of the digitizer and the second face (e.g., the second face 2002 in FIG. 2). The second housing (e.g., the second housing structure 820 in FIG. 8B) may include a second support (e.g., the second support member 824 in FIG. 8A) disposed between the fourth portion (e.g., the fourth portion 862 in FIG. 8A) of the digitizer and the fourth face (e.g., the fourth face 2004 in FIG. 2). A portion (e.g., the first extension 881 in FIG. 8A) of the first plate may be disposed between the first support and the third portion of the digitizer. A portion (e.g., the second extension 882 in FIG. 8A) of the second plate may be disposed between the second support and the fourth portion of the digitizer.

According to an example embodiment, the first magnet (e.g., the first magnet 871 in FIG. 8A) may be disposed between the first support (e.g., the first support member 814 in FIG. 8A) and the second face (e.g., the second face 2002 in FIG. 2). The second magnet (e.g., the second magnet 872 in FIG. 8A) may be disposed between the second support (e.g., the second support member 824 in FIG. 8A) and the fourth face (e.g., the fourth face 2004 in FIG. 2).

According to an example embodiment, the electronic device may further include a first through hole (e.g., the through hole 8811 in FIG. 8A) in an end of the first plate disposed in the first housing (e.g., the first housing structure 810 in FIG. 8A) and a first slit (e.g., the slit 8142 in FIG. 8A) in the first support. The electronic device may further include a first lever (e.g., the first link 8911 in FIG. 8A) disposed between the second face (e.g., the second face 2002 in FIG. 2) and the first support (e.g., the first support member 814 in FIG. 8A). The first lever may include a first joint (e.g., the first joint 891*a* in FIG. 8A), rotatably coupled to the first support, and a second joint (e.g., the second joint 891*b* in FIG. 8A), rotatably connected to a pin (e.g., the pin 891*d* in FIG. 8A) passing through the first through hole and the first slit.

According to an example embodiment, the electronic device may further include a second through hole (e.g., the through hole 8821 in FIG. 8A), in an end of the second plate disposed in the second housing (e.g., the second housing structure 820 in FIG. 8A), and a second slit (e.g., the slit 8242 in FIG. 8A) in the second support. The electronic device may further include a second lever (e.g., the second link 8921 in FIG. 8A) disposed between the fourth face (e.g., the fourth face 2004 in FIG. 2) and the second support (e.g., the second support member 824 in FIG. 8A). The second lever may include a third joint (e.g., the third joint 892*a* in FIG. 8A), rotatably coupled to the second support, and a fourth joint (e.g., the fourth joint 892*b* in FIG. 8A), rotatably connected to a pin (e.g., the pin 892*d* in FIG. 8A) passing through the second through hole and the second slit.

According to an example embodiment, the first plate and the second plate may include a single plate (e.g., the magnetic shield member 680 in FIG. 6A or the magnetic shield member 1081 or 1082 in FIG. 10A) including the same material.

According to an example embodiment, the electronic device may include an unmagnetized material sheet (e.g., the sheet 1683 in FIG. 16A or the sheet 1683*b* in FIG. 16B) attached to the first magnetic shield (e.g., the first magnetic shield member 581 in FIG. 5A) or the second magnetic shield (e.g., the second magnetic shield member 582 in FIG. 5A). The sheet may be attached to the first magnetic shield (e.g., the electromagnetic shield member 1680 in FIG. 16A or 16B) to face and overlap the first magnet (e.g., the magnet 1690 in FIG. 16A or 16B) in the unfolded state when viewed from above the second face (e.g., the second face 5002 in FIG. 5A). The sheet may be attached to the second magnetic shield (e.g., the electromagnetic shield member 1680 in FIG. 16A or 16B) to face and overlap the second magnet (e.g., the magnet 1690 in FIG. 16A or 16B) in the unfolded state when viewed from above the fourth face (e.g., the fourth face 5004 in FIG. 5B).

According to an example embodiment, the electronic device may include a third magnet (e.g., the second magnet 1870*a* in FIG. 18A or the second magnet 1870*b* in FIG. 18B) attached to the first magnetic shield (e.g., the first magnetic shield member 581 in FIG. 5A). The third magnet may be attached to the first magnetic shield (e.g., the electromagnetic shield member 1880 in FIG. 18A or 18B) to face and overlap the first magnet (e.g., the first magnet 1890*a* in FIG. 18A or the first magnet 1890*b* in FIG. 18B) in the unfolded state when viewed from above the second face (e.g., the second face 5002 in FIG. 5A). The electronic device may include a fourth magnet (e.g., the second magnet 1870*a* in FIG. 18A or the second magnet 1870*b* in FIG. 18B) attached to the second magnetic shield (e.g., the second magnetic shield member 582 in FIG. 5A). The fourth magnet may be attached to the second magnetic shield (e.g., the electromagnetic shield member 1880 in FIG. 18A or 18B) to face and overlap the second magnet (e.g., the first magnet 1890*a* in FIG. 18A or the first magnet 1890*b* in FIG. 18B) in the unfolded state when viewed from above the fourth face (e.g., the fourth face 5004 in FIG. 5B).

According to an example embodiment, the electronic device may include a first ferromagnetic structure comprising a ferromagnetic material (e.g., the structure 1792 in FIG. 17) covering at least a part of a face (e.g., the second face 1791*d*, the third face 1791*e*, or the fourth face 1791*f* in FIG. 17) of the first magnet other than the face (e.g., the first face 1791*c* in FIG. 17) facing the first direction. The electronic device may further include a second ferromagnetic structure comprising a ferromagnetic material (e.g., the structure 1792 in FIG. 17) covering at least a part of a face (e.g., the second face 1791*d*, the third face 1791*e*, or the fourth face 1791*f* in FIG. 17) of the first magnet other than a face (e.g., the first face 1791*c* in FIG. 17) facing the third direction.

According to an example embodiment, the north (N) and south (S) poles of the first magnet (e.g., the first magnet 571 in FIG. 5A) may be arranged in a direction orthogonal to the first direction (e.g., the first direction 501 in FIG. 5A), and the N and S poles of the second magnet (e.g., the second magnet 572 in FIG. 5A) may be arranged in a direction orthogonal to the third direction (e.g., the third direction 503 in FIG. 5A).

According to an example embodiment, the electronic device (e.g., the electronic device 70 in FIG. 7A) may include a foldable housing (e.g., the foldable housing 700 in FIG. 7B). The foldable housing may include: a hinge (e.g., the hinge structure 730 in FIG. 7A); a first housing (e.g., the first housing structure 710 in FIG. 7A) connected to the hinge and including a first face (e.g., the first face 7001 in FIG. 7A) facing a first direction and a second face (e.g., the second face 7002 in FIG. 7A) facing a second direction opposite the first direction; and a second housing (e.g., the second housing structure 720 in FIG. 7A) connected to the hinge and including a third face (e.g., the third face 7003 in FIG. 7A) facing a third direction and a fourth face (e.g., the fourth face 7004 in FIG. 7A) facing a fourth direction opposite the third direction, the second housing configured to be folded relative to the first housing about the hinge. In the folded state (see FIG. 7B), the first face may face the third face, and in the unfolded state (see FIG. 7A), the third direction may be the same as the first direction. The electronic device may include a display (e.g., the display 750 in FIG. 7A) including a first portion (e.g., the first portion 751 in FIG. 7A) and a second portion (e.g., the second portion 752 in FIG. 7A) extending from the first face to the third face to form the first face and the third face, respectively. The electronic device may include a digitizer (e.g., the digitizer 760 in FIG. 7A) including a third portion (e.g., the third portion 761 in FIG. 7A) disposed between the first portion of the display and the second face and a fourth portion (e.g., the fourth portion 762 in FIG. 7A) disposed between the second portion of the display and the fourth face. The electronic device may include a magnet (e.g., the magnet 770 in FIG. 7A) disposed in the second housing to overlap the fourth portion of the digitizer when viewed from above the fourth face. The electronic device may include a magnetic shield (e.g., the magnetic shield member 780 in FIG. 7A) fixed to the hinge and at least partially disposed in the second housing. The magnetic shield may be configured to be movable relative to the magnet wherein, when viewed from above the fourth face, the magnetic shield does not overlap the magnet in the folded state, and overlaps the magnet in the unfolded state.

According to an example embodiment, the electronic device may include a magnetic member comprising a magnetic material at least partially disposed in the first housing and disposed to overlap the magnet in the folded state when viewed from above the second face.

According to an example embodiment, the magnetic member may include a portion (e.g., the fifth portion 781 in FIG. 7A) of the magnetic shield (e.g., the magnetic shield member 780 in FIG. 7A) extending to the first housing.

According to an example embodiment, the magnetic shield (e.g., the second magnetic shield member 582 in FIG. 5A) may include a plate extending from one end portion of the magnetic shield (e.g., the first end portion 582*a* in FIG. 5A) connected to the hinge to another end portion of the magnetic shield (e.g., the second end portion 582*b* in FIG. 5A) disposed in the second housing.

According to an example embodiment, the second housing (e.g., the second housing structure 820 in FIG. 8A) may include a support (e.g., the second support member 824 in FIG. 8A) disposed between the fourth portion (e.g., the fourth portion 862 in FIG. 8A) of the digitizer and the fourth face (e.g., the fourth face 2004 in FIG. 2). A portion of the plate (e.g., the magnetic shield member 780 in FIG. 7A) may be disposed between the support and the fourth portion of the digitizer. The magnet (e.g., the magnet 770 in FIG. 7A) may be disposed between the support and the fourth face.

According to an example embodiment, the electronic device may further include: a through hole (e.g., the through hole 8821 in FIG. 8A) in an end of the plate disposed in the second housing (e.g., the second housing structure 820 in FIG. 8A), a slit (e.g., the slit 8242 in FIG. 8A) provided in the support, and a lever (e.g., the second link 8921 in FIG. 8A) disposed between the fourth face (e.g., the fourth face 2004 in FIG. 8A) and the support (e.g., the second support member 824 in FIG. 8A). The lever may include a first joint (e.g., the third joint 892a in FIG. 8A), rotatably coupled to the support, and a second joint (e.g., the fourth joint 892b in FIG. 8A), rotatably connected to a pin (e.g., the pin 892d in FIG. 8A) passing through the through hole and the slit.

According to an example embodiment, the electronic device may include a ferromagnetic substance comprising a ferromagnetic material (e.g., the structure 1792 including a ferromagnetic substance in FIG. 17) covering at least a part of a face (e.g., the second face 1791d, the third face 1791e, or the fourth face 1791f in FIG. 17) of the magnet other than a face (e.g., the first face 1791c in FIG. 17) facing the third direction (e.g., the first direction 1701 in FIG. 17).

According to an example embodiment, the magnet (e.g., the magnet in FIG. 7A) may include a magnet (e.g., one or more magnets 1943 in FIG. 19A) disposed in an electronic pen configured to be accommodated in the second housing.

According to an example embodiment, the electronic device (e.g., the electronic device 20 in FIG. 2) may include a foldable housing (e.g., the foldable housing 200 in FIG. 2). The foldable housing may include: a hinge (the hinge structure 900 in FIG. 9A); a first housing (e.g., the first housing structure 210 in FIG. 2) connected to the hinge and including a first face (e.g., the first face 2001 in FIG. 2) facing a first direction (e.g., the first direction 201 in FIG. 2) and a second face (e.g., the second face 2002 in FIG. 2) facing a second direction (e.g., the second direction 202 in FIG. 2) opposite the first direction; and a second housing (e.g., the second housing structure 220 in FIG. 2) connected to the hinge and including a third face (e.g., the third face 2003 in FIG. 2) facing a third direction (e.g., the third direction 203 in FIG. 2) and a fourth face (e.g., the fourth face 2004 in FIG. 2) facing a fourth direction (e.g., the fourth direction 204 in FIG. 2) opposite the third direction, the second housing configured to be folded relative to the first housing about the hinge. In the folded state (see FIG. 3), the first face may face the third face, and, in the unfolded state (see FIG. 2), the third direction may be the same as the first direction. The electronic device may include a display (e.g., the display 300 in FIG. 2) including a first portion (e.g., the first portion 301 in FIG. 2) and a second portion (e.g., the second portion 302 in FIG. 2) extending from the first face to the third face to form the first face and the third face, respectively. The electronic device may include a digitizer including a third portion disposed between the first portion of the display and the second face and a fourth portion disposed between the second portion of the display and the fourth face. The electronic device may include a magnet (e.g., the magnet 1291 in FIG. 12A) disposed in the first housing to overlap the third portion of the digitizer when viewed from above the second face. The electronic device may include an electronic pen (e.g., the electronic pen 1250 in FIG. 12A) insertable into a space (e.g., the space 1211a in FIG. 12A) provided in the first housing. The electronic device may include a magnetic shield (e.g., the magnetic shield member 1280 in FIG. 12a) disposed in the first housing. The magnetic shield configured to be elastically movable or rotatable wherein, when viewed from above the second face, the magnetic shield is located at a first position at which the magnetic shield does not overlap the magnet or at a second position at which the magnetic shield overlaps the magnet. The electronic device may include a shaft (e.g., the shaft 1240 in FIG. 12A) including one end portion connected to the magnetic shield and another end portion extending from the one end portion to the space. When the electronic pen is inserted into the space, the shaft may move or rotate the magnetic shield to the first position by being pressed by the electronic pen (see FIG. 12A, FIG. 12B, FIG. 13A, FIG. 13B, FIG. 14A, or FIG. 14B).

Various example embodiments of the disclosure described in the disclosure and illustrated in the drawings are only examples, and are not intended to limit the scope of the disclosure. Therefore, the scope of the disclosure should be understood to include various changes in form and detail without departing from the spirit scope of the disclosure, including the appended claims and their equivalents.

What is claimed is:

1. An electronic device comprising:
  a foldable housing including:
    a hinge;
    a first housing connected to the hinge and including a first face facing a first direction, and a second face facing a second direction opposite the first direction; and
    a second housing connected to the hinge and including a third face facing a third direction, and a fourth face facing a fourth direction opposite the third direction, the second housing configured to be folded relative to the first housing about the hinge, wherein, in a folded state, the first face faces the third face, and, in an unfolded state, the third direction is identical to the first direction;
  a display including a first portion and a second portion extending from the first face to the third face to form the first face and the third face, respectively;
  a digitizer including a third portion disposed between the first portion of the display and the second face and a fourth portion disposed between the second portion of the display and the fourth face;
  a first magnet disposed in the first housing to overlap the third portion of the digitizer when viewed from above the second face;
  a second magnet disposed in the second housing to overlap the fourth portion of the digitizer when viewed from above the fourth face and to face the first magnet in the folded state;
  a first magnetic shield fixed to the hinge and at least partially disposed in the first housing, the first magnetic shield configured to be movable relative to the first magnet wherein, when viewed from above the second face, the first magnetic shield does not overlap the first magnet in the folded state and overlaps the first magnet in the unfolded state; and
  a second magnetic shield fixed to the hinge and at least partially disposed in the second housing, the second magnetic shield configured to be movable relative to the second magnet wherein, when viewed from above the fourth face, the second magnetic shield member does not overlap the second magnet in the folded state and overlaps the second magnet in the unfolded state.

2. The electronic device of claim 1, wherein the first magnetic shield and the second magnetic shield are connected to each other.

3. The electronic device of claim 1, wherein the first magnetic shield includes a first plate extending from one end portion of the first magnetic shield connected to the hinge to another end portion of the first magnetic shield disposed in the first housing, and
the second magnetic shield includes a second plate extending from one end portion of the second magnetic shield connected to the hinge to another end portion of the second magnetic shield disposed in the second housing.

4. The electronic device of claim 3, wherein the first housing includes a first support disposed between the third portion of the digitizer and the second face,
the second housing includes a second support disposed between the fourth portion of the digitizer and the fourth face,
a portion of the first plate is disposed between the first support and the third portion of the digitizer, and
a portion of the second plate is disposed between the second support and the fourth portion of the digitizer.

5. The electronic device of claim 4, wherein the first magnet is disposed between the first support and the second face, and
the second magnet is disposed between the second support and the fourth face.

6. The electronic device of claim 4, further comprising:
a first through hole provided in an end of the first plate disposed in the first housing;
a first slit provided in the first support member;
a first lever disposed between the second face and the first support, the first lever including a first joint rotatably coupled to the first support and a second joint rotatably connected to a pin penetrating the first through hole and the first slit;
a second through hole provided in an end of the second plate disposed in the second housing;
a second slit provided in the second support; and
a second lever disposed between the fourth face and the second support, the second lever including a third joint rotatably coupled to the second support and a fourth joint rotatably connected to a pin passing through the second through hole and the second slit.

7. The electronic device of claim 3, wherein the first plate and the second plate comprising a single plate including a same material.

8. The electronic device of claim 1, further comprising:
a sheet comprising an unmagnetized material attached to the first magnetic shield to face and overlap the first magnet in the unfolded state when viewed from above the second face, or attached to the second magnetic shield to face and overlap the second magnet in the unfolded state when viewed from above the fourth face.

9. The electronic device of claim 1, further comprising:
a third magnet attached to the first magnetic shield to face and overlap the first magnet in the unfolded state when viewed from above the second face; and
a fourth magnet attached to the second magnetic shield to face and overlap the second magnet in the unfolded state when viewed from above the fourth face.

10. The electronic device of claim 1, further comprising:
a first ferromagnetic substance covering at least a portion of a face of the first magnet other than a face that faces the first direction; and
a second ferromagnetic substance covering at least a portion of a face of the second magnet other than a face that faces the third direction.

11. The electronic device of claim 1, wherein an N pole and an S pole of the first magnet are arranged in a direction orthogonal to the first direction, and
an N pole and an S pole of the second magnet are arranged in a direction orthogonal to the third direction.

12. An electronic device comprising:
a foldable housing including:
a hinge;
a first housing connected to the hinge and including a first face facing a first direction and a second face facing a second direction opposite the first direction; and
a second housing connected to the hinge and including a third face facing a third direction and a fourth face facing a fourth direction opposite the third direction, the second housing configured to be folded relative to the first housing about the hinge, wherein, in a folded state of the foldable housing, the first face faces the third face, and in an unfolded state of the foldable housing, the third direction is a same as the first direction;
a display including a first portion and a second portion extending from the first face to the third face to form the first face and the third face, respectively;
a digitizer including a third portion disposed between the first portion of the display and the second face and a fourth portion disposed between the second portion of the display and the fourth face;
a magnet disposed in the second housing to overlap the fourth portion of the digitizer when viewed from above the fourth face;
a magnetic shield fixed to the hinge and at least partially disposed in the second housing, the magnetic shield configured to be movable relative to the magnet wherein, when viewed from above the fourth face, the magnetic shield does not overlap the magnet in the folded state and overlaps the magnet in the unfolded state.

13. The electronic device of claim 12, further comprising:
a magnetic member comprising a magnetic material at least partially disposed in the first housing and disposed to overlap the magnet in the folded state when viewed from above the second face.

14. The electronic device of claim 13, wherein the magnetic member includes a portion of the magnetic shield extending to the first housing.

15. The electronic device of claim 12, wherein the magnetic shield includes a plate extending from one end portion of the magnetic shield connected to the hinge to another end portion of the magnetic shield disposed in the second housing.

16. The electronic device of claim 15, wherein the second housing includes a support disposed between the fourth portion of the digitizer and the fourth face,
a portion of the plate is disposed between the support and the fourth portion of the digitizer, and
the magnet is disposed between the support and the fourth face.

17. The electronic device of claim 15, further comprising:
a through hole provided in an end of the plate disposed in the second housing;
a slit provided in the support; and
a lever disposed between the fourth face and the support and including a first joint rotatably coupled to the support and a second joint rotatably connected to a pin passing through the through hole and the slit.

18. The electronic device of claim 12, further comprising:
a ferromagnetic substance covering at least a portion of a face of the magnet, other than a face that faces the third direction.

19. The electronic device of claim 12, wherein the magnet includes a magnet disposed in an electronic pen configured to be housed in the second housing structure.

20. An electronic device comprising:
a foldable housing including:
a hinge;
a first housing connected to the hinge and including a first face facing a first direction and a second face facing a second direction opposite the first direction; and
a second housing connected to the hinge and including a third face facing a third direction and a fourth face facing a fourth direction opposite the third direction, the second housing configured to be folded relative to the first housing about the hinge, wherein, in a folded state of the foldable housing, the first face faces the third face, and in an unfolded state of the foldable housing, the third direction is a same as the first direction;
a display including a first portion and a second portion extending from the first face to the third face to form the first face and the third face, respectively;
a digitizer including a third portion disposed between the first portion of the display and the second face and a fourth portion disposed between the second portion of the display and the fourth face;
a magnet disposed in the first housing to overlap the third portion of the digitizer when viewed from above the second face;
an electronic pen insertable into a space provided in the first housing;
a magnetic shield disposed in the first housing, the magnetic shield configured to be elastically movable or rotatable wherein, when viewed from above the second face, the magnetic shield is located at a first position at which the magnetic shield does not overlap the magnet or at a second position at which the magnetic shield overlaps the magnet; and
a shaft including one end portion connected to the magnetic shield and another end portion extending from the one end portion to the space,
wherein, based on the electronic pen being inserted into the space, the shaft moves or rotates the magnetic shield to the first position by being pressed by the electronic pen.

* * * * *